United States Patent
Naganuma et al.

(10) Patent No.: US 8,658,904 B2
(45) Date of Patent: Feb. 25, 2014

(54) FLEX-RIGID WIRING BOARD AND METHOD FOR MANUFACTURING THE SAME

(75) Inventors: Nobuyuki Naganuma, Ogaki (JP); Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 330 days.

(21) Appl. No.: 12/914,064

(22) Filed: Oct. 28, 2010

(65) Prior Publication Data

US 2011/0180306 A1    Jul. 28, 2011

Related U.S. Application Data

(60) Provisional application No. 61/297,404, filed on Jan. 22, 2010.

(51) Int. Cl.
H05K 1/03     (2006.01)

(52) U.S. Cl.
USPC ............................ 174/255; 174/262; 174/264

(58) Field of Classification Search
None
See application file for complete search history.

(56) References Cited

U.S. PATENT DOCUMENTS

| | | | | |
|---|---|---|---|---|
| 5,616,888 A * | 4/1997 | McLaughlin et al. | ........ | 174/260 |
| 7,815,441 B2 * | 10/2010 | Kobayashi et al. | ............. | 439/67 |
| 8,071,883 B2 * | 12/2011 | Takahashi et al. | ............ | 174/254 |

| | | | |
|---|---|---|---|
| 2002/0016018 A1 | 2/2002 | Oka et al. | |
| 2008/0289859 A1 | 11/2008 | Mikado et al. | |
| 2009/0229876 A1 | 9/2009 | Takahashi | |

FOREIGN PATENT DOCUMENTS

| | | |
|---|---|---|
| CN | 1806474 A | 7/2006 |
| CN | 101002511 A | 7/2007 |
| JP | 07-147464 | 6/1995 |
| JP | 07-263828 | 10/1995 |
| JP | 10-200258 | 7/1998 |
| JP | 2005-159043 A | 6/2005 |
| JP | 4021472 B1 | 10/2007 |
| KR | 10-2007-0017577 | 2/2007 |
| WO | WO 2009/113202 A1 | 9/2009 |

OTHER PUBLICATIONS

U.S. Appl. No. 12/914,378, filed Oct. 28, 2010, Naganuma, et al.
U.S. Appl. No. 12/895,126, filed Sep. 30, 2010, Naganuma, et al.

* cited by examiner

Primary Examiner — Ishwarbhai B Patel
(74) Attorney, Agent, or Firm — Oblon, Spivak, McClelland, Maier & Neustadt, L.L.P.

(57) ABSTRACT

A flex-rigid wiring board including a flexible wiring board, a first insulation layer positioned to a side of the flexible board and having a first hole through the first layer, a second insulation layer over the first layer and an end portion of the flexible board and with a second hole through the second layer along the axis of the first hole, a third insulation layer over the first layer and the end portion of the flexible board on the opposite side of the second layer and with a third hole through the third layer along the axis of the first hole, a first structure having a filled conductor in the first hole, a second structure having a filled conductor in the second hole along the axis of the first structure, and a third structure having a filled conductor in the third hole along the axis of the first structure.

32 Claims, 51 Drawing Sheets

FLEX-RIGID WIRING BOARD AND METHOD FOR MANUFACTURING THE SAME

CROSS-REFERENCE TO RELATED APPLICATIONS

The present application claims the benefits of priority to U.S. Application No. 61/297,404, filed Jan. 22, 2010. The contents of that application are incorporated herein by reference in their entirety.

BACKGROUND OF THE INVENTION

1. Field of the Invention

The present invention relates to a flex-rigid wiring board having a flexible section and a rigid section connected to each other, and to a method for manufacturing such a flex-rigid wiring board.

2. Discussion of the Background

In Japanese Patent Publication No. 4021472, a flex-rigid wiring board is described with wiring patterns on the upper and lower surfaces of a rigid section connected to each other by a conductor formed in a through hole. In Japanese Laid-Open Patent Publication No. H10-200258, a bendable multilayer printed wiring board is described. Such a multilayer printed wiring board is manufactured by laminating an insulative substrate, prepreg and a copper foil. The prepreg is made by impregnating aramid non-woven fabric with liquid resin. The core section of a wiring board described in Japanese Laid-Open Patent Publication No. H7-147464 is formed by sandwiching an adhesive agent between two circuit substrates. The adhesive agent has a penetrating hole which is filled with conductive paste. The core section of a wiring board described in Japanese Laid-Open Patent Publication No. H7-263828 is formed by laminating two or more sheets of substrates having penetrating holes filled with conductive paste. The contents of Japanese Patent Publication No. 4021472, Japanese Laid-Open Patent Publication Nos. H10-200258, H7-147464 and H7-263828 are incorporated herein by reference in their entirety in the present application.

SUMMARY OF THE INVENTION

According to one aspect of the present invention, a flex-rigid wiring board includes a flexible wiring board, a first insulation layer positioned to a side of the flexible wiring board and having a first hole which penetrates through the first insulation layer, a second insulation layer laminated over the first insulation layer and an end portion of the flexible wiring board and having a second hole which penetrates through the second insulation layer, the second hole of the second insulation layer being formed along the axis of the first hole of the first insulation layer, a third insulation layer laminated over the first insulation layer and the end portion of the flexible wiring board on the opposite side of the second insulation layer and having a third hole which penetrates through the third insulation layer, the third hole of the third insulation layer being formed along the axis of the first hole of the first insulation layer, a first conductor structure having a filled conductor formed by filling a conductive paste in the first hole of the first insulation layer, a second conductor structure having a filled conductor formed by filling a conductor in the second hole of the second insulation layer, the second conductor structure being formed along the axis of the first conductor structure and electrically connected to the first conductor structure, and a third conductor structure having a filled conductor formed by filling a conductor in the third hole of the third insulation layer, the third conductor structure being formed along the axis of the first conductor structure and electrically connected to the first conductor structure.

According to another aspect of the present invention, a method for manufacturing a flex-rigid wiring board includes preparing a flexible wiring board, preparing a first insulation layer having a first hole and a first conductor structure having a filled conductor formed by filling a conductive paste in the first hole, preparing a second insulation layer having a second hole and a second conductor structure having a filled conductor formed by filling a plating in the second hole, preparing a third insulation layer having a third hole and a third conductor structure having a filled conductor formed by filling a plating in the third hole, forming a laminated body including the flexible wiring board, the first insulation layer, the second insulation layer and the third insulation layer such that the flexible wiring board and the first insulation layer are positioned side by side and the second insulation layer and the third insulation layer are sandwiching the first insulation layer and an end portion of the flexible wiring board and that the first conductor structure, the second conductor structure and the third conductor structure are positioned along an axis, and pressing and heating the laminated body such that the first conductor structure, the second conductor structure and the third conductor structure are set to be electrically continuous with each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 38A is a view showing a first alternative example of a horizontal cross sectional shape of a filled conductor or the like;

FIG. 38B is a view showing a second alternative example of a horizontal cross-sectional shape of a filled conductor or the like;

FIG. 38C is a view showing a third alternative example of a horizontal cross-sectional shape of a filled conductor or the like;

DETAILED DESCRIPTION OF THE EMBODIMENTS

Figure 1:
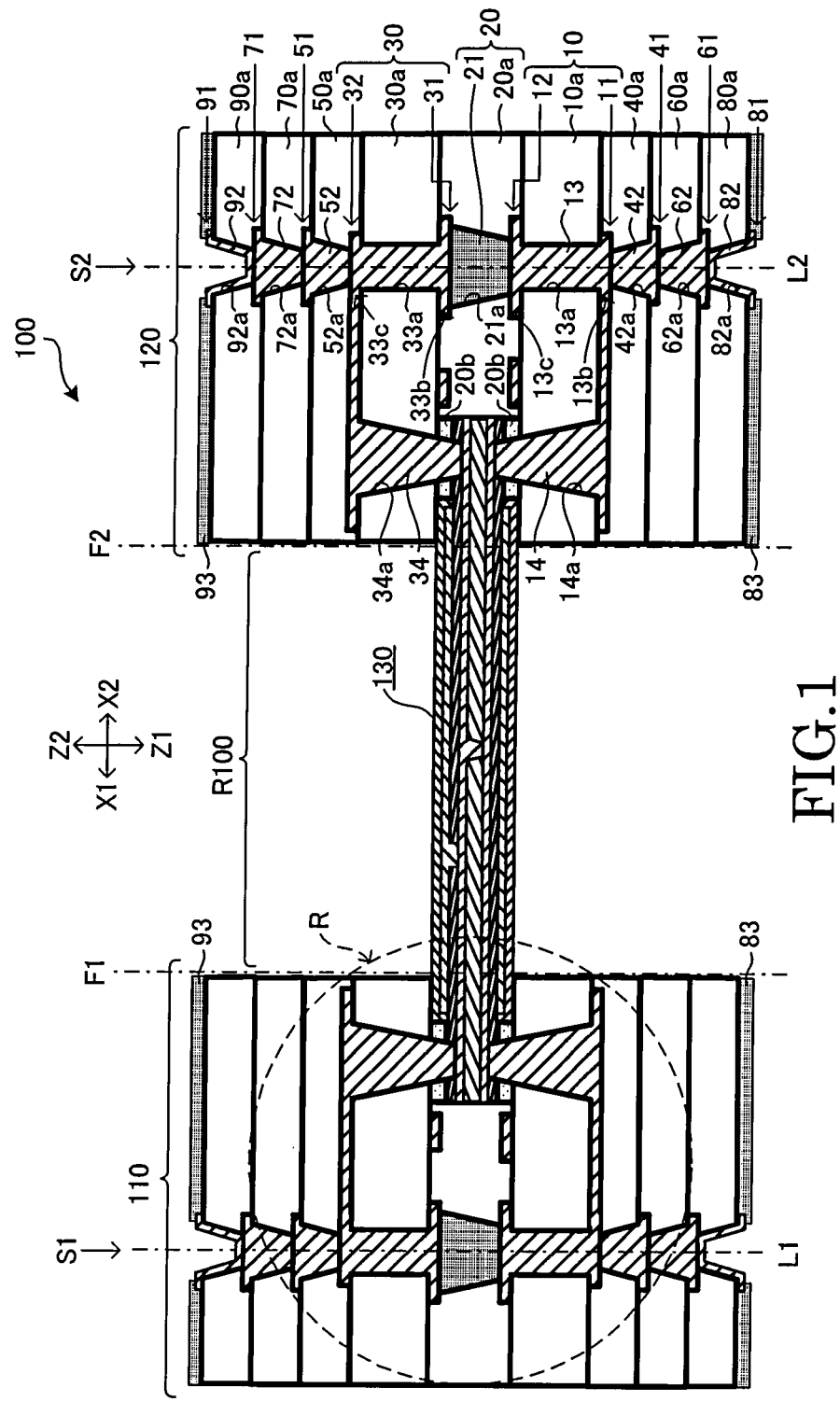
FIG. 1 is a cross-sectional view of a flex-rigid wiring board according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. In addition, side surfaces of a wiring board are on the X-Z plane or the Y-Z plane.

Regarding filled conductors and their holes, a cross section perpendicular to directions Z (X-Y plane) is referred to as a horizontal cross section. Also, a cross section parallel to directions Z (X-Z plane or Y-Z plane) is referred to as a vertical cross section.

In the present embodiment, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or the inner-layer side), and the side farther away from the core is referred to as an upper layer (or the outer-layer side).

Aside from a layer including a conductive pattern that functions as wiring such as circuits (including ground), a layer with only a plain pattern is also referred to as a wiring layer. Among the conductors formed inside holes, the conductive film formed on wall surfaces (side and bottom surfaces) of a hole is referred to as a conformal conductor, and the conductor filled in a hole is referred to as a filled conductor. Wiring layers may include the above conductive patterns along with lands of filled conductors.

Plating indicates depositing conductors (such as metal) to form layers on metal or resin surfaces and such deposited conductive layers (such as metal layers). Other than wet plating such as electrolytic plating and electroless plating, plating also includes dry plating such as PVD (Physical Vapor Deposition) and CVD (Chemical Vapor Deposition).

Unless specifically indicated, the "width" of a hole or a cylinder (protruding portion) indicates the diameter if it is a circle, and $2\sqrt{(\text{cross sectional area}/\pi)}$ if it is other than a circle. If a hole or a cylinder (protruding portion) tapers, whether "widths" in two or more holes or protruding portions are the same or not the same may be determined by comparing the values of corresponding portions, average values, or maximum values and the like. Regarding a line pattern formed on a surface, among the directions perpendicular to the line, the measurement in a direction parallel to the surface on which the line is formed is referred to as "width," and the measurement in a direction perpendicular to the surface on which the line is formed is referred to as "height" or "thickness." In addition, the measurement from one end of the line to the other end is referred to as "length." However, measurements are not limited to the above definitions if they are clearly indicated otherwise.

First Embodiment

Flex-rigid wiring board 100 of the present embodiment is a printed wiring board. As shown in FIG. 1, flex-rigid wiring board 100 has rigid sections (110, 120) and flexible wiring board 130. Rigid section 110 and rigid section 120 are connected to each other by means of flexible wiring board 130. Namely, rigid section 110 and rigid section 120 face each other by sandwiching flexible wiring board 130. Specifically, both ends of flexible wiring board 130 enter rigid sections (110, 120). Then, rigid sections (110, 120) and flexible wiring board 130 are connected to each other in the entered portions. In the drawing, boundary surface (F1) is the surface corresponding to the boundary between rigid section 110 and flexible section (R100); and boundary surface (F2) is the surface corresponding to the boundary between rigid section 120 and flexible section (R100). Also, flexible section (R100) is a flexible portion sandwiched between rigid section 110 and rigid section 120, namely, part of flexible wiring board 130 exposed between boundary surface (F1) and boundary surface (F2).

Rigid sections (110, 120) have first substrate 10, second substrate 20, third substrate 30, insulation layers (40a, 50a, 60a, 70a, 80a, 90a), wiring layers (41, 51, 61, 71, 81, 91), filled conductors (42, 52, 62, 72), conformal conductors (82, 92) and solder-resist layers (83, 93). First substrate 10, second substrate 20 and third substrate 30 correspond to the core section. Among those, second substrate 20 is positioned to a side of flexible wiring board 130 (direction X). A space may or may not exist between flexible wiring board 130 and substrate 20. However, alignment is easier if there is no space. Insulation layers and others positioned as upper layers to the core section correspond to built-up sections.

Figure 2A:
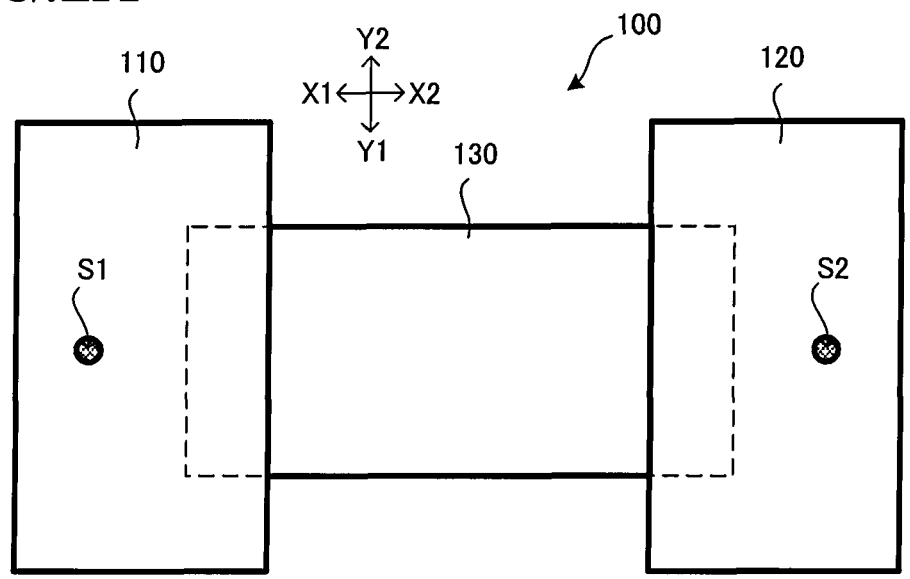
FIG. 2A is a plan view showing a first positioning of filled stacks.
Figure 2B:
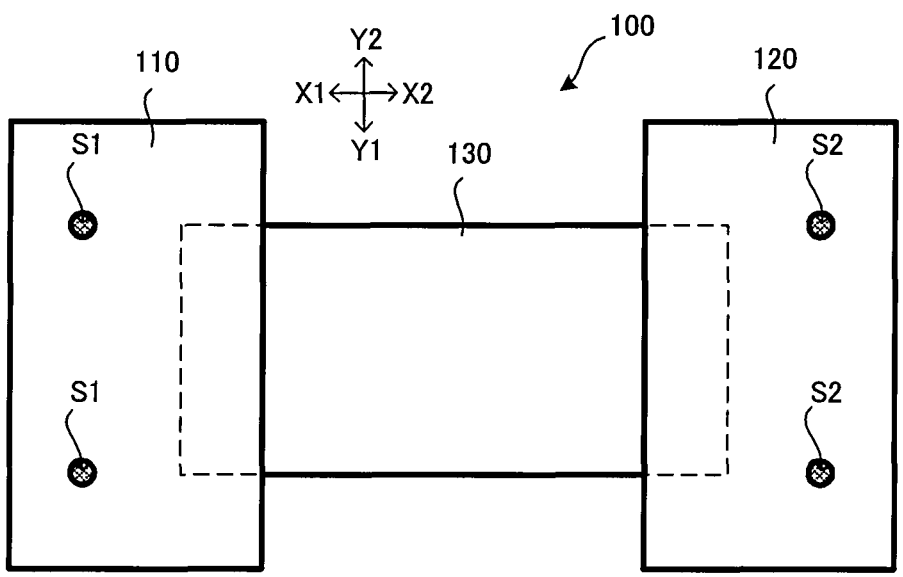
FIG. 2B is a plan view showing a second positioning of filled stacks.

In rigid sections (110, 120), since filled conductors of the core section (first substrate 10, second substrate 20 and third substrate 30), and filled conductors (42, 52, 62, 72) and conformal conductors (82, 92) in the built-up sections, are positioned along the same axis (along axis (L1), axis (L2)), filled stacks (S1, S2) extend in directions Z. Filled stacks (S1, S2) each electrically connect conductive patterns on both surfaces of rigid sections (110, 120) to each other, namely, wiring layer 81 on the first surface and wiring layer 91 on the second surface. The positions and the number of filled stacks (S1, S2) are not limited specifically. Filled stack (S1) or (S2) may be positioned one to each side (directions X) of flexible wiring board 130 as shown in FIG. 2A), for example, or may be positioned one at each of the four corners of flexible wiring board 130 as shown in FIG. (2B), for example. The number of filled stacks may be one (for details, see later-described FIGS. 32A-33C).

First substrate 10 has insulation layer (10a) (second insulation layer), wiring layers (11, 12), filled conductor 13 (second conductor) and filled conductor 14. In insulation layer (10a), hole (13a) (second hole) which penetrates through insulation layer (10a) is formed. Filled conductor 13 is formed by filling plating in hole (13a). Land (13b) is connected to the first-surface side of filled conductor 13, and land (13c) is connected to the second-surface side of filled conductor 13. Land (13b) is included in wiring layer 11, and land (13c) is included in wiring layer 12. Filled conductor 14 is described later (see FIG. 4).

Insulation layer (10a) is made of epoxy resin, for example. Epoxy resin is preferred to contain a reinforcing material such as glass fiber (glass fabric or glass non-woven fabric, for example) or aramid fiber (aramid non-woven fabric, for example) impregnated with resin, for example. The reinforcing material has a smaller thermal expansion coefficient than the primary material (epoxy resin in the present embodiment).

Wiring layers (11, 12) are made of copper foil or copper plating, for example. Also, filled conductor 13 is made of copper plating, for example. The size, shape or the like of filled conductor 13 is described later.

Third substrate 30 has insulation layer (30a) (third insulation layer), wiring layers (31, 32), filled conductor 33 (third conductor) and filled conductor 34. In insulation layer (30a), hole (33a) (third hole) which penetrates through insulation layer (30a) is formed. Filled conductor 33 is formed by filling plating in hole (33a). Land (33b) is connected to the first-surface side of filled conductor 33, and land (33c) is connected to the second-surface side of filled conductor 33. Land (33b) is included in wiring layer 31 and land (33c) is included in wiring layer 32. Filled conductor 34 is described later (see FIG. 4).

Insulation layer (30a) is made of epoxy resin, for example. Epoxy resin is preferred to contain a reinforcing material such as glass fiber (glass fabric or glass non-woven fabric, for example) or aramid fiber (aramid non-woven fabric, for example) impregnated with resin, for example. The reinforcing material has a smaller thermal expansion coefficient than the primary material (epoxy resin in the present embodiment).

Wiring layers (31, 32) are made of copper foil and copper plating, for example. Also, filled conductor 33 is made of copper plating, for example. The size, shape or the like of filled conductor 33 is described later.

In the present embodiment, filled conductors (13, 33) are both made of plating. However, filled conductors (13, 33) are not limited to such, and only one or the other may be formed by plating.

Second substrate 20 has insulation layer (20a) (first insulation layer) and filled conductor 21 (first hole). In insulation layer (20a), hole (21a) (first hole) which penetrates through insulation layer (20a) is formed. Land (13c) is connected to the first-surface side of filled conductor 21, and land (33b) is connected to the second-surface side of filled conductor 21.

Filled conductor 21 is formed by filling conductive paste in hole (21a). Conductive paste indicates a paste made by mixing conductive fine particles in a viscous binder at a predetermined concentration. A binder indicates resin or the like that can bind particles. Conductive paste is distinguished from plating.

Insulation layer (20a) is made of epoxy resin, for example. Epoxy resin is preferred to contain a reinforcing material such as glass fiber (glass fabric or glass non-woven fabric, for example) or aramid fiber (aramid non-woven fabric, for example) impregnated with resin, for example. The reinforcing material has a smaller thermal expansion coefficient than the primary material (epoxy resin in the present embodiment).

The conductive paste forming filled conductor 21 is copper paste, for example. The size, shape or the like of filled conductor 21 is described later.

Figure 3:
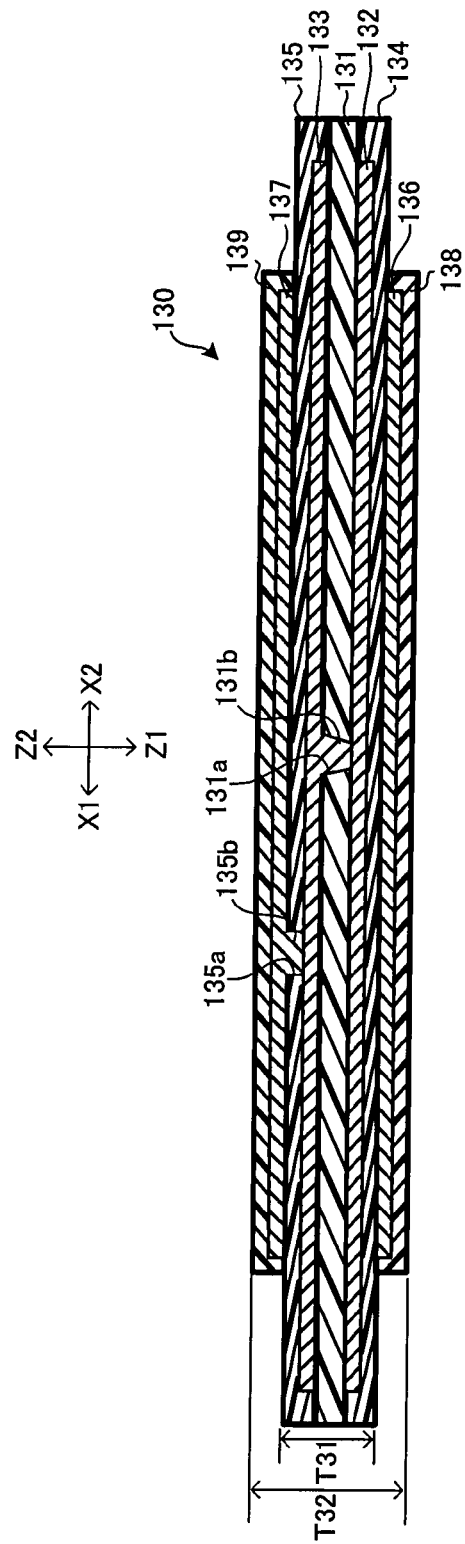
FIG. 3 is a cross-sectional view of a flexible wiring board.

As shown in FIG. 3, for example, flexible wiring board 130 has flexible substrate 131 (core substrate), wiring layers (132, 133), inner coverlays (134, 135), shield layers (136, 137) and outer coverlays (138, 139). Thickness (T31) at the ends of flexible wiring board 130 is 100 μm, for example. Thickness (T32) at the central section of flexible wiring board 130 is approximately 150 μm, for example.

Flexible substrate 131 is made of insulative polyimide or liquid-crystal polymer, for example. The thickness of flexible substrate 131 is 20-50 μm, for example, preferably approximately 25 μm.

Wiring layer 132 is formed on the first surface of flexible substrate 131, and wiring layer 133 is formed on the second surface of flexible substrate 131. Wiring layers (132, 133) include striped wiring that connects wiring in rigid section 110 and wiring in rigid section 120 to each other, for example. Wiring layers (132, 133) are made of copper, for example.

Inner coverlays (134, 135) are formed on flexible substrate 131. Inner coverlays (134, 135) coat wiring layers (132, 133) respectively and insulate them from the outside. Inner coverlays (134, 135) are made of polyimide, for example. The thickness of inner coverlays (134, 135) is approximately 5-30 μm, for example.

Shield layer 136 is formed on inner coverlay 134, and shield layer 137 is formed on inner coverlay 135. Shield layers (136, 137) shield electromagnetic noise from the outside to wiring layers (132, 133), as well as shield electromagnetic noise from wiring layers (132, 133) to the outside. Shield layers (136, 137) are made of conductive paste, for example. The thickness of shield layers (136, 137) is approximately 10-30 μm, for example. Also, it is acceptable to form shield layer 136 or 137 only on one surface.

The conductive paste forming shield layers (136, 137) contains fine silver particles, for example. Conductive paste is preferred to contain at least one kind from among silver, gold, copper and carbon. Especially, since silver has high electrical conductivity, it is effective to reduce noise. However, the material for shield layers (136, 137) is not limited to the above, and any other type may also be used.

Flexible substrate 131 has filled conductor (131b). In particular, hole (131a) is formed in flexible substrate 131. Filled conductor (131b) is formed by filling plating in hole (131a). Wiring layer 132 and wiring layer 133 are electrically connected by means of filled conductor (131b).

In addition, inner coverlay 135 has filled conductor (135b). In particular, hole (135a) is formed in inner coverlay 135. Filled conductor (135b) is formed by filling conductive paste in hole (135a). Shield layer 137 and wiring layer 133 are electrically connected by means of filled conductor (135b).

Outer coverlay 138 is formed over inner coverlay 134, and outer coverlay 139 is formed over inner coverlay 135. Outer coverlay 138 coats shield layer 136 and outer coverlay 139 coats shield layer 137. Outer coverlays (138, 139) insulate and protect entire flexible wiring board 130 from the outside. Outer coverlays (138, 139) are made of polyimide, for example. The thickness of outer coverlays (138, 139) is approximately 5-30 μm, for example.

Insulation layer (10a) is laminated on the first-surface side of an end portion of flexible wiring board 130 and of insulation layer (20a). Specifically, insulation layer (10a) in rigid section 110 is laminated on the first surface of the X1-side end portion of flexible wiring board 130, and insulation layer (10a) in rigid section 120 is laminated on the first surface of the X2-side end portion of flexible wiring board 130. Also, insulation layer (30a) is laminated on the second-surface side of the end portion of flexible wiring board 130 and of insulation layer (20a). Specifically, insulation layer (30a) in rigid section 110 is laminated on the second surface of the X1-side end portion of flexible wiring board 130, and insulation layer (30a) in rigid section 120 is laminated on the second surface of the X2-side end portion of flexible wiring board 130.

Figure 4:
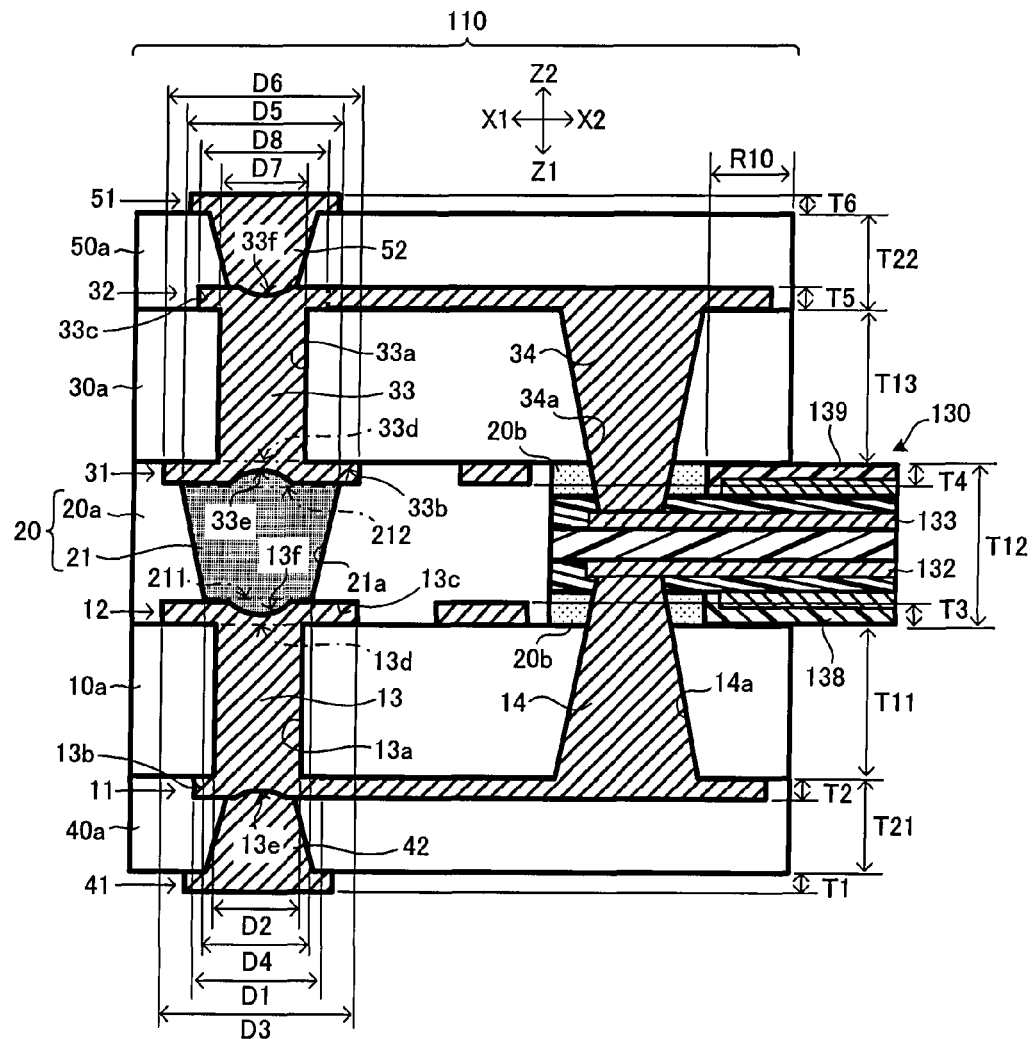
FIG. 4 is a magnified cross-sectional view showing part of a region in FIG. 1.

FIG. 4 is a magnified view of region "R" in FIG. 1 (connection section between rigid section 110 and flexible wiring board 130). The structure of the connection section between rigid section 120 and flexible wiring board 130 is the same as the structure of the connection section between rigid section 110 and flexible wiring board 130. Hereinafter, the connection sections between flexible wiring board 130 and rigid sections (110, 120) are referred to as F-R connection sections.

As shown in FIG. 4, flexible wiring board 130 is positioned to a side of insulation layer (20a) (direction X). The thickness of insulation layer (20a) and the thickness of flexible wiring board 130 are set to be substantially the same. In the space partitioned by flexible wiring board 130 and insulation layers (10a, 20a, 30a) (the clearance among such members), resin (20b) is filled. Resin (20b) is flowed from the surrounding insulation layers (such as insulation layer (20a)) by pressing, for example, and is cured to be integrated with the surrounding insulation layers. Insulation layer (10a) and insulation layer (30a) sandwich the end portion of flexible wiring board 130 and are laminated and connected to outer coverlays (138, 139) in region (R10).

As described previously, filled conductor 14 (first connection conductor) is formed in insulation layer (10a), and filled conductor 34 (second connection conductor) is formed in insulation layer (30a). Filled conductors (14, 34) are formed by filling plating in holes (14a, 34a) respectively. Filled conductor 14 is connected to both wiring layer 132 (first conductive pattern) and wiring layer 11, and filled conductor 34 is connected to both wiring layer 133 (second conductive pattern) and wiring layer 32. Filled conductor 14 is electrically connected to land (13b) of filled conductor 13 by means of a conductive pattern included in wiring layer 11. Also, filled conductor 34 is electrically connected to land (33c) of filled conductor 33 by means of a conductive pattern included in wiring layer 32.

In flex-rigid wiring board 100 of the present embodiment, rigid sections (110, 120) and flexible wiring board 130 are electrically connected without using connectors. Thus, even if the impact of being dropped or the like is received, connection failure due to detached connectors does not occur.

By the end portions of flexible wiring board 130 entered (embedded) into rigid sections (110, 120) respectively, rigid section 110 and rigid section 120 are electrically connected at the entered portions (embedded portions). Accordingly, their connection is strong.

As shown in FIG. 1, insulation layer (40a) is laminated on the first-surface side of insulation layer (10a), and insulation layer (50a) is laminated on the second-surface side of insulation layer (30a). Wiring layer 41 is formed on the first surface of insulation layer (40a), and wiring layer 51 is formed on the second surface of insulation layer (50a). Insulation layer (60a) is laminated on the first-surface side of insulation layer (40a), and insulation layer (70a) is laminated on the second-surface side of insulation layer (50a). Wiring layer 61 is formed on the first surface of insulation layer (60a), and wiring layer 71 is formed on the second surface of insulation layer (70a). Insulation layer (80a) is laminated on the first-surface side of insulation layer (60a), and insulation layer (90a) is laminated on the second-surface side of insulation layer (70a). Wiring layer 81 is formed on the first surface of insulation layer (80*a*), and wiring layer 91 is formed on the second surface of insulation layer (90*a*).

Insulation layers (40*a*, 50*a*, 60*a*, 70*a*, 80*a*, 90*a*) correspond to interlayer insulation layers. In such insulation layers (40*a*-90*a*), holes (42*a*, 52*a*, 62*a*, 72*a*, 82*a*, 92*a*) which penetrate through their respective insulation layers are formed. Insulation layers (40*a*-90*a*) have filled conductors (42, 52, 62, 72) and conformal conductors (82, 92). Filled conductors (42-72) are formed by filling plating in their respective holes. Conformal conductors (82, 92) are formed by forming plating on their respective holes wall surface.

Wiring layers (41-91) are made of copper foil or copper plating, for example. Also, as the material for insulation layers (40*a*-90*a*), the following may be used: those made by impregnating base material such as glass fabric or aramid fabric with resins such as epoxy resin, polyester resin, bismaleimide triazine resin (BT resin), imide resin (polyimide), phenol resin, or allyl polyphenylene ether resin (A-PPE resin).

Filled conductors (42-72) and conformal conductors (82, 92) are made of copper plating, for example. Filled conductors (42-72) and holes (82*a*, 92*a*) in which conformal conductors (82, 92) are formed are formed to be tapered cylinders, for example.

Along axis (L1) and axis (L2), conformal conductor 82, filled conductors (62, 42), filled conductor 13, filled conductor 21, filled conductor 33, filled conductors (52, 72) and conformal conductor 92 are laminated in that order from the first-surface side toward the second-surface side. Adjacent filled conductors are adhered to (touching) each other and become electrically continuous with each other. Filled stack (S1) is formed along axis (L1), and filled stack (S2) is formed along axis (L2). Filled stacks (S1, S2) each have a structure where filled conductors or conformal conductors throughout the layers are arranged on the same axis, a so-called full stack structure. Therefore, securing wiring spaces becomes easy and flexibility in designing wiring patterns increases. In addition, since wiring in directions X or directions Y may be omitted, a reduction in wiring lengths in interlayer connections is achieved. Such a full stack structure is not always required (see later-described FIG. 36).

Flex-rigid wiring board 100 of the present embodiment has second substrate 20 as an intermediate layer of the core section, and filled conductor 21 in second substrate 20 is made of conductive paste. Accordingly, it is thought that the bendability of flexible wiring board 130 increases. Also, it is thought that stresses generated when the board is bent are mitigated from concentrating in the F-R connection sections.

Furthermore, what is filled in filled conductor 21 is not only metal. Thus, it is thought that flex-rigid wiring board 100 becomes more tolerant to impact received from being dropped or to thermal impact.

On the other hand, first substrate 10 and third substrate 30 positioned on both sides (first-surface side, second-surface side) of second substrate 20 respectively have filled conductors (13, 33) made of plating. The resistance in plating is usually lower than the resistance in conductive paste. Accordingly, the resistance in flex-rigid wiring board 100 of the present embodiment is thought to be set lower compared with a wiring board containing conductive paste in all layers. Therefore, improvement in energy efficiency or the like is expected.

In the following, the sizes and shapes of filled conductors (13, 21, 33) are described with reference to FIG. 4 (cross-sectional view) and FIG. 5 (plan view of FIG. 4).

In FIG. 4, thickness (T11) of insulation layer (10*a*) is 100-200 µm, for example, thickness (T12) of insulation layer (20*a*) is 100-200 µm, for example, and thickness (T13) of insulation layer (30*a*) is 100-200 µm, for example. Also, thickness (T21) of insulation layer (40*a*) is 60 µm, for example, and thickness (T22) of insulation layer (50*a*) is 60 µm, for example. In the present embodiment, the thickness of insulation layers (60*a*, 80*a*) (FIG. 1) is set at (T21), the same as that of insulation layer (40*a*), and the thickness of insulation layers (70*a*, 90*a*) (FIG. 1) is set at (T22), the same as that of insulation layer (50*a*).

In flex-rigid wiring board 100 of the present embodiment, thickness (T11) of insulation layer (10*a*), thickness (T12) of insulation layer (20*a*) and thickness (T13) of insulation layer (30*a*) are each set greater than thickness (T21) of insulation layer (40*a*) or thickness (T22) of insulation layer (50*a*). Also, thickness (T2) of wiring layer 11, thickness (T3) of wiring layer 12, thickness (T4) of wiring layer 31 and thickness (T5) of wiring layer 32 are each set greater than thickness (T1) of wiring layer 41 or thickness (T6) of wiring layer 51. In the present embodiment, the thickness of wiring layers (61, 81) (FIG. 1) is (T1), the same as that of wiring layer 41, and the thickness of wiring layers (71, 91) (FIG. 1) is (T6), the same as that of wiring layer 51. If those sizes are employed, it is advantageous for impedance control. In the following, the reasons for such are described.

In a printed wiring board, it is required to match impedance values at a constant level, and their measurement and control are necessary. When measuring actual impedance values, a stripline or a microstrip is formed in an inner layer to measure such values. In a stripline or a microstrip, the greater the thickness of an insulative body (insulation layer), the greater the impedance, and the greater the width and thickness of the transmission line (wiring layer), the smaller the impedance. Thus, if impedance control is conducted by using a thin insulation layer, it is accordingly required that a thin transmission line, which is the object of the measurement, be formed. If a transmission line is made thin, since forming such a thin line is difficult, the risk that impedance is out of the acceptable range increases, and a lowered yield rate becomes a concern. To prevent such a situation, it may be an option to carry out pseudo-impedance control by using two insulation layers where a blank region without a wiring layer is formed in one insulation layer directly on the other insulation layer. However, since the space on a wiring board, including the blank region, to be used for impedance control increases in such a method, designing highly integrated wiring is remarkably hampered. For that matter, in flex-rigid wiring board 100 of the present embodiment, thicknesses (T11-T13) of insulation layers (10*a*, 20*a*, 30*a*) are great. If thicknesses (T11-T13) are great, it is possible to increase accordingly the width and thickness of transmission lines which are the measurement object. As a result, impedance control becomes easier. Moreover, since the thicknesses of wiring layers to be formed on such insulation layers, namely thicknesses (T2-T5), are great, forming wiring layers in the core section becomes easier.

If at least thickness (T11) of insulation layer (10*a*), thickness (T12) of insulation layer (20*a*) or thickness (T13) of insulation layer (30*a*) is set greater than thickness (T21) of insulation layer (40*a*) or thickness (T22) of insulation layer (50*a*), substantially the same effect as above is achieved. However, the effect is smaller in such a situation. Also, if at least thickness (T2) of wiring layer 11, thickness (T3) of wiring layer 12, thickness (T4) of wiring layer 31 or thickness (T5) of wiring layer 32 is set greater than thickness (T1) of wiring layer 41 or thickness (T6) of wiring layer 51, substantially the same effect as above is achieved. However, the effect is smaller in such a situation.

Figure 5:
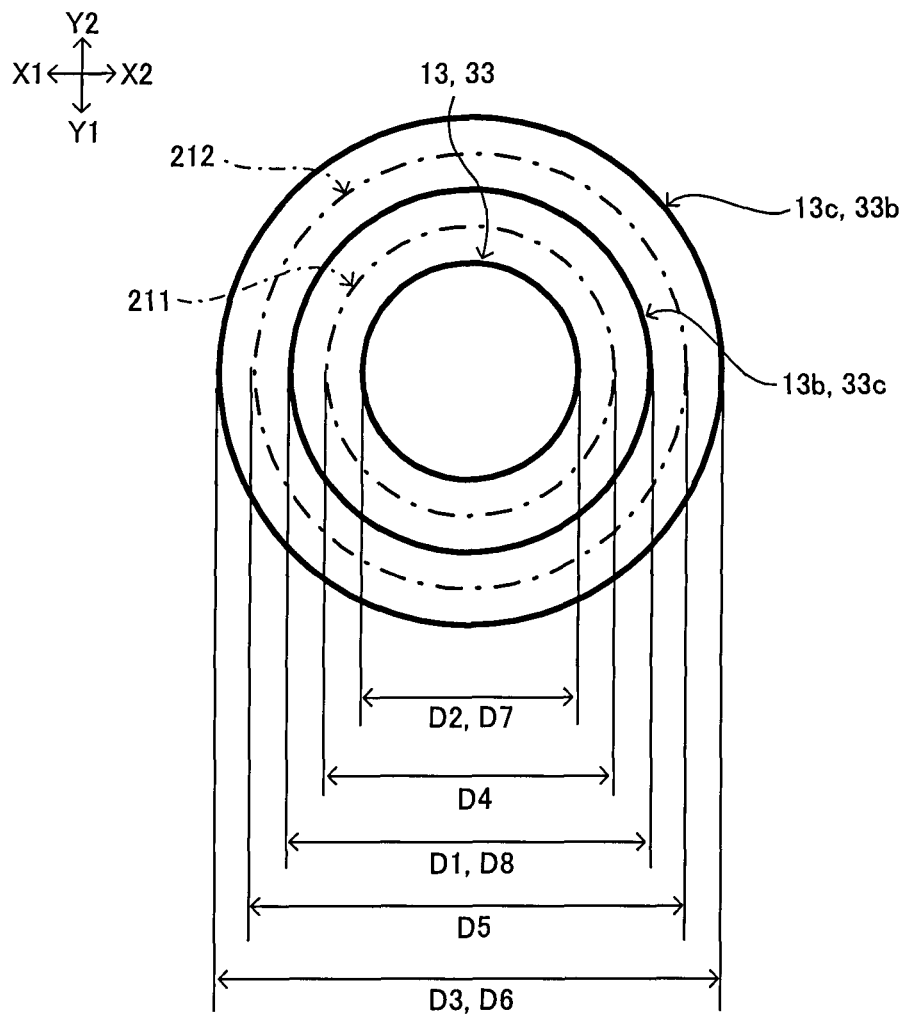
FIG. 5 is a plan view to illustrate sizes and shapes in a filled stack relating to interlayer connections.

As shown in FIGS. 4 and 5, filled conductor 13 (or hole 13a) and filled conductor 33 (or hole 33a) are formed to be cylindrical. Accordingly, widths of filled conductor 13 and filled conductor 33 become uniform widths (D2, D7) respectively. Therefore, the width of opening (13d) on the second-surface side of hole (13a) is also (D2), and the width of opening (33d) on the first-surface side of hole (33a) is also (D7). On the other hand, filled conductor 21 (or hole 21 a) is formed to be a tapered cylinder, widening from the first-surface side toward the second-surface side. Thus, width (D5) of opening 212 on the second-surface side of hole (21a) is set greater than width (D4) of opening 211 on the first-surface side of hole (21a). However, filled conductor 13 and the like are not limited to being formed as above, and their shapes may be determined freely (see later-described FIGS. 38A-41).

Width (D1) of land (13b) is 250 μm, for example, width (D2) of filled conductor 13 is 75 μm, for example, width (D3) of land (13c) is 350 μm, for example, width (D4) of opening 211 on the first-surface side of hole (21a) is 130 μm, for example, width (D5) of opening 212 on the second-surface side of hole (21a) is 200 μm, for example, width (D6) of land (33b) is 350 μm, for example, width (D7) of filled conductor 33 is 75 μm, for example, and width (D8) of land (33c) is 250 μm, for example.

Width (D4) of opening 211 on the first-surface side of hole (21 a) is set greater than width (D2) of opening (13d) on the second-surface side of hole (13a) (D4>D2). Also, width (D5) of opening 212 on the second-surface side of hole (21a) is set greater than width (D7) of opening (33d) on the first-surface side of hole (33a) (D5>D7). As described, by increasing the width of filled conductor 21, where alignment on both surfaces is required, determining positions of filled conductor 13, filled conductor 21 and filled conductor 33 becomes easier. Here, satisfying relationships such as "D4>D21" and "D5>D7" is not always required. For example, if only one of such relationships is satisfied, substantially the same effect as above is achieved. However, if both relationships are satisfied, the effect is multiplied.

Figure 14:
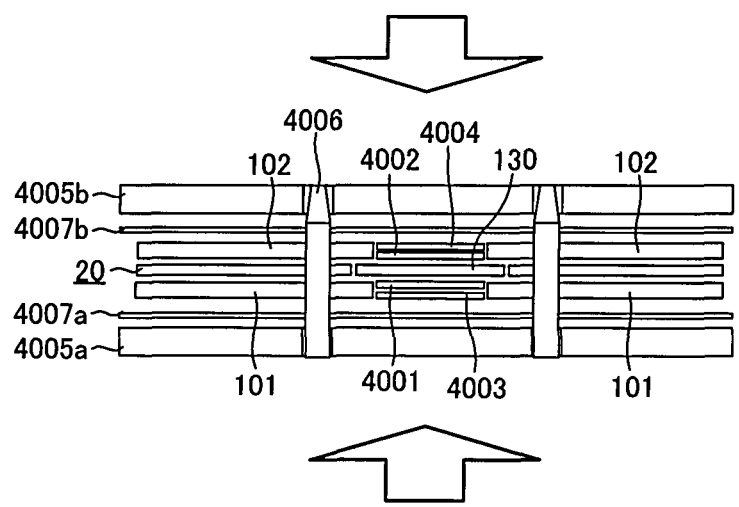
FIG. 14 is a view to illustrate a third step subsequent to the step in FIG. 13.

Width (D3) of land (13c) is set greater than width (D1) of land (13b) (D3>D1), and width (D6) of land (33b) is set greater than width (D8) of land (33c) (D6>D8). Since width (D3) of land (13c) and width (D6) of land (33b) are set greater, securing the connection area with filled conductor 21 becomes easier in a later-described pressing step (FIG. 14). It is thought that determining the positions of filled conductor 13, filled conductor 21 and filled conductor 33 becomes easier. Also, since width (D1) of land (13b) and width (D8) of land (33c) are set smaller, it is thought that securing the wiring space becomes easier, and flexibility in designing wiring patterns increases. Here, satisfying relationships such as "D3>D1" and "D6>D8" is not always required. For example, if either one of such relationships is satisfied, substantially the same effect as above is achieved. However, if both relationships are satisfied, it is thought that the effect is multiplied.

When filled conductors are formed by plating, cavities tend to occur on the surfaces of the filled conductors. Thus, situations in which such cavities are formed are described in the present embodiment. Namely, as shown in FIG. 4, cavity (13c) is formed in the central portion of the first-surface-side end surface of filled conductor 13 (the surface of land (13b)), and cavity (13f) is formed in the central portion of the second-surface-side end surface of filled conductor 13 (the surface of land (13c)). Cavity (33e) is formed in the central portion of the first-surface-side end surface of filled conductor 33 (the surface of land (33b)), and cavity (33f) is formed in the central portion of the second-surface-side end surface of filled conductor 33 (the surface of land (33c)). It is thought that such cavity (13e) or the like tends to cause voids to occur. However, filled conductor 21 in the core section of flex-rigid wiring board 100 is made of conductive paste with high fluidity. Then, the conductive paste in filled conductor 21 flows into cavities (13f, 33e). Therefore, cavities (13f, 33e) are leveled with conductive paste, and filled conductor 21 and filled conductors (13, 33) are filled with conductive material. As a result, it is thought that connection reliability increases.

As shown in FIG. 5, land (13b), filled conductor 13, land (13c), filled conductor 21 (opening 211, opening 212), land (33b), filled conductor 33 and land (33c) are positioned in concentric circles in the present embodiment. Accordingly, an increase in contact areas and a reduction of wiring lengths are achieved. As a result, excellent electrical characteristics are obtained. However, it is not always required for the centers to overlap (see later-described FIGS. 35 and 36).

Figure 6:
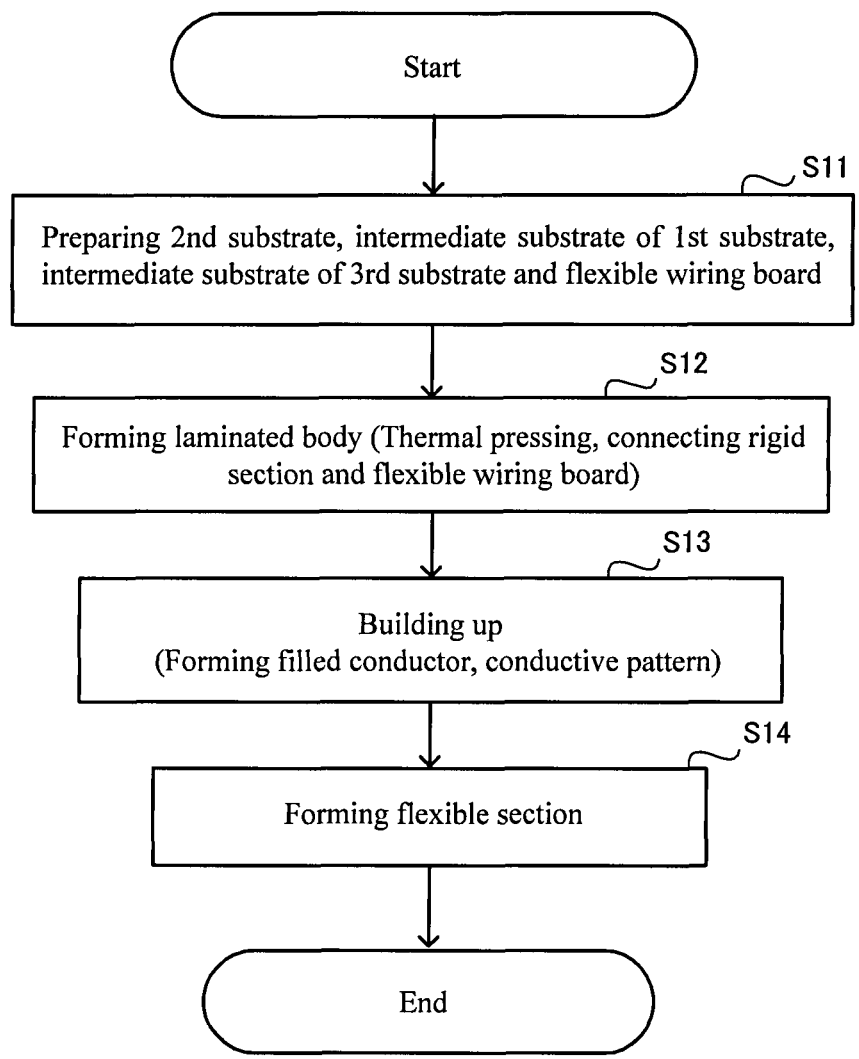
FIG. 6 is a flowchart showing a method for manufacturing a flex-rigid wiring board according to the first embodiment of the present invention.

Above flex-rigid wiring board 100 is manufactured by the procedure shown in FIG. 6, for example.

In step (S11), second substrate 20, intermediate substrate 101 of first substrate 10 (FIG. 10A), intermediate substrate 102 of third substrate 30 (FIG. 10B) and flexible wiring board 130 are prepared.

Figure 7A:
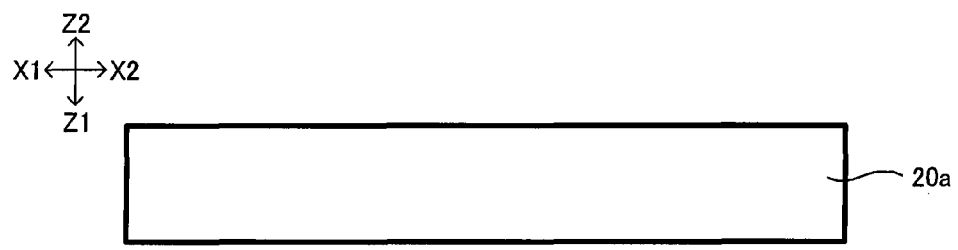
FIG. 7A is a view to illustrate a first step of a method for manufacturing a second substrate.
Figure 7B:
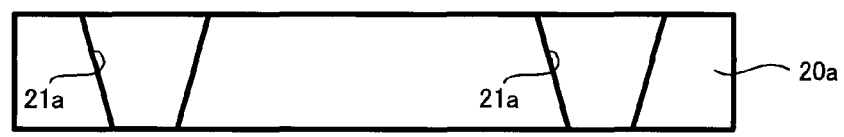
FIG. 7B is a view to illustrate a second step subsequent to the step in FIG. 7A
Figure 7C:
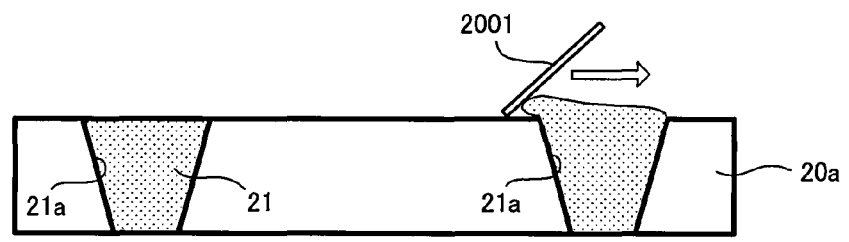
FIG. 7C is a view to illustrate a third step subsequent to the step in FIG. 7B.
Figure 8:
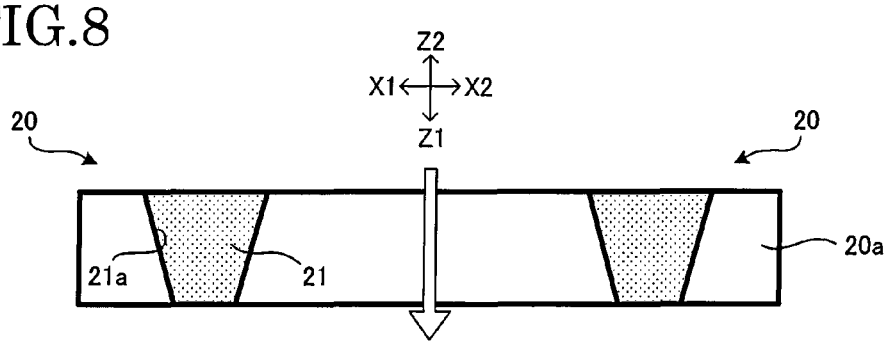
FIG. 8 is a view to illustrate a fourth step subsequent to the step in FIG. 7C.

A method for manufacturing second substrate 20 is shown in FIGS. 7A-8.

First, as shown in FIG. 7A, second insulation layer (20a) (starting material) is prepared. At this stage, insulation layer (20a) is in a prepreg state (semi-cured adhesive sheet). The material for insulation layer (20a) is epoxy resin containing reinforcing material, for example, as described previously.

Next, as shown in FIG. 7B, holes (21a) are formed in insulation layer (20a) by a laser. Holes (21a) penetrate through insulation layer (20a). After that, desmearing and soft etching are conducted if required.

Next, as shown in FIG. 7C, conductive paste is printed on insulation layer (20a) using squeegee 2001. In doing so, conductive paste is filled in holes (21 a) and filled conductors 21 are formed. As a result, as shown in FIG. 8, second substrate 20 is completed. Holes (21 a) may be filled by laminating detachable film on both surfaces (first surface and second surface), by forming an adhesive layer on both surfaces, or by using conductive paste with low viscosity, and then conductive paste with high viscosity is added on their top so that conductive paste protrudes from both surfaces.

A method for manufacturing intermediate substrate 101 of first substrate 10 (FIG. 10A) and intermediate substrate 102 of third substrate 30 (FIG. 10B) is shown in FIGS. 9A-10B.

Figure 9A:
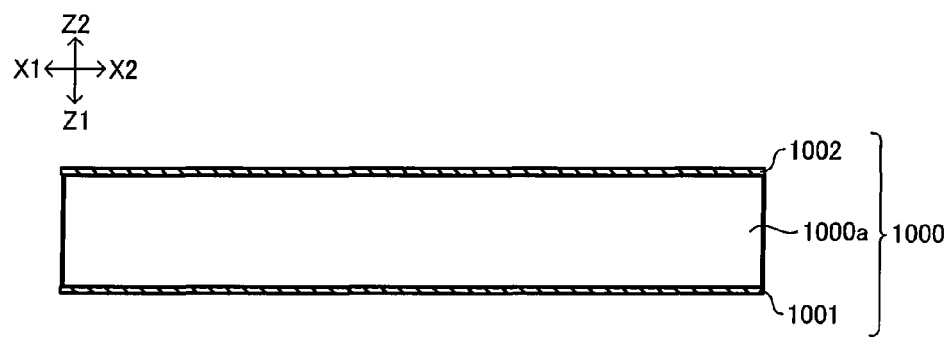
FIG. 9A is a view to illustrate a first step of a method for manufacturing an intermediate substrate for a first substrate and an intermediate substrate for a third substrate.

First, as shown in FIG. 9A, double-sided copper-clad laminate 1000 (starting material) is prepared. Double-sided copper-clad laminate 1000 has insulation layer (1000a) and copper foils (1001, 1002). Copper foil 1001 is formed on the first surface of insulation layer (1000a) and copper foil 1002 is formed on the second surface of insulation layer (1000a). The material for insulation layer (1000a) is epoxy resin containing reinforcing material, for example.

Figure 9B:
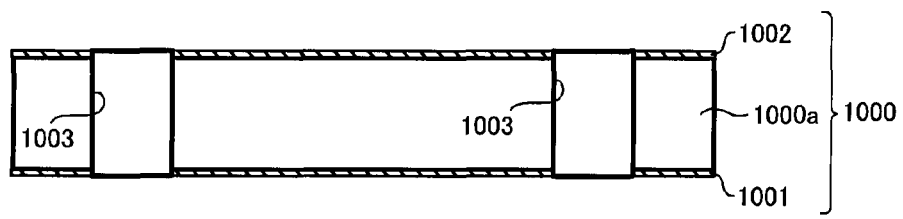
FIG. 9B is a view to illustrate a second step subsequent to the step in FIG. 9A.

Next, as shown in FIG. 9B, holes 1003 are formed in double-sided copper-clad laminate 1000 by a laser. Holes 1003 penetrate through double-sided copper-clad laminate 1000. After that, desmearing and soft etching are conducted if required.

Figure 9C:
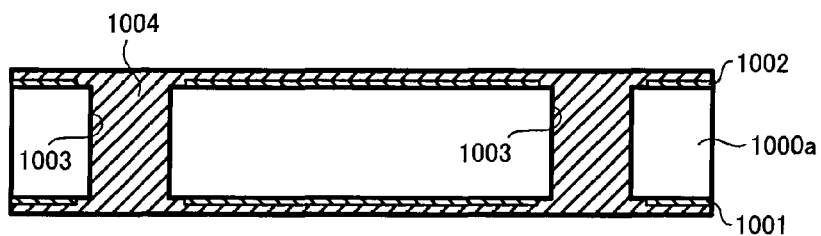
FIG. 9C is a view to illustrate a third step subsequent to the step in FIG. 9B.

Next, as shown in FIG. 9C, plating 1004 is filled in holes 1003 by copper panel plating (plating in through holes and on the entire surface). Plating 1004 is made of electroless plating and electrolytic plating, for example. However, it is not always required to have a two-layer structure. For example, as long as adhesiveness with insulation layer (1000a) is achieved, electroless plating may be omitted. In addition, although omitted from the drawings, when above-described cavities (13e, 13f, 33e, 33f) are formed, they are formed on the surface of plating 1004 (especially in the central portion of holes 1003) at this stage.

When an intermediate substrate is manufactured for each of first substrate 10 and third substrate 30, the process is the same as that described so far. Here, insulation layer (1000a) corresponds to insulation layer (10a) or (30a). Plating 1004 filled in hole 1003 corresponds to filled conductor 13 or 33.

Figure 10A:
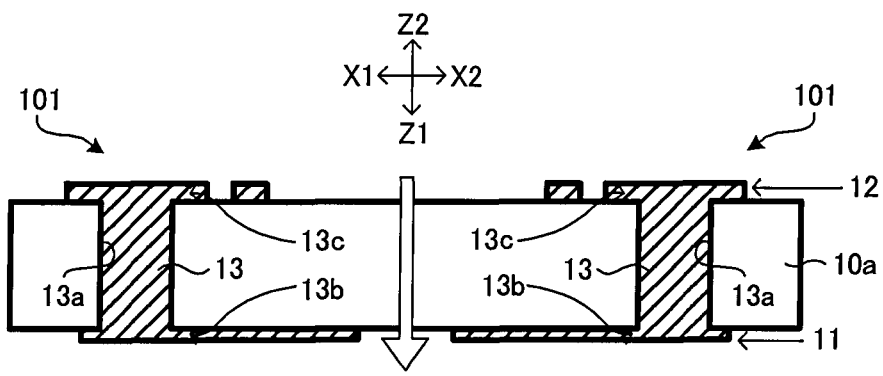
FIG. 10A is a view showing a method for manufacturing an intermediate substrate for a first substrate.
Figure 10B:
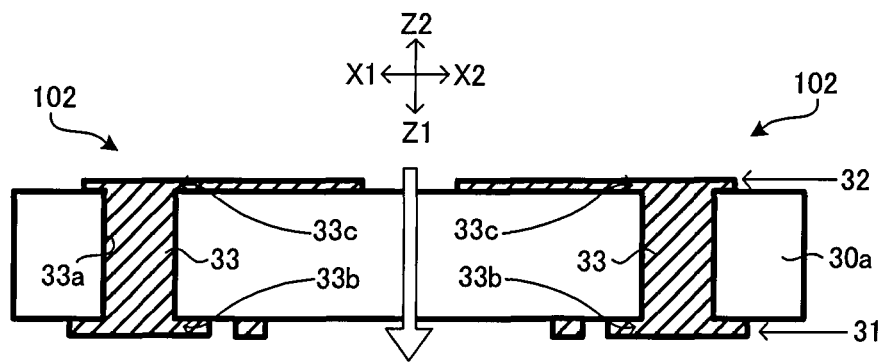
FIG. 10B is a view showing a method for manufacturing an intermediate substrate for a third substrate.

Next, as shown in FIG. 10A or 10B, by a lithographic technique, for example, conductive layers on both surfaces of insulation layer (100a) (insulation layer (10a) or (30a)) are each patterned on intermediate substrate 101 of first substrate 10 and intermediate substrate 102 of third substrate 30. Each pattern is formed to satisfy the above-described sizes or the like (see FIGS. 4 and 5). In doing so, wiring layers (11, 12) are formed on the first surface and the second surface of insulation layer (10a), and wiring layers (31, 32) are formed on the first surface and the second surface of insulation layer (30a). As a result, intermediate substrate 101 of first substrate 10 and intermediate substrate 102 of third substrate 30 are completed.

FIGS. 11A-11E show a method for manufacturing flexible wiring board 130. In the present embodiment, multiple flexible wiring boards 130 are simultaneously manufactured in a single manufacturing panel, and one of them is separated in a step in FIG. 11E. However, the manufacturing method is not limited to such, and one flexible wiring board 130 may be formed using a single manufacturing panel.

Figure 11A:
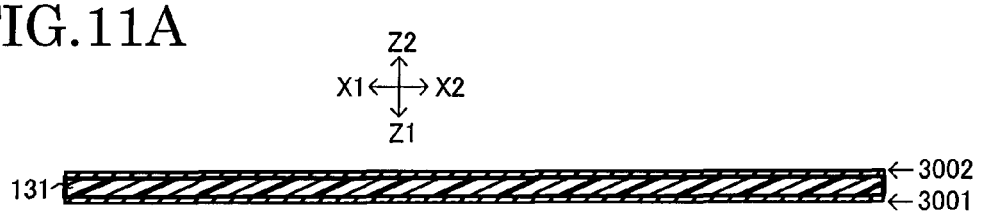
FIG. 11A is a view to illustrate a first step of a method for manufacturing a flexible wiring board.

First, as shown in FIG. 11A, a double-sided copper-clad laminate (starting material) is prepared. Such a double-sided copper-clad laminate has flexible substrate 131 and copper foils (3001, 3002). Copper foil 3001 is formed on the first surface of flexible substrate 131, and copper foil 3002 is formed on the second surface of flexible substrate 131. As described previously, the material for flexible substrate 131 is, for example, insulative polyimide or liquid-crystal polymer. The thickness of copper foils (3001, 3002) is 18 μm, for example.

Figure 11B:
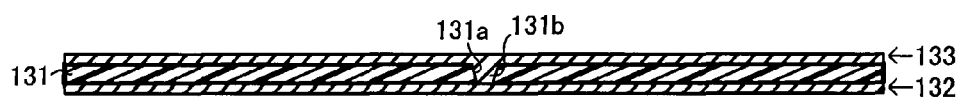
FIG. 11B is a view to illustrate a second step subsequent to the step in FIG. 11A

Next, as shown in FIG. 11B, wiring layers (132, 133) and filled conductor (131b) are formed.

In particular, to begin with, hole (131a) is formed in flexible substrate 131 using a laser, for example. Hole (131a) penetrates through flexible substrate 131 and reaches copper foil 3001. Then, desmearing and soft etching are conducted if required.

Next, plating (such as electroless plating and electrolytic plating) is filled in hole (131a) by copper panel plating (plating in hole (131a) and on the entire surface). Accordingly, filled conductor (131b) is formed.

Next, conductive layers on both surfaces of flexible substrate 131 are patterned using a lithographic technique. Accordingly, wiring layer 132 is formed on the first surface of flexible substrate 131, and wiring layer 133 is formed on the second surface of flexible substrate 131. Furthermore, if required, a horizontal roughening process is carried out.

Figure 11C:
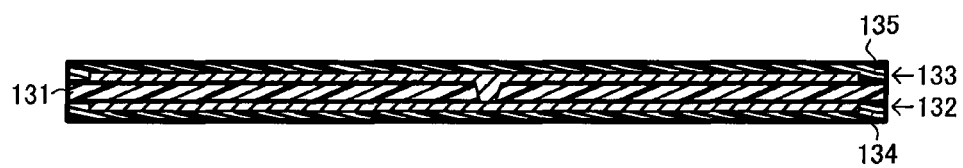
FIG. 11C is a view to illustrate a third step subsequent to the step in FIG. 11B.

Next, as shown in FIG. 11C, by pressing, for example, inner coverlay 134 is attached to the first-surface side of flexible substrate 131, and inner coverlay 135 is attached to the second-surface side of flexible substrate 131. Accordingly, wiring layers (132, 133) are coated with inner coverlays (134, 135) respectively.

Figure 11D:
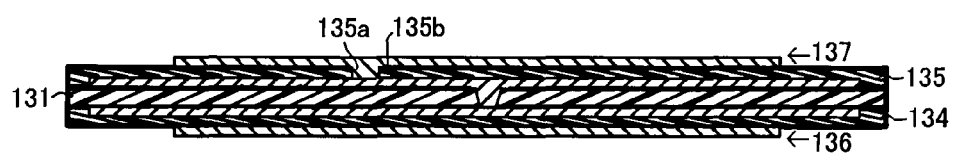
FIG. 11D is a view to illustrate a fourth step subsequent to the step in FIG. 11C

Next, as shown in FIG. 11D, shield layers (136, 137) are formed. In particular, hole (135a) is formed in inner coverlay 135 using a laser, for example. Next, conductive paste (such as silver paste) is printed on the surfaces of inner coverlays (134, 135). Accordingly, shield layer 136 is formed on inner coverlay 134, and shield layer 137 is formed on inner coverlay 135. Also, filled conductor (135b) is formed in inner coverlay 135.

Figure 11E:
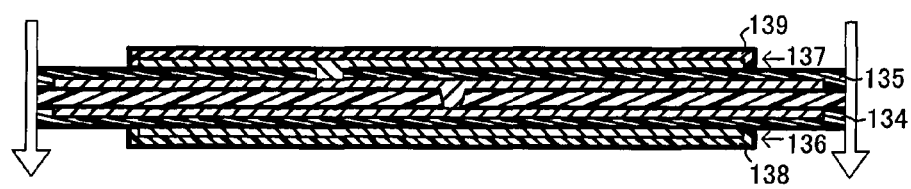
FIG. 11E is a view to illustrate a fifth step subsequent to the step in FIG. 11D.

Next, as shown in FIG. 11E, by pressing, for example, outer coverlay 138 is attached to the first-surface side of inner coverlay 134, and outer coverlay 139 is attached to the second-surface side of inner coverlay 135. Accordingly, shield layers (136, 137) are coated with outer coverlays (138, 139) respectively. As a result, multiple flexible wiring boards 130 are manufactured. After that, if required, jig holes, electrolytic gold plating, a strip mask or the like are formed, and one flexible wiring board is pulled out using a die, for example. Accordingly, flexible wiring board 130 is obtained as previously shown in FIG. 3. Here, a method for detaching flexible wiring board 130 is not limited to using a die, and any other method may be employed. For example, flexible wiring board 130 may be detached by a laser or a drill.

Next, in step (S12) in FIG. 6, laminated body (100a) (see later-described FIG. 18) is formed with first substrate 10, second substrate 20 and third substrate 30.

Figure 12:
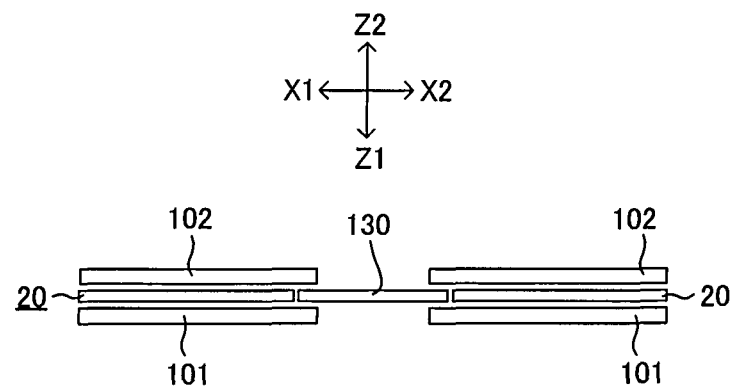
FIG. 12 is a view to illustrate a first step of a method for forming a laminated body (core section)

Specifically, to begin with, second substrate 20 (FIG. 8), flexible wiring board 130 (FIG. 3), intermediate substrate 101 of first substrate 10 (FIG. 10A) and intermediate substrate 102 of third substrate 30 (FIG. 10B) are aligned and positioned as shown in FIG. 12, for example. In doing so, filled conductors (13, 21, 33) are positioned along the same axes (axis (L1) and axis (L2)) (see FIG. 1). Second substrates 20 are positioned to the sides (directions X) of flexible wiring board 130. Both end portions of flexible wiring board 130 are sandwiched by intermediate substrates (101, 102). Thickness (T31) (FIG. 3) of the end portions of flexible wiring board 130 is less than the thickness of insulation layer (20a) (before the pressing).

Figure 13:
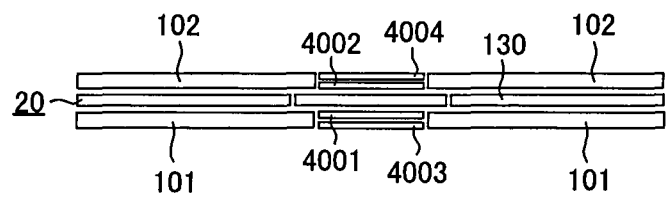
FIG. 13 is a view to illustrate a second step subsequent to the step in FIG. 12.

Next, as shown in FIG. 13, first separator 4001 is positioned on the first-surface side of flexible wiring board 130, and first separator 4002 is positioned on the second-surface side of flexible wiring board 130. Furthermore, second separator 4003 is positioned on the first-surface side of first separator 4001, and second separator 4004 is positioned on the second-surface side of first separator 4002.

In the following, an example of the thermal expansion coefficient of each member at this stage is shown. The thermal expansion coefficient of filled conductor 13 is 17 ppm/° C., for example; the thermal expansion coefficient of filled conductor 21 is 30-40 ppm/° C., for example; the thermal expansion coefficient of filled conductor 33 is 17 ppm/° C., for example. The thermal expansion coefficient of insulation layers (10a) and (30a) is 12-14 ppm/° C., for example; and the thermal expansion coefficient of insulation layer 20 is 11-13 ppm/° C., for example.

Next, the members as aligned above are sandwiched by pressing jigs (4005a, 4005b) as shown in FIG. 14, for example, and thermal pressed all at once. Namely, pressing and heating are conducted simultaneously. During that time, jigs (4005a, 4005b) are aligned using pins 4006. By doing so, pressure is exerted substantially perpendicular to the main surfaces. Here, to prevent such a situation that jigs (4005a, 4005b) and the members become adhered and cannot be detached from each other after pressing, films (4007a, 4007b) are preferred to be inserted between jigs (4005a, 4005b) and the members prior to pressing. Films (4007a, 4007b) are made of PET (polyethylene terephthalate), for example.

Figure 15:
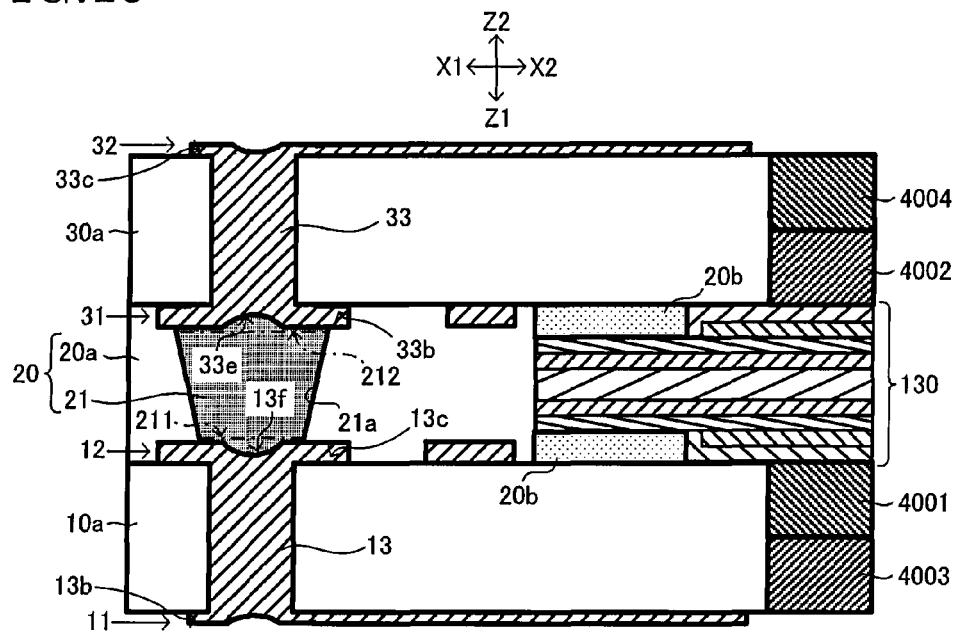
FIG. 15 is a view to illustrate a fourth step subsequent to the step in FIG. 14.

As shown in FIG. 15, resin (20b) is squeezed out from the surrounding insulation layers (insulation layer (10a), insulation layer (20a) and insulation layer (30a)) by the above pressing, and resin (20b) is filled in the space between insulation layer (20a) and flexible wiring board 130. Also, by the above heating, prepreg (insulation layer (20a)) is cured and is adhered to the adjacent members. Adjacent filled conductors are adhered to (touching) each other, and filled conductors (13, 21, 33) become electrically continuous with each other. The conductive paste forming filled conductor 21 enters cavities (13f, 33e). Also, filled conductor 21 is compressed from both sides (Z1 side and Z2 side) by highly rigid lands (33b, 13c). Accordingly, insulation layers (10a, 30a) and flexible wiring board 130 become bonded. The above pressing and heating may be divided into multiple procedures. Also, heating and pressing may be conducted separately, but it is more efficient if they are conducted simultaneously. After thermal pressing, another heating may be conducted separately to integrate the above members.

Figure 16:
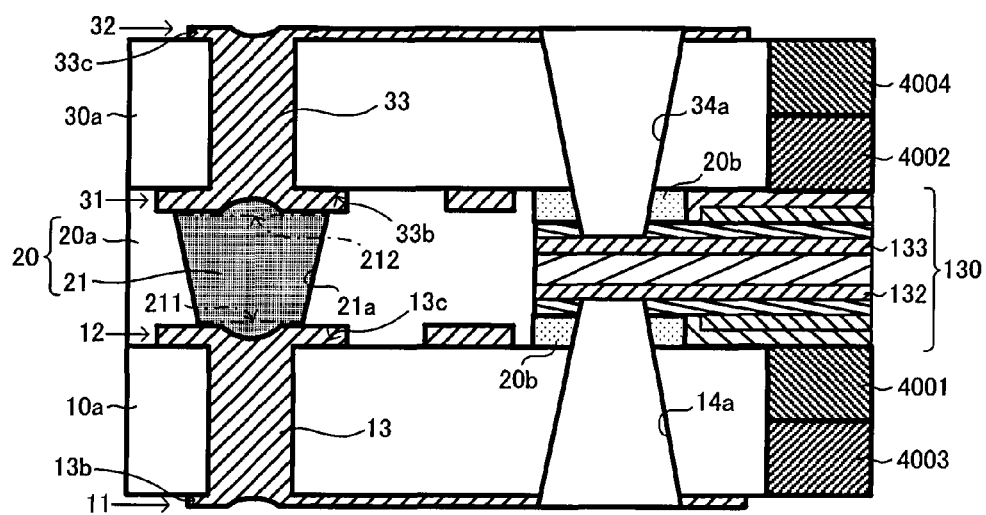
FIG. 16 is a view to illustrate a fifth step subsequent to the step in FIG. 15.

Next, as shown in FIG. 16, hole (14a) is formed in insulation layer (10a) and hole (34a) is formed in insulation layer (30a) by a laser, for example. Hole (14a) reaches wiring layer 132 and hole (34a) reaches wiring layer 133. After that, desmearing and soft etching are conducted if required.

Figure 17:
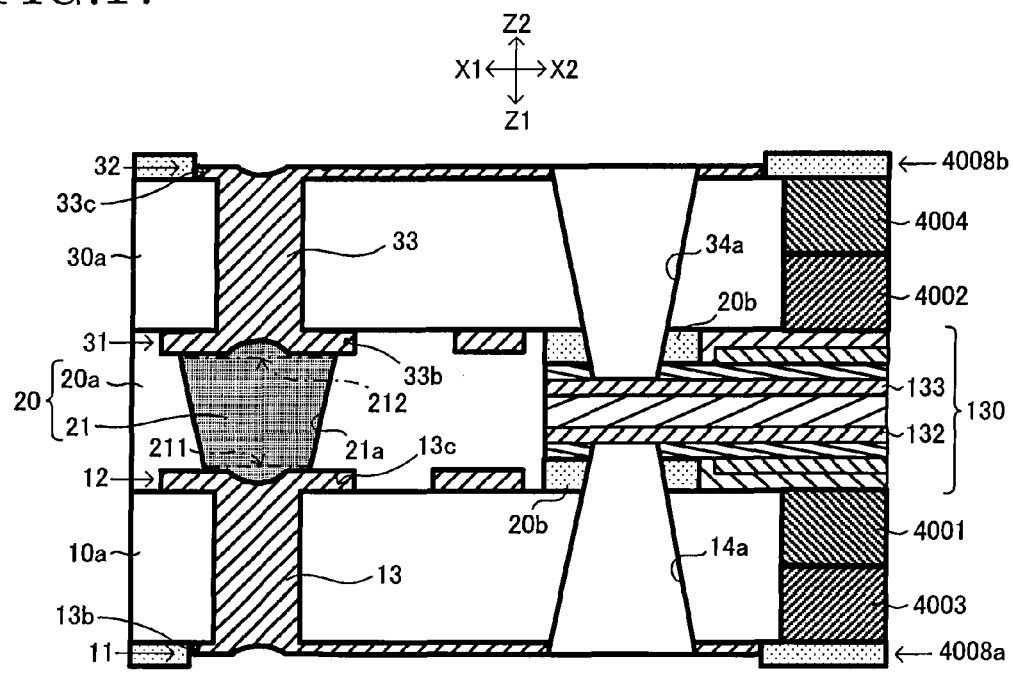
FIG. 17 is a view to illustrate a sixth step subsequent to the step in FIG. 16.

Next, as shown in FIG. 17, by arranging dry films and patterning them, plating resists (4008a, 4008b) are formed on the first surface and second surface. Plating resists (4008a, 4008b) have openings corresponding to conductive patterns of wiring layers (11, 32).

Figure 18:
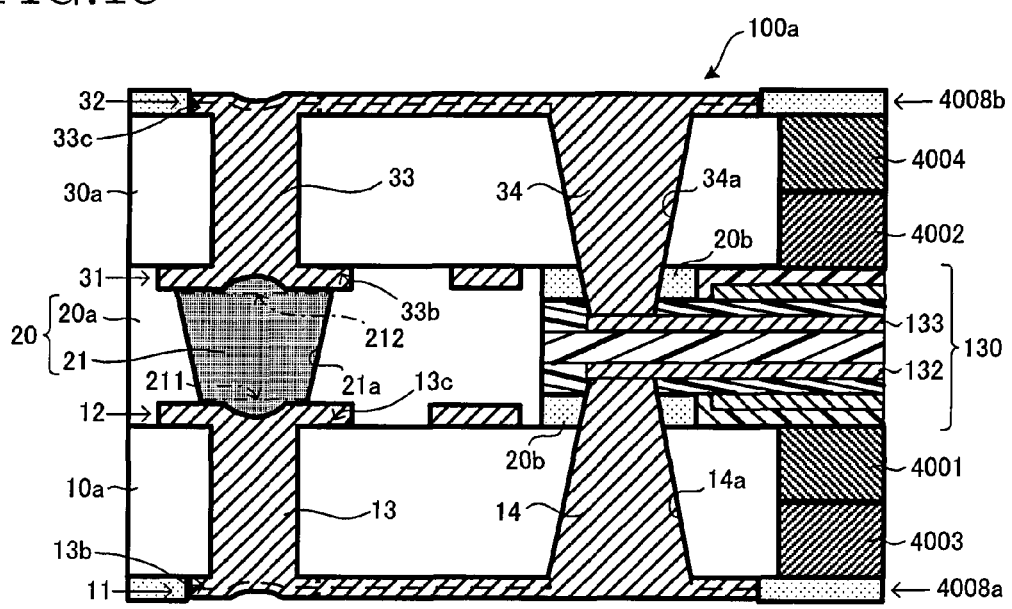
FIG. 18 is a view to illustrate a seventh step subsequent to the step in FIG. 17.

Next, as shown in FIG. 18, by performing copper plating (electrolytic plating or electroless plating, or both) for example, plating is formed on opening portions of plating resists (4008a, 4008b). In doing so, wiring layers (11, 32) are thickened. Also, plating is filled in holes (14a, 34a). As a result, filled conductors (14, 34) are formed. Filled conductor 14 is bonded to wiring layer 132, and filled conductor 34 is bonded to wiring layer 133. Then, plating resists (4008a, 4008b) are removed by using a resist-removing solution.

Accordingly, laminated body (100a) is formed with first substrate 10, second substrate 20 and third substrate 30. Insulation layer (20a) is sandwiched between insulation layer (10a) and insulation layer (30a).

Next, in step (S13) of FIG. 6, a build-up procedure is employed for laminated body (100a).

Figure 19:
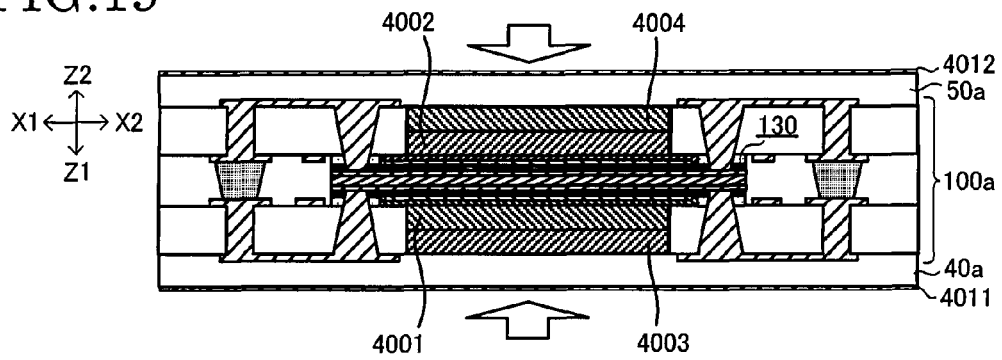
FIG. 19 is a view to illustrate a first step of a method for building up on a laminated body (core section)

In particular, first, as shown in FIG. 19, copper foil 4011, insulation layer (40a), laminated body (100a), insulation layer (50a) and copper foil 4012 are positioned so as to be laminated in that order. Accordingly, laminated body (100a) is sandwiched by insulation layer (40a) and insulation layer (50a). At this stage, insulation layers (40a, 50a) are in a prepreg state (semi-cured adhesive sheet). However, instead of prepreg, RCF (resin-coated copper foil) or the like may also be used.

In the following, an example of the thermal expansion coefficient of each member at this stage is shown. The thermal expansion coefficient of insulation layers (40a) and (50a) is 12-14 ppm/° C., for example. If RCF is used, the thermal expansion coefficient of insulation layers (40a) and (50a) is 60-80 ppm/° C., for example.

Next, thermal pressing is conducted. In doing so, prepreg (insulation layers (40a, 50a)) is cured, and copper foil 4011, insulation layer (40a), laminated body (100a), insulation layer (50a) and copper foil 4012 become integrated.

Figure 20:
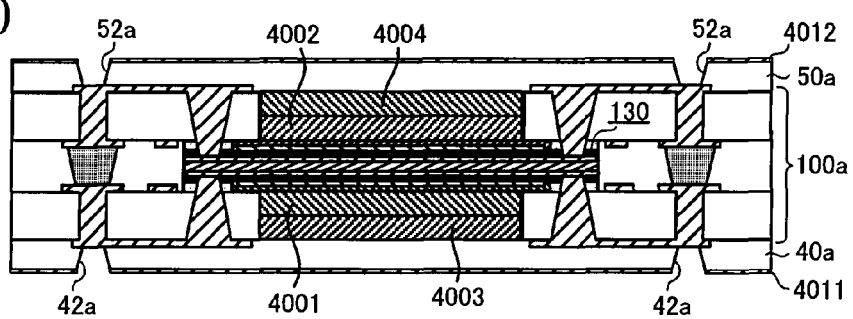
FIG. 20 is a view to illustrate a second step subsequent to the step in FIG. 19.

Next, as shown in FIG. 20, holes (42a) are formed in insulation layer (40a) and holes (52a) are formed in insulation layer (50a) by a laser, for example. Then, desmearing and soft etching are conducted if required.

Figure 21:
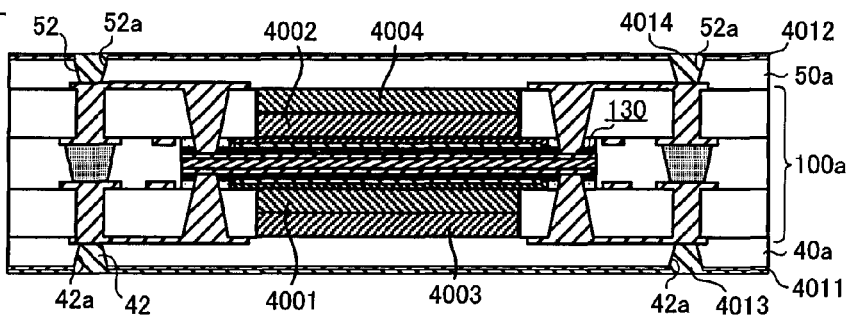
FIG. 21 is a view to illustrate a third step subsequent to the step in FIG. 20.

Next, as shown in FIG. 21, by performing copper panel plating (such as electroless plating or electrolytic plating, or both), for example, plating 4013 is filled in holes (42a), and plating 4014 is filled in holes (52a). Accordingly, filled conductors (42, 52) are formed. Filled conductors (42, 52) are positioned along the same axes (axis (L1) and axis (L2)) as filled conductors (13, 21, 33) (see FIG. 1).

Figure 22:
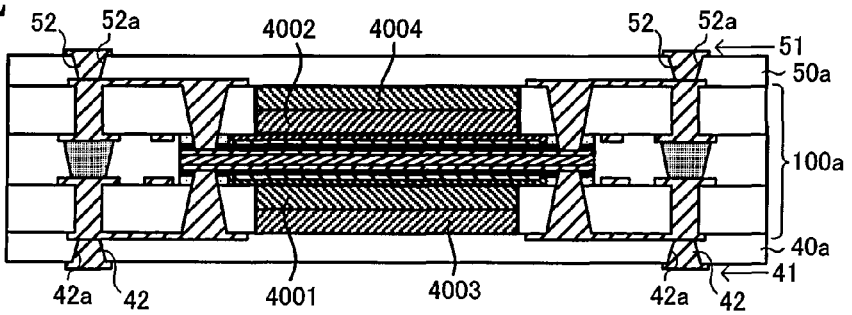
FIG. 22 is a view to illustrate a fourth step subsequent to the step in FIG. 21.

Furthermore, the conductive layers on both surfaces are patterned by lithographic technique, for example. Accordingly, as shown in FIG. 22, wiring layer 41 is formed on insulation layer (40a) and wiring layer 51 is formed on insulation layer (50a).

Figure 23:
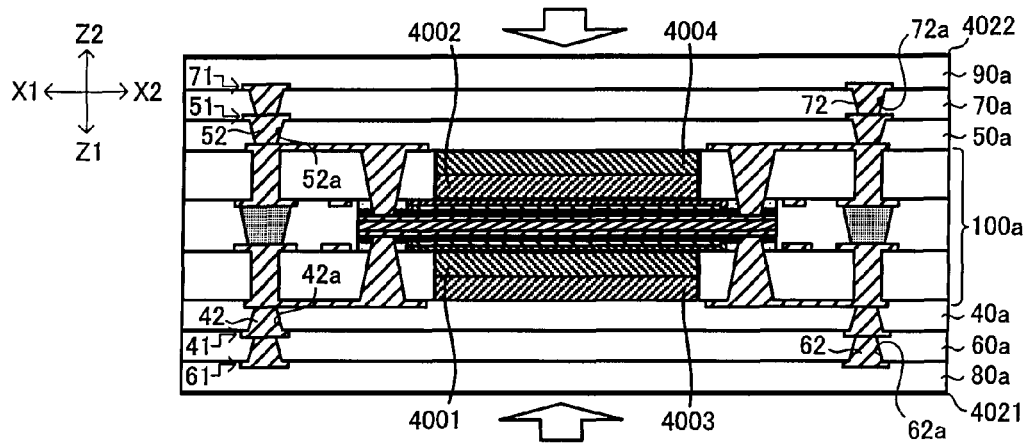
FIG. 23 is a view to illustrate a fifth step subsequent to the step in FIG. 22.

Then, wiring layers (61, 71) and filled conductors (62, 72) are formed through the same procedures. After that, as shown in FIG. 23, insulation layer (80a) and copper foil 4021 are positioned on the first-surface side and insulation layer (90a) and copper foil 4022 are positioned on the second-surface side. Then, thermal pressing is conducted. Accordingly, prepreg (insulation layers (80a, 90a)) is cured and the above members are integrated.

Figure 24:
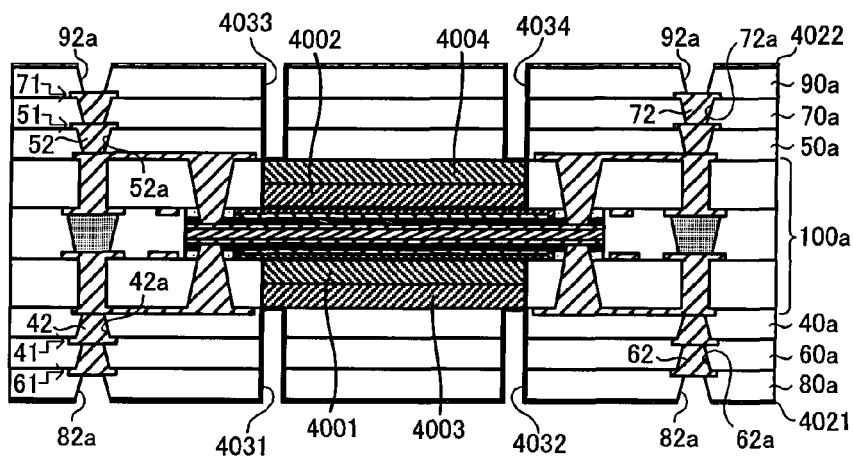
FIG. 24 is a view to illustrate a sixth step subsequent to the step in FIG. 23.

Next, as shown in FIG. 24, holes (82a, 92a) and cut lines (4031-4034) are formed by a laser, for example. Holes (82a) are formed in insulation layer (80a) and holes (92a) are formed in insulation layer (90a). Cut lines 4031 and 4032 are formed through insulation layers (40a, 60a, 80a), and cut lines 4033 and 4034 are formed through insulation layers (50a, 70a, 90a). After that, desmearing and soft etching are conducted if required.

Figure 25:
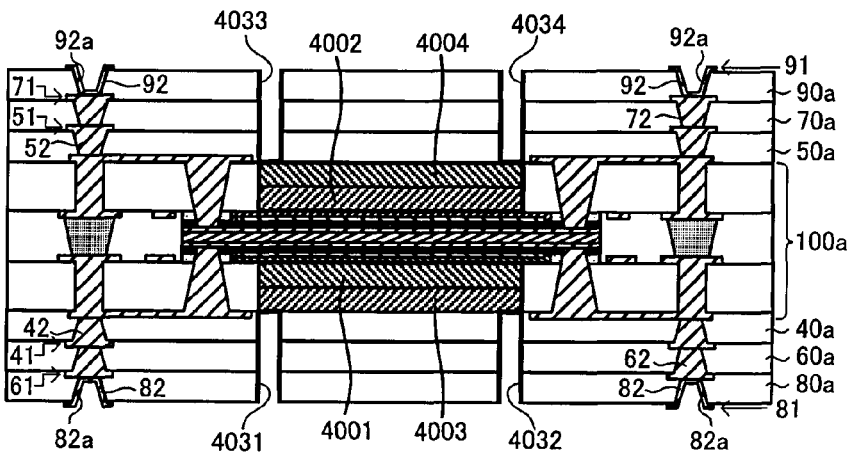
FIG. 25 is a view to illustrate a seventh step subsequent to the step in FIG. 24.

Next, as shown in FIG. 25, plating is formed on the wall surfaces of holes (82a) and plating is formed on the wall surfaces of holes (92a) by copper panel plating (such as either electroless plating or electrolytic plating, or both), for example. Accordingly, conformal conductors (82, 92) are formed. Then, the conductive layers on both surfaces are patterned by a lithographic technique, for example. In doing so, wiring layer 81 is formed on insulation layer (80a) and wiring layer 91 is formed on insulation layer (90a).

Figure 26:
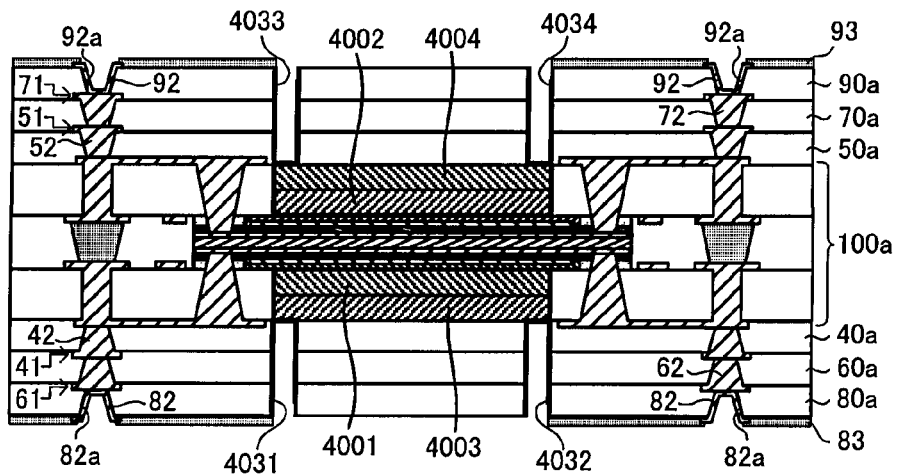
FIG. 26 is a view to illustrate an eighth step subsequent to the step in FIG. 25.

Next, as shown in FIG. 26, solder-resist layers (83, 93) are formed on both surfaces by screen printing or lamination, for example. Then, solder-resist layers (83, 93) are cured by heating, for example. Also, patterning, drilling and exterior processing are conducted if required.

Next, in step (S14) in FIG. 6, space is formed on both sides (first-surface side and second-surface side) of the central section of flexible wiring board 130. Accordingly, flexible section (R100) (FIG. 1) is formed.

Figure 27:
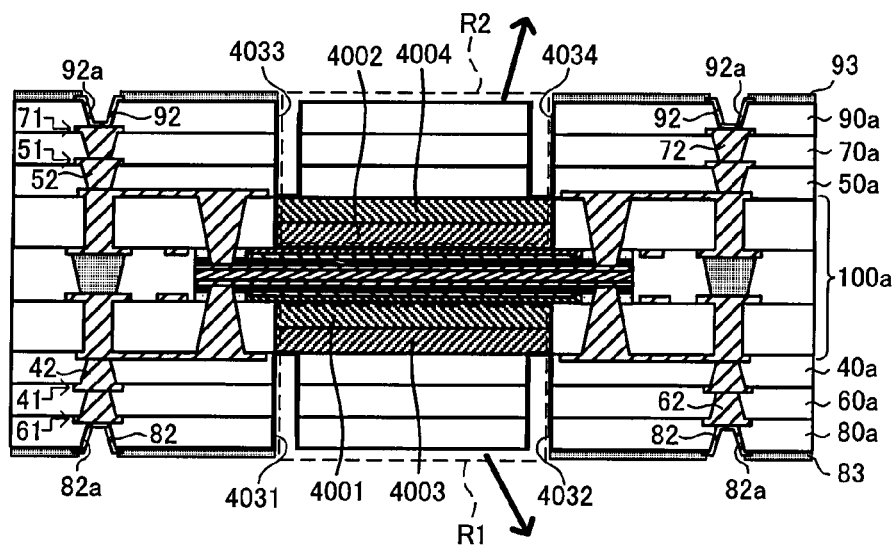
FIG. 27 is a view to illustrate a step for forming a flexible section.

In particular, as shown in FIG. 27, sections corresponding to regions (R1, R2) partitioned by cut lines 4031-4034 are removed by peeling them from both surfaces of flexible wiring board 130. During that time, detaching is easy since first separators (4001, 4002) are arranged. Accordingly, the central section of flexible wiring board 130 is exposed, and space for allowing flexible wiring board 130 to be curved (bent) is formed on the upper and lower surfaces (directions in which insulation layers are laminated) of flexible wiring board 130. As a result, flex-rigid wiring board 100 (FIG. 1) is completed.

Then, if required, remaining conductors are removed by mask etching, for example. Also, external connection terminals (solder bumps) are formed in opening portions in solder-resist layers (83, 93) by printing solder paste, reflowing and the like. Accordingly, such external connection terminals allow flex-rigid wiring board 100 to be connected with other wiring boards or electronic components to be mounted on flex-rigid wiring board 100. Also, exterior processing, warping correction, conductivity inspection, external inspection, final inspection and the like are conducted according to requirements.

Forming various conductive patterns is not limited to any specific method. For example, conductive patterns may be formed by any one of the following, or any combination of two or more such methods: panel plating method, pattern plating method, full-additive method, semi-additive (SAP) method, subtractive method and tenting method.

In a method for manufacturing flex-rigid wiring board 100 of the present embodiment, the multilayer core section (first substrate 10, second substrate 20, third substrate 30) is formed by pressing (see FIG. 14). Accordingly, a multilayer core section is manufactured easily.

Also, since insulation layer (20*a*) prior to thermal pressing is in a prepreg state, adhesiveness with insulation layer (10*a*) and insulation layer (30*a*) is high.

Second Embodiment

The second embodiment of the present invention is described by focusing on the differences from the above first embodiment. Here, the same reference number is used for the same element as shown in the above FIG. 1 and others. Regarding the common portions already described, namely, if a description is redundant, such a description may be omitted for convenience sake.

Figure 28:
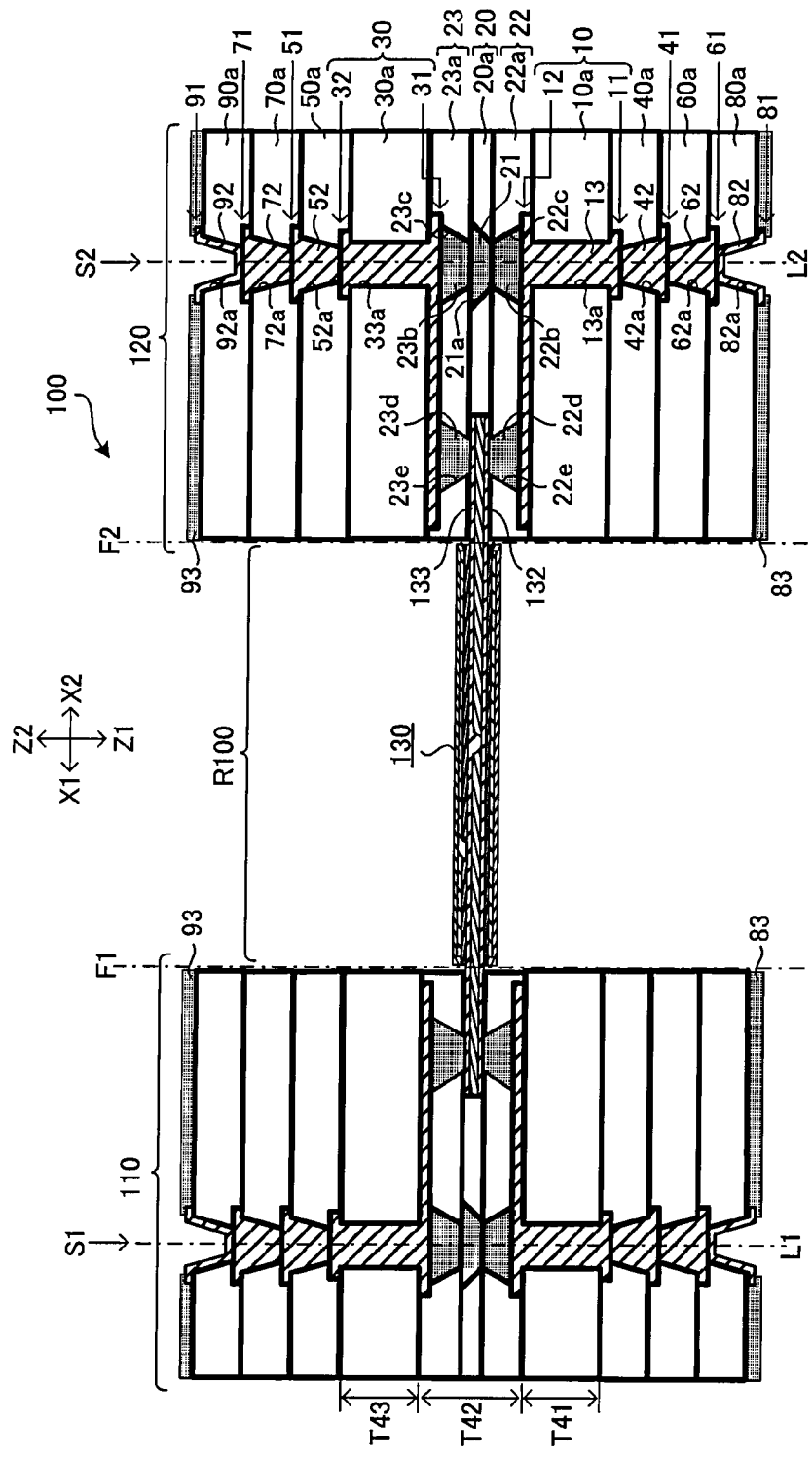
FIG. 28 is a cross-sectional view of a flex-rigid wiring board according to the second embodiment of the present invention.

As shown in FIG. 28, flex-rigid wiring board 100 of the present embodiment has fourth substrate 22 on the first-surface side of second substrate 20, and fifth substrate 23 on the second-surface side of second substrate 20. First substrate 10, second substrate 20, third substrate 30, fourth substrate 22 and fifth substrate 23 correspond to the core section.

Fourth substrate 22 has insulation layer (22*a*) (second insulation layer), filled conductor (22*b*) (second conductor) and filled conductor (22*d*) (connection conductor). Hole (22*c*) (second hole) and hole (22*e*) are formed in insulation layer (22*a*). Filled conductor (22*b*) is formed by filling conductive paste in hole (22*c*), and filled conductor (22*d*) is formed by filling conductive paste in hole (22*e*).

Fifth substrate 23 has insulation layer (23*a*) (third insulation layer), filled conductor (23*b*) (third conductor) and filled conductor (23*d*) (connection conductor). Hole (23*c*) (third hole) and hole (23*e*) are formed in insulation layer (23*a*). Filled conductor (23*b*) is formed by filling conductive paste in hole (23*c*), and filled conductor (23*d*) is formed by filling conductive paste in hole (23*e*).

By laminating first substrate 10, fourth substrate 22, second substrate 20, fifth substrate 23 and third substrate 30 from the first-surface side toward the second-surface side, insulation layer (10*a*) (fourth insulation layer) is laminated on the first-surface side of insulation layer (22*a*), and insulation layer (30*a*) (fifth insulation layer) is laminated on the second-surface side of insulation layer (23*a*). Then, filled conductor 13 (fourth conductor) in hole (13*a*) (fourth hole), filled conductor (22*b*) (second conductor) in hole (22*c*) (second hole), filled conductor 21 (first conductor) in hole (21 *a*) (first hole), filled conductor (23*b*) (third conductor) in hole (23*c*) (third hole), and filled conductor 33 (fifth conductor) in hole (33*a*) (fifth hole) are positioned along the same axis (axis (L1), (L2)) and become electrically continuous with each other.

In the present embodiment, both filled conductors (22*b*, 23*b*) are made of conductive paste. However, the present embodiment is not limited to such, and only filled conductor (22*b*) or (23*b*) may be made of conductive paste, for example. Also, in the present embodiment, both filled conductors (13, 33) are formed with plating. However, the present embodiment is not limited to such, and only filled conductor 13 or 33 may be formed with plating, for example.

If flex-rigid wiring board 100 is made as a single-sided wiring board or the like, insulation layer (10*a*) or (30*a*) may be laminated only on the first-surface side of insulation layer (22*a*) or only on the second-surface side of insulation layer (23*a*). However, if filled conductor (22*b*) is made of conductive paste, it is preferred that insulation layer (10*a*) be formed on the first-surface side of insulation layer (22*a*) so that at least filled conductors (23*b*, 21, 22*b*, 13) which are electrically continuous with each other be positioned along the same axis. Also, if filled conductor (23*b*) is made of conductive paste, it is preferred that insulation layer (30*a*) be formed on the second-surface side of insulation layer (23*a*) so that at least filled conductors (22*b*, 21, 23*b*, 33) which are electrically continuous with each other be positioned along the same axis. If such a structure is employed, it is easier to form flex-rigid wiring board 100 as multilayered.

Insulation layer (20*a*) (first insulation layer) is positioned to a side (direction X) of flexible wiring board 130. Insulation layer (22*a*) is laminated on the first-surface side of an end portion of flexible wiring board 130 and of insulation layer (20*a*). Insulation layer (23*a*) is laminated on the second-surface side of the end portion of flexible wiring board 130 and of insulation layer (20*a*).

Conductive patterns (wiring layers 132, 133) of flexible wiring board 130 are exposed at the end portions of flexible wiring board 130. Then, wiring layer 132 and a conductive pattern (wiring layer 12) of rigid section (110, 120) are electrically connected by means of filled conductor (22*d*). Wiring layer 133 and a conductive pattern (wiring layer 31) of rigid section (110, 120) are electrically connected by means of filled conductor (23*d*).

Thickness (T42), corresponding to the sum of the thickness of insulation layer (22*a*), the thickness of insulation layer (20*a*) and the thickness of insulation layer (23*a*), is 100 μm, for example. Also, thickness (T41) of insulation layer (10*a*) and thickness (T43) of insulation layer (30*a*) are each 100 μm, for example. In the present embodiment, thickness (T42), thickness (T41) and thickness (T43) are set substantially the same. In addition, the first-surface side and the second-surface side of insulation layer (20*a*) are symmetrical, namely, the thicknesses of the insulation layers on both sides of insulation layer (20*a*) are set the same. Accordingly, it is thought that stresses are offset. As a result, it is thought that flex-rigid wiring board 100 is suppressed from warping.

Figure 29:
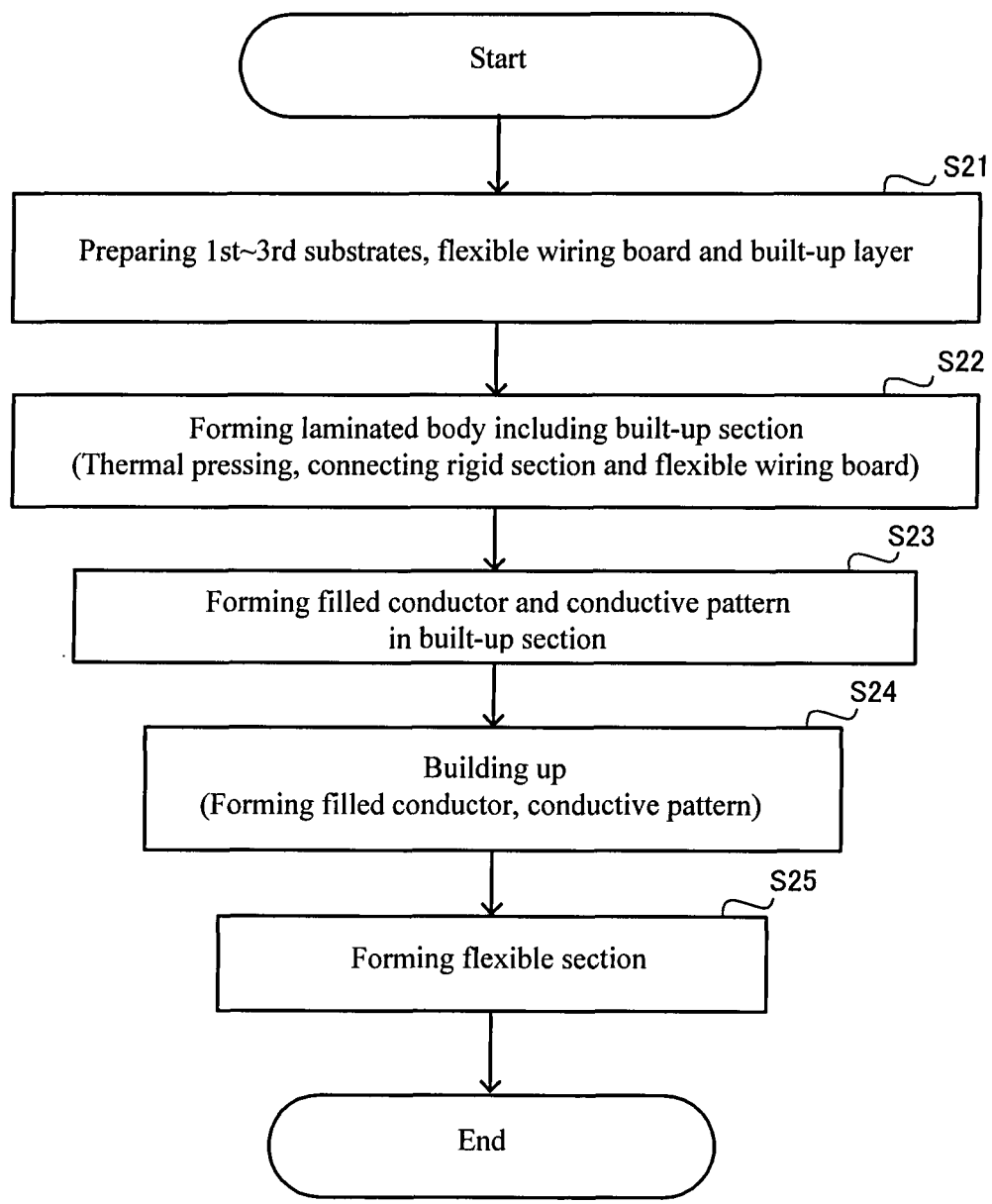
FIG. 29 is a flowchart showing a method for manufacturing a flex-rigid wiring board according to the second embodiment of the present invention.

Flex-rigid wiring board 100 of the present embodiment is manufactured by a procedure shown in FIG. 29, for example.

In step (S21), first substrate 10, second substrate 20, third substrate 30, flexible wiring board 130 and built-up layers (lowermost insulation layers (40*a*, 50*a*) in built-up sections) are prepared.

Figure 30A:
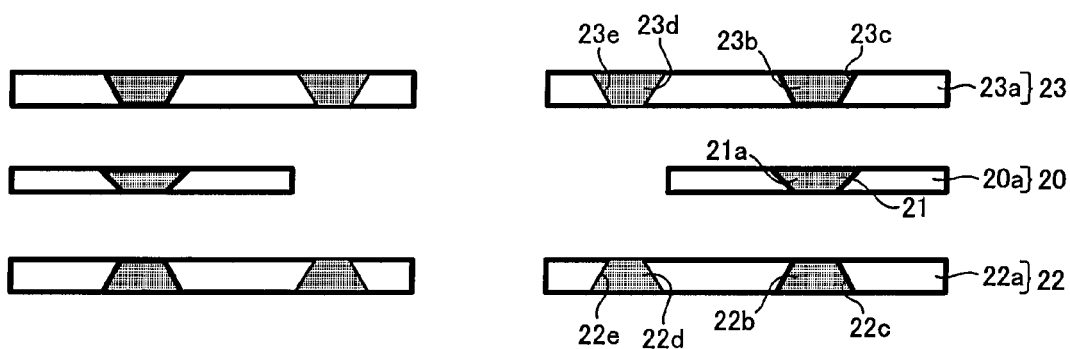
FIG. 30A is a view to illustrate a step for preparing a second substrate, a fourth substrate and a fifth substrate.
Figure 30B:
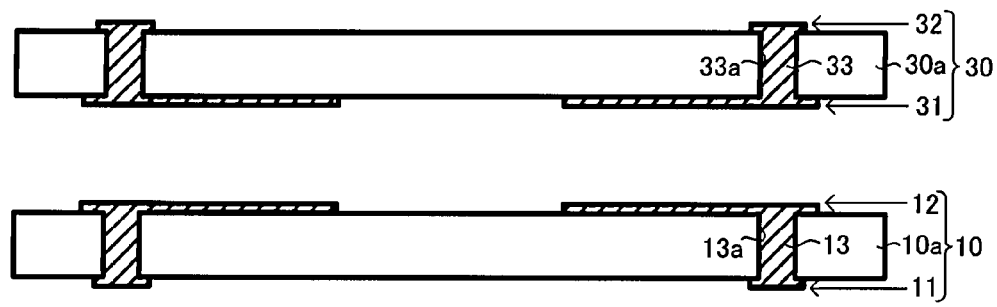
FIG. 30B is a view to illustrate a step for preparing a first substrate and a third substrate.
Figure 30C:
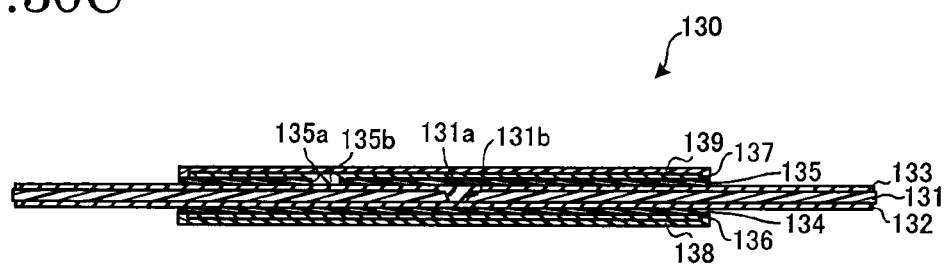
FIG. 30C is a view to illustrate a step for preparing a flexible wiring board.
Figure 31:
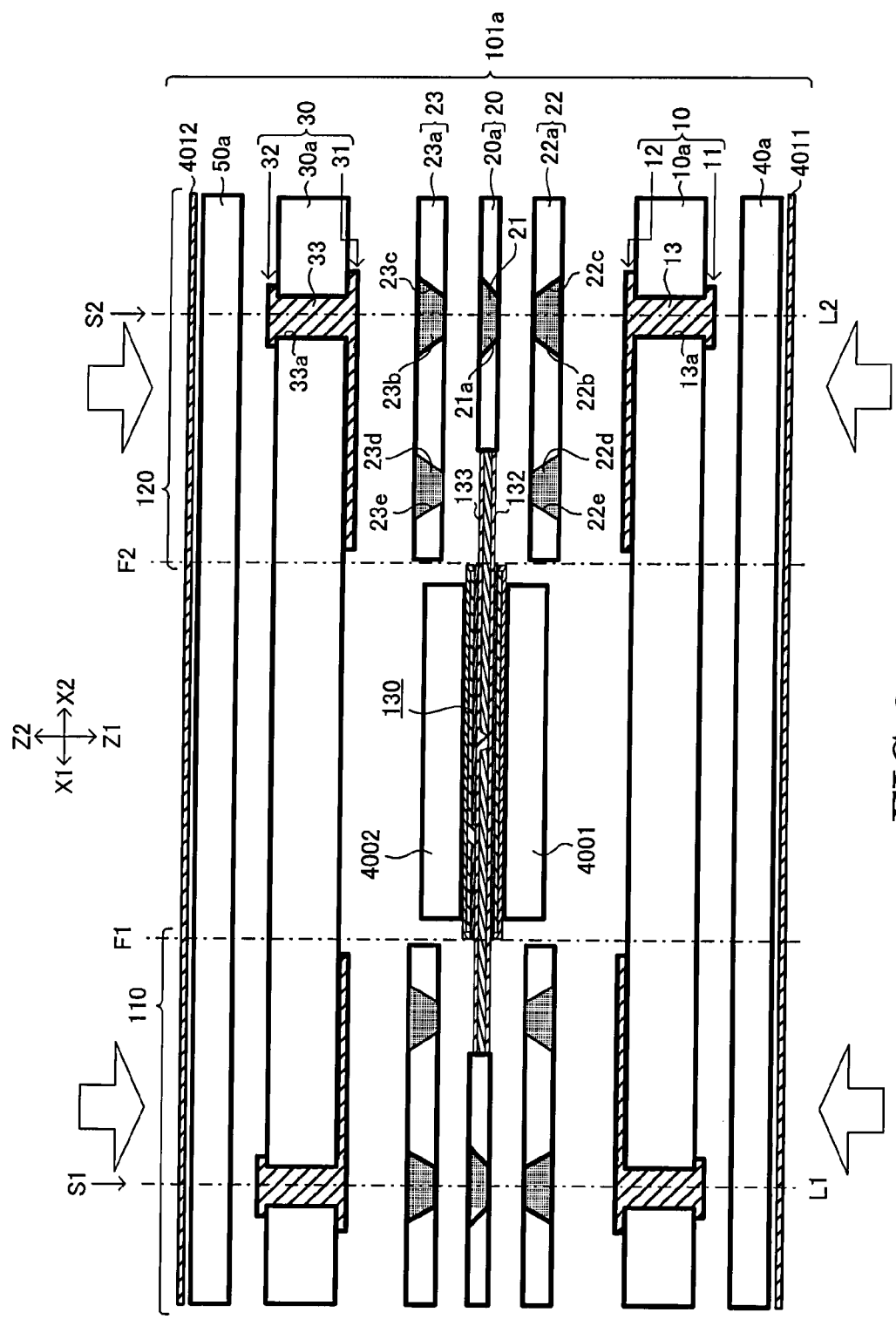
FIG. 31 is a view to illustrate a step for forming a laminated body (core section)

First, as shown in FIG. 30A, second substrate 20, fourth substrate 22 and fifth substrate 23 are manufactured by steps that correspond to those shown in FIGS. 7A-8, for example. At this stage, insulation layers (23*a*, 20*a*, 22*a*) are in a prepreg state (semi-cured adhesive sheet). Also, as shown in FIG. 30B, first substrate 10 and third substrate 30 are manufactured by steps that correspond to those shown in FIGS. 9A-9C, for example. In addition, as shown in FIG. 30C, flexible wiring board 130 is manufactured by steps that correspond to those shown in FIGS. 11A-11E, for example. As described above, in flexible wiring board 130 of the present embodiment, inner coverlays (134, 135), shield layers (136, 137) and outer coverlays (138, 139) are not formed all the way to the edges, and wiring layers (132, 133) are exposed at the end portions. Moreover, as shown in FIG. 31, copper foil 4011, insulation layer (40*a*), insulation layer (50*a*) and copper foil 4012 are prepared. At this stage, insulation layers (40*a*, 50*a*) are in a prepreg state (semi-cured adhesive sheet). However, instead of prepreg, RCF (resin-coated copper foil) or the like may also be used.

Next, in step (S22) of FIG. 29, laminated body (101*a*) is formed with copper foil 4011, insulation layer (40*a*), first substrate 10, fourth substrate 22, second substrate 20, fifth substrate 23, third substrate 30, insulation layer (50*a*) and copper foil 4012.

Specifically, as shown in FIG. 31, copper foil 4011, insulation layer (40*a*), insulation layer (10*a*), insulation layer (22*a*), second substrate 20, flex wiring board 130, insulation layer (23*a*), insulation layer (30*a*), insulation layer (50*a*) and copper foil 4012 are laminated. First separator 4001 is positioned on the first-surface side of flexible wiring board 130, and first separator 4002 is positioned on the second-surface side of flexible wiring board 130. The same as in the first embodiment, second separators (4003, 4004) may further be arranged, but second separators (4003, 4004) are omitted in the present embodiment. In doing so, insulation layer (20*a*) is sandwiched by insulation layer (22*a*) and insulation layer (23*a*). Also, such insulation layers (22*a*, 20*a*, 23*a*) are sandwiched by insulation layer (10*a*) and insulation layer (30*a*), and they are further sandwiched by insulation layers (40*a*, 50*a*). Filled conductors (13, 22*b*, 21, 23*b*, 33) are positioned along the same axes (axis L1, L2). As a result, laminated body (101*a*) is formed. The material of each member, their degree of curing, their thermal expansion coefficient and the like at this stage are the same as in the first embodiment. Filled conductors (22*b*, 22*d*, 23*b*, 23*d*) are formed to be tapered cylinders, tapering narrower as they come closer to the core (second substrate 20), for example. However, their shapes are not limited to such.

Next, the above laminated body (101*a*) is thermal pressed all at once. Namely, pressing and heating are simultaneously conducted. Prepreg (insulation layers 40*a*, 22*a*, 20*a*, 23*a*, 50*a*) are cured by pressing and heating, and are adhered to adjacent members. As a result, laminated body (101*a*) becomes integrated. Adjacent members are adhered to (touching) each other, and filled conductors (13, 22*b*, 21, 23*b*, 33) become electrically continuous with each other. Furthermore, wiring layer 132 and filled conductor (22*d*) become electrically continuous with each other, and wiring layer 133 and filled conductor (23*d*) become electrically continuous with each other. By being pressured, conductive material in the conductive paste (filled conductors 22*d*, 22*b*, 21, 23*b*, 23*d*) becomes finer, and its resistance decreases. In addition, under certain circumstances, resin is squeezed from the surrounding insulation layers (insulation layer (22*a*), insulation layer (20*a*), or insulation layer (23*a*)), and the resin is filled in the clearances between insulation layer (20*a*) and flexible wiring board 130. Here, pressing and heating may be divided into multiple procedures. Also, heating and pressing may be conducted separately, but it is more efficient if they are conducted simultaneously.

Next, in step (S23) of FIG. 29, conductive patterns (wiring layers 41, 51) and filled conductors (filled conductors 42, 52) for interlayer connections are formed for built-up layers (insulation layers (40*a*), (50*a*)) by steps that correspond to those in FIGS. 20-22, for example.

Next, in step (S24) of FIG. 29, further built-up layers are formed by steps that correspond to those in FIG. 23-26, for example.

Next, in step (S25) of FIG. 29, space is formed on both sides (first-surface side and second-surface side) of the central section of flexible wiring board 130 by a step that corresponds to that in FIG. 27, for example. In doing so, flexible section (R100) (FIG. 28) is formed. As a result, flex-rigid wiring board 100 of the present embodiment (FIG. 28) is completed.

In such a manufacturing method, since the core section (first substrate 10, second substrate 20, third substrate 30, fourth substrate 22 and fifth substrate 23) and lowermost insulation layers (insulation layers (40*a*), (50*a*)) of the built-up sections are pressed all at once, flex-rigid wiring board 100 may be manufactured with fewer pressing times.

So far, a flex-rigid wiring board according to embodiments of the present invention and its manufacturing methods have been described. However, the present invention is not limited to the above embodiments.

Figure 32A:
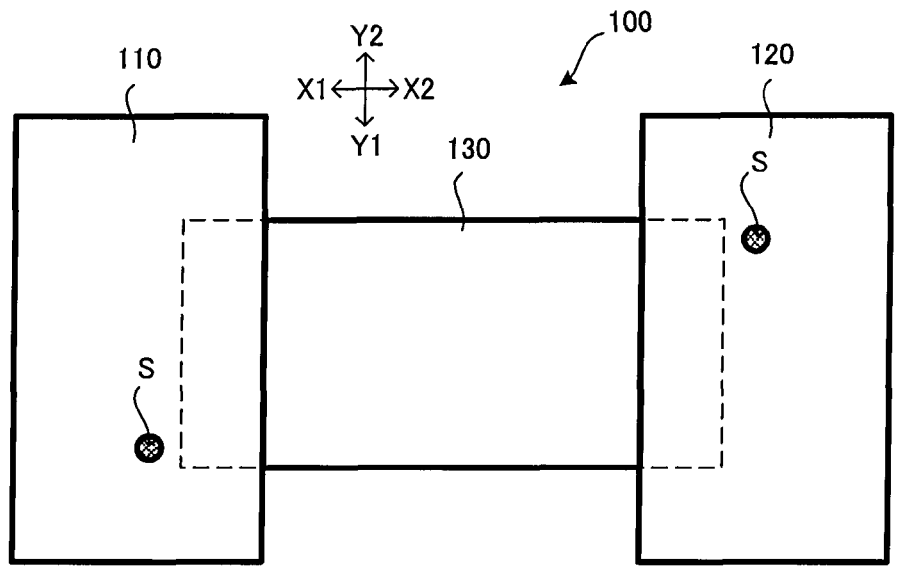
FIG. 32A is a view showing a first alternative example in which positioning of filled stacks is modified.
Figure 32B:
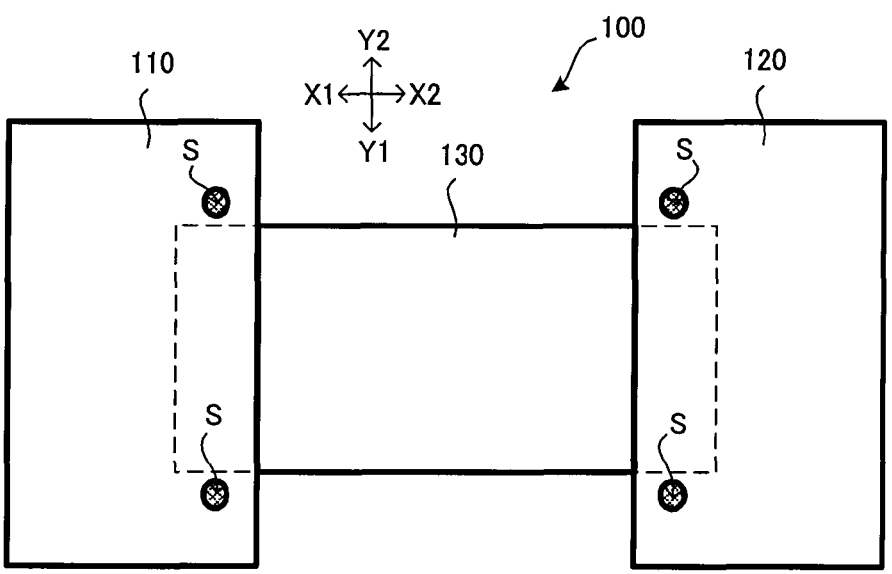
FIG. 32B is a view showing a second alternative example in which positioning of filled stacks is modified.

Positioning filled stacks is not limited specifically. For example, as shown in FIG. 32A, filled stacks "S" may be positioned diagonally by sandwiching flexible wiring board 130. Alternatively, as shown in FIG. 32B, filled stacks "S" may be positioned at the sides (in directions Y) of flexible wiring board 130.

Figure 33A:
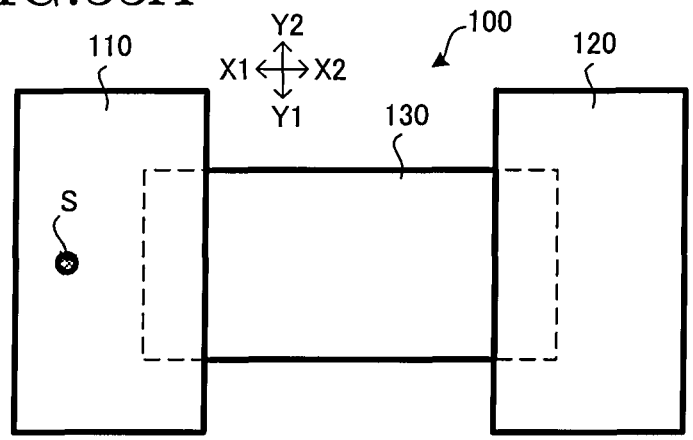
FIG. 33A is a view showing a first alternative example in which the number of filled stacks is modified.
Figure 33B:
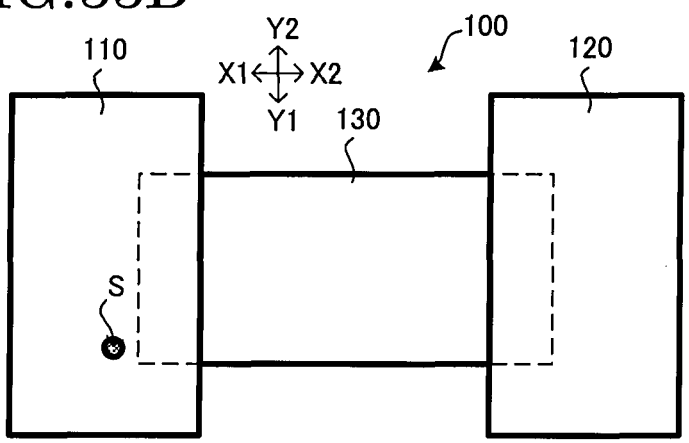
FIG. 33B is a view showing a second alternative example in which the number of filled stacks is modified.
Figure 33C:
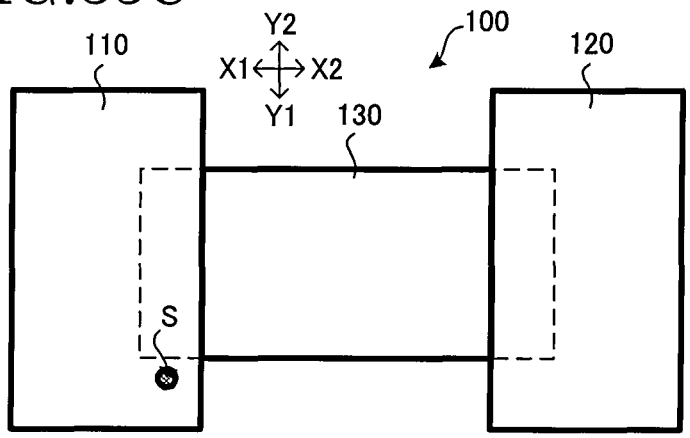
FIG. 33C is a view showing a third alternative example in which the number of filled stacks is modified.

The number of filled stacks "S" may be one, as shown in FIGS. 33A-33C), for example. For example, among the multiple filled stacks shown in FIGS. 2A, 2B, 32A and 32B, one remains and the rest may be omitted. FIG. 33A shows an example in which one filled stack "S" in FIG. 2A remains. FIG. 33B shows an example in which one filled stack "S" in FIG. 32A remains. FIG. 33C shows an example in which one filled stack "S" in FIG. 32B remains.

Figure 34A:
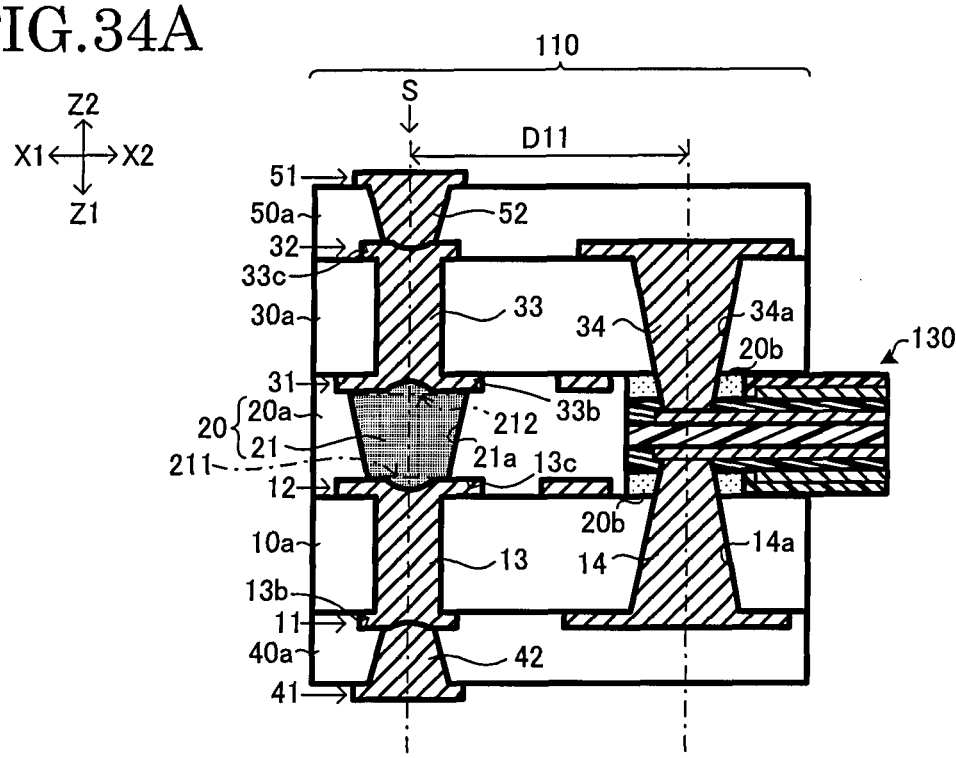
FIG. 34A is a cross-sectional view showing an example where filled conductors for interlayer connection and connection conductors in a flexible wiring board are electrically insulated.

As shown in FIG. 34A, paired filled conductors 14 and 13 and paired filled conductors 34 and 33 may be electrically insulated within each pair. Alternatively, only either pair may be electrically insulated within the pair. Distance (D1) between filled conductor 14 and filled conductor 13 (or the distance between filled conductor 34 and filled conductor 33) is not limited specifically. Filled conductor 14 and filled conductor 34 may also be positioned so as to be shifted from axis Z (for example, shifted in directions X or directions Y).

Figure 34B:
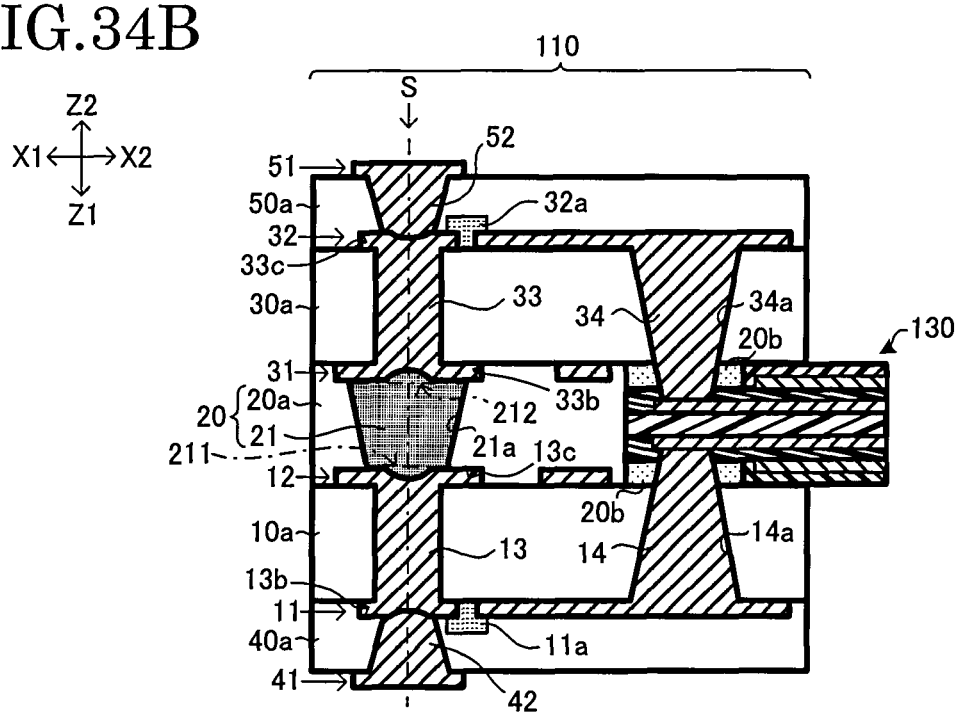
FIG. 34B is a cross-sectional view showing an example where filled conductors for interlayer connection and connection conductors in a flexible wiring board are electrically connected by means of junction conductors.

As shown in FIG. 34B, by placing junction conductors (11*a*, 31*a*) between the land of filled conductor 14 and land (13*b*) of filled conductor 13, and between the land of filled conductor 34 and land (33*c*) of filled conductor 33, each pair may be electrically connected.

Figure 35:
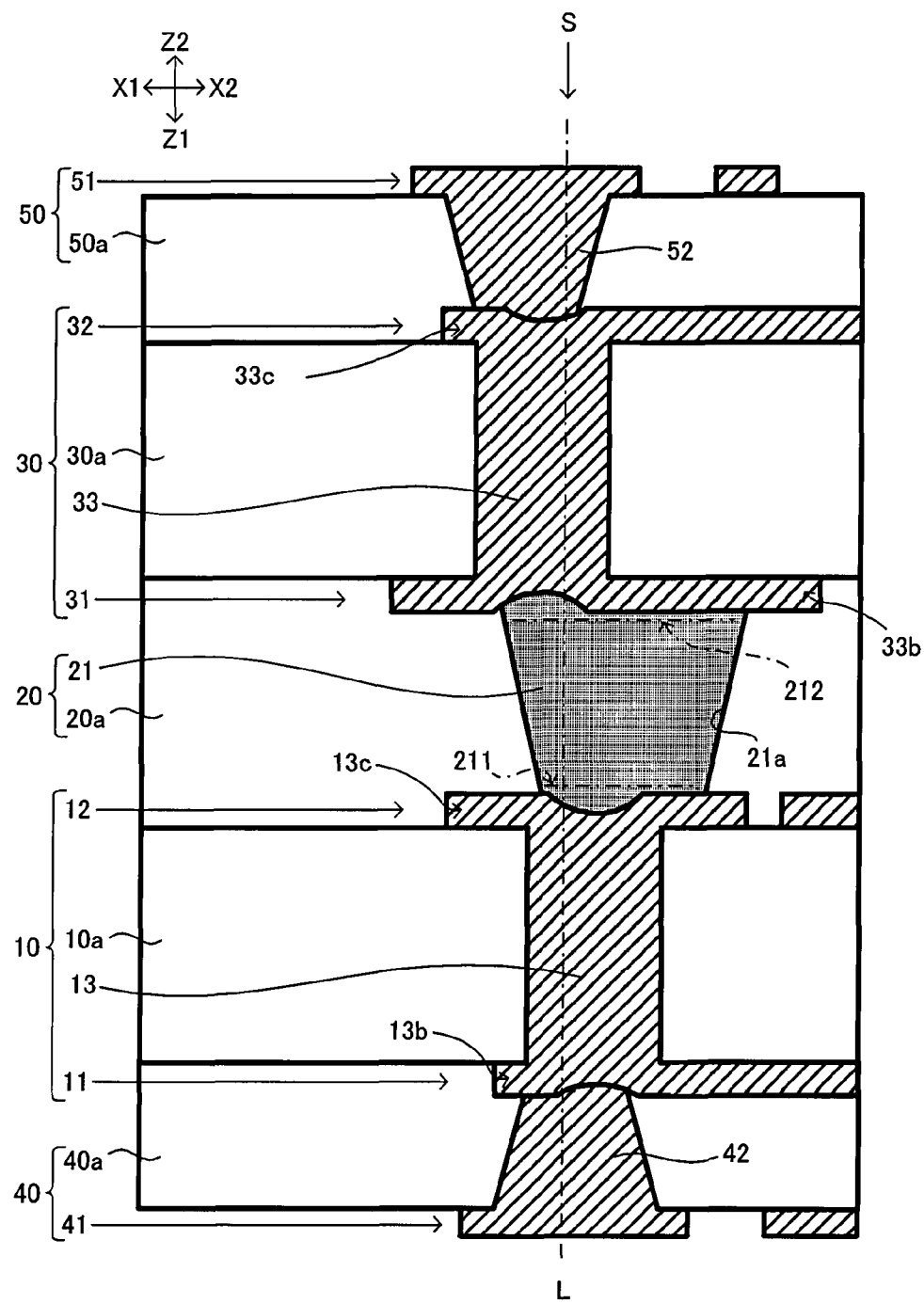
FIG. 35 is a cross-sectional view showing a full stack structure where filled conductors are not positioned to be concentric circles.

As shown in FIG. 35, even if land (13*b*), filled conductor 13, land (13*c*), filled conductor 21 (opening 211, opening 212), land (33*b*), filled conductor 33 and land (33*c*) are not positioned in concentric circles, flex-rigid wiring board 100 may be formed to have a full stack structure.

Figure 36:
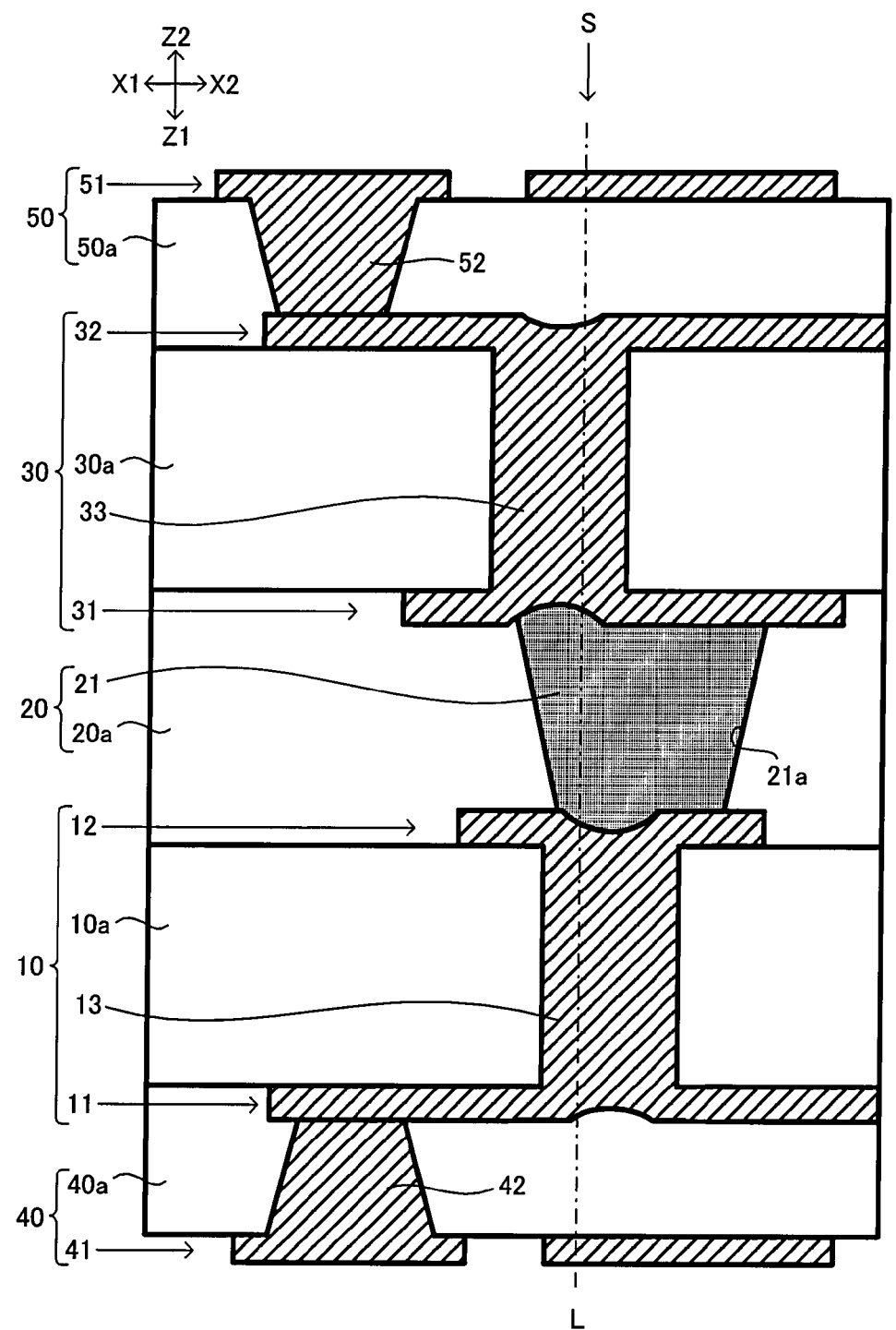
FIG. 36 is a cross-sectional view of a wiring board which does not have a full stack structure.

A full stack structure is not always required. For example, as shown in FIG. 36, if at least filled conductors (13, 21, 33) are positioned along the same axis, effects such as reduction of wiring lengths or the like are achieved as described previously. However, such effects are greater with a full stack structure.

Figure 37:
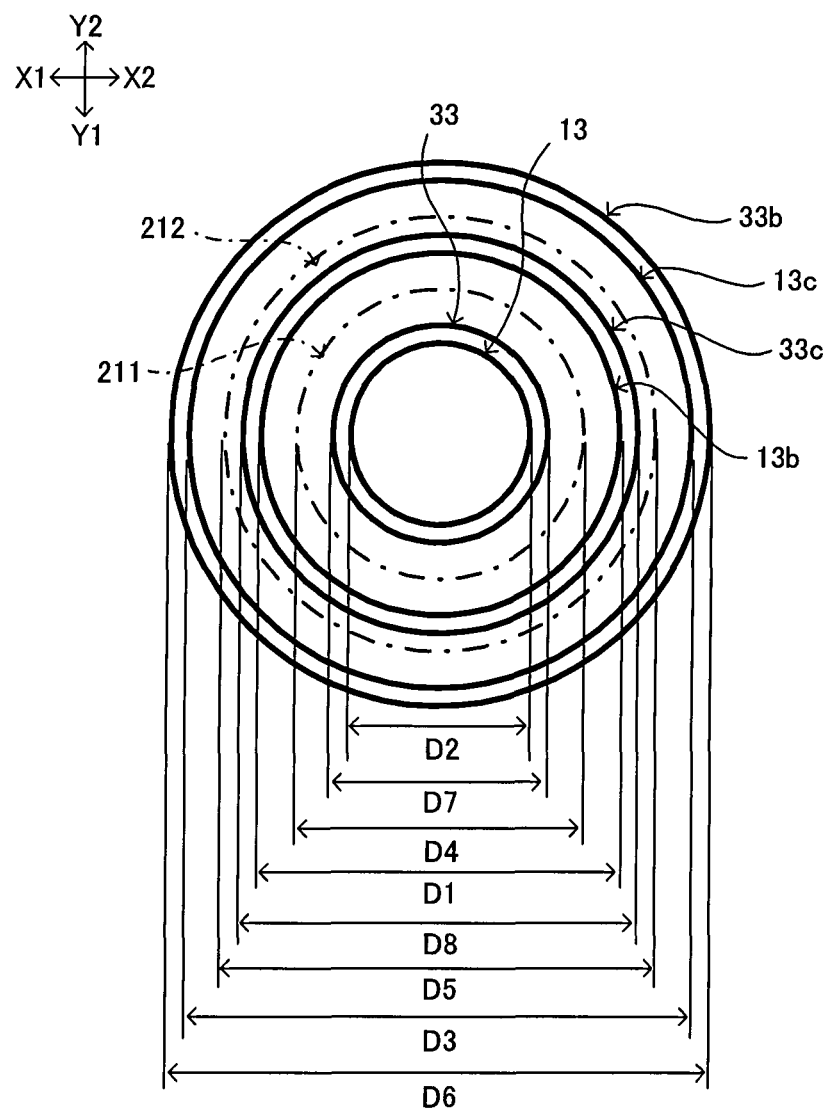
FIG. 37 is a plan view showing another example where sizes in a filled stack are modified.

It is not always required for the size to be the same within each pair of width (D1) of land (13*b*) and width (D8) of land (33*c*), width (D2) of filled conductor 13 and width (D7) of filled conductor 33, and width (D3) of land (13*c*) and width (D6) of land (33*b*). As shown in FIG. 37, such pairings may have different sizes.

Figure 38A:
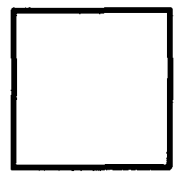

The shape of horizontal cross sections (X-Y plane) of filled conductors, conformal conductors and their lands is not limited to a circle (completely round circle), and any other shape may be employed. The shape of such cross sections may be a square as shown in FIG. 38A, for example, or may be any other regular polygons, such as a regular hexagon and a regular octagon. The shape of angles in such polygons is not limited to any type, and may be a right angle, an acute angle, an obtuse angle or may even be roundish, for example. However, to prevent thermal stress from being concentrated, it is preferred that angles be roundish.

Also, the shape of the above horizontal cross sections may be oval, rectangular, triangular or the like. However, such shapes have disadvantages due to their anisotropic characteristics.

The above circles, ovals and regular polygons have advantages since their shapes tend to be similar to the shape of the holes.

Figure 38B:
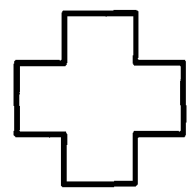
Figure 38C:
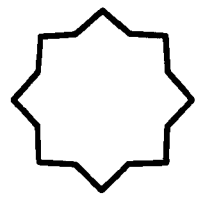

Alternatively, as shown in FIG. 38B or 38C, shapes such as a cross or a regular polygonal star formed by drawing straight lines to radiate out from the center (shapes in which multiple spokes are positioned in a radial pattern) are effective as the shape of the above horizontal cross sections.

Figure 39:
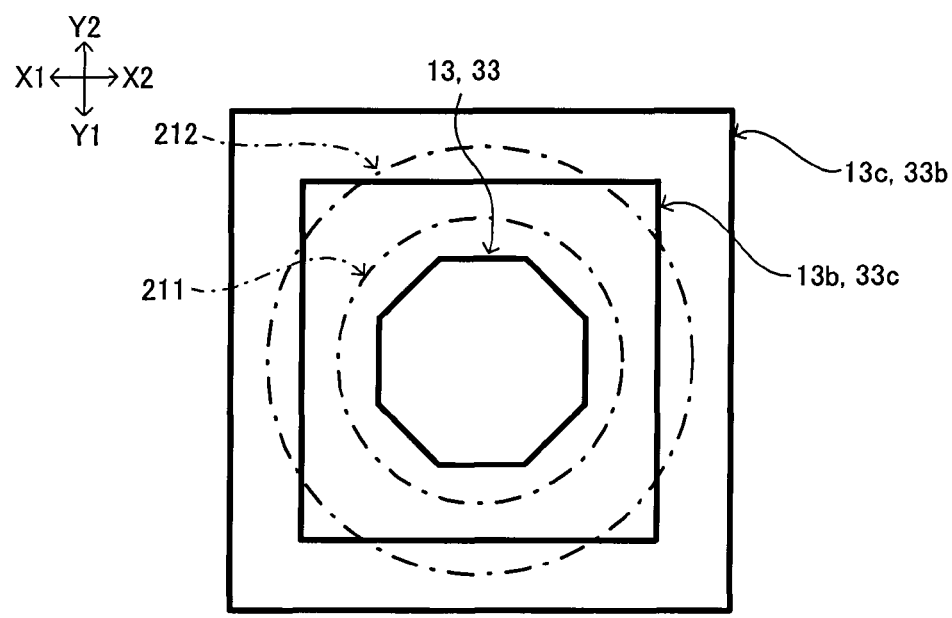
FIG. 39 is a view showing an example in which different shapes are combined for filled conductors and their lands.

The above shapes may be freely combined and employed for the shapes of filled conductors, conformal conductors and their lands. For example, as shown in FIG. 39, different shapes may be combined for filled conductors and their lands.

Figure 40:
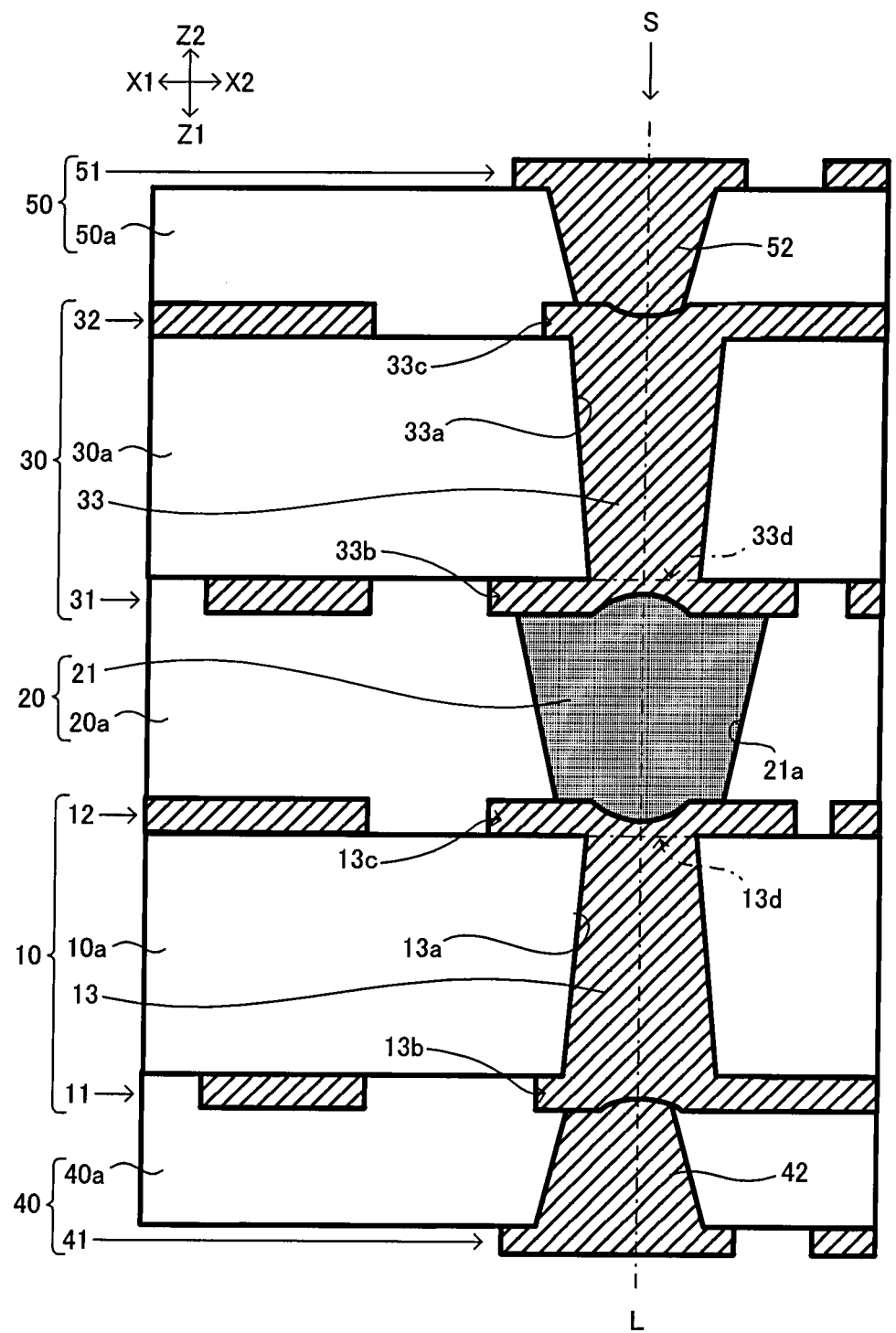
FIG. 40 is a view showing a first alternative example of vertical cross-sectional shapes of filled conductors.
Figure 41:
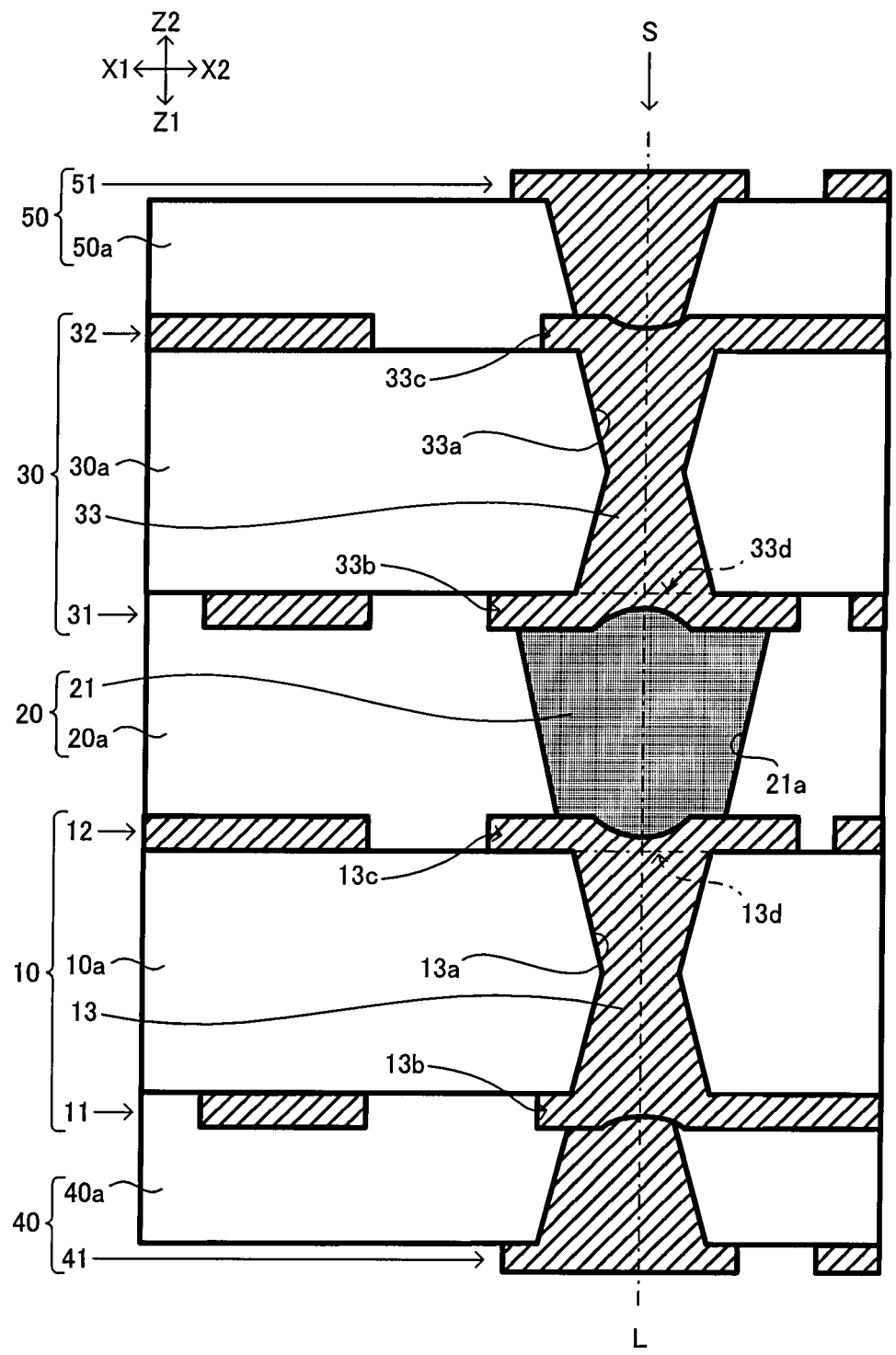
FIG. 41 is a view showing a second alternative example of vertical cross-sectional shapes of filled conductors.

The shape of vertical cross sections of filled conductors may be formed freely. For example, as shown in FIG. 40, filled conductor 13 and filled conductor 33 may be formed as tapered cylinders. Also, filled conductor 21 may be formed to be a cylinder. Alternatively, as shown in FIG. 41, filled conductor 13 and filled conductor 33 may be formed like drums (translator's memo: the drum indicated here is a traditional Japanese small drum, whose cross section is similar to that of an hourglass). In addition, filled conductor 21 may also be formed like a drum. If a hole is formed like a drum, since the diameter of the opening portions becomes greater than the diameter of the central portion, it is thought that better performance is expected when the hole is filled by plating. As a result, it is thought that surface flatness features are enhanced.

Figure 42:
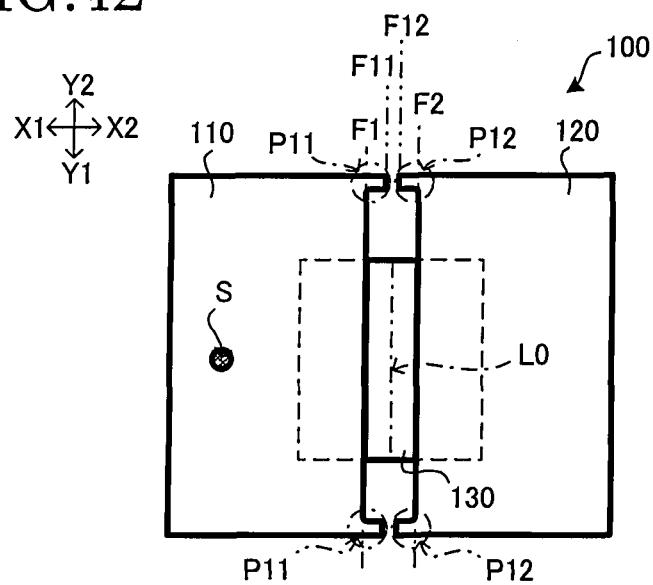
FIG. 42 is a view showing an example in which a rigid section has protruding portions that protrude from the boundary surface with a flexible section.

As shown in FIG. 42, rigid sections (110, 120) may have protruding portions (P11, P12) which protrude from boundary surfaces (F1, F2) (see FIG. 1 as well) positioned between flexible section (R100) and the rigid sections. In an example shown in FIG. 42, rigid section 110 has two protruding portions (P11), and rigid section 120 has two protruding portions (P12). Protruding portions (P11) are positioned on the Y1 side and Y2 side of flexible wiring board 130, and protrude toward the X2 side from boundary surface (F1) between rigid section 110 and flexible section (R100). On the other hand, protruding portions (P12) are positioned on the Y1 side and Y2 side of flexible wiring board 130, and protrude toward the X1 side from boundary surface (F2) between rigid section 120 and flexible section (R100). The planar shape of protruding portions (P11, P12) (the shape on the X-Y plane) is rectangular, for example. Excessive stress is prevented from occurring in the F-R connection sections by forming such protruding portions (P11, P12). Descriptions of such an effect are provided in the following with reference to FIG. 43.

It is thought that flex-rigid wiring board 100 is folded in two at line (L0) in FIG. 42, for example, and accommodated in casing 5001 of a cell phone or the like. When being folded in two, curved portion (P 13) is formed near line (L0) of flexible wiring board 130. In such a case, flex-rigid wiring board 100 may be pressed against casing 5001 due to vibrations or swinging.

Figure 43:
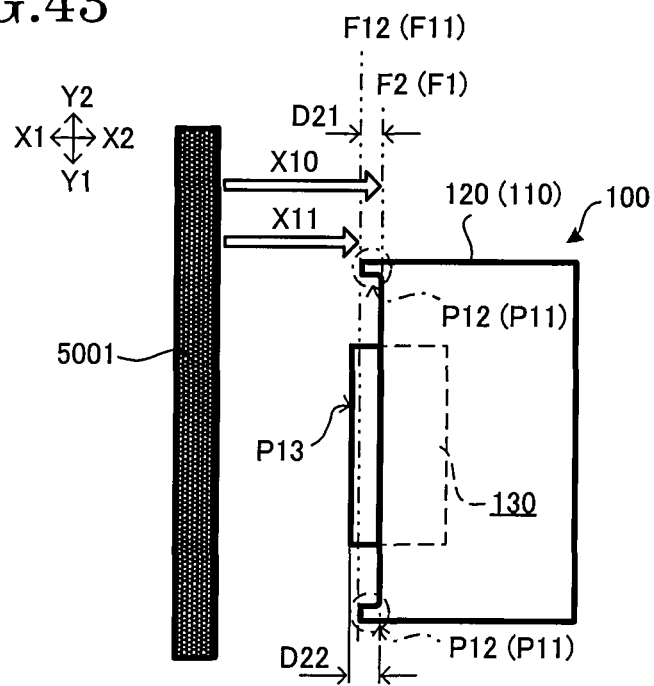
FIG. 43 is a view to illustrate the effects of the protruding portions shown in FIG. 42.

During such time, without protruding portions (P11, P12), casing 5001 may move freely until it touches boundary surface (F1) or (F2) as indicated by arrow (X10) in FIG. 43. In such a situation, if force toward the X2 side is exerted to casing 5001 due to vibrations or the like, it is thought that curved portion (P13) of flexible wiring board 130 is pushed into the X2 side by casing 5001. Moreover, if curved portion (P13) of flexible wiring board 130 is further pushed into near boundary surface (F1) or (F2), great force is generated at the F-R connection sections, and line breakage or the like becomes a concern.

By contrast, with protruding portions (P11, P12), as indicated by arrow (X11) in FIG. 43, the movement of casing 5001 is restricted by top surfaces (F11) of protruding portions (P11) or top surfaces (F12) of protruding portions (P12).

Therefore, casing 5001 does not push curved portion (P13) of flexible wiring board 130 any further. Accordingly, stress is seldom generated at the F-R connection sections. As a result, line breakage or the like is suppressed from occurring at the F-R connection sections.

Figure 44:
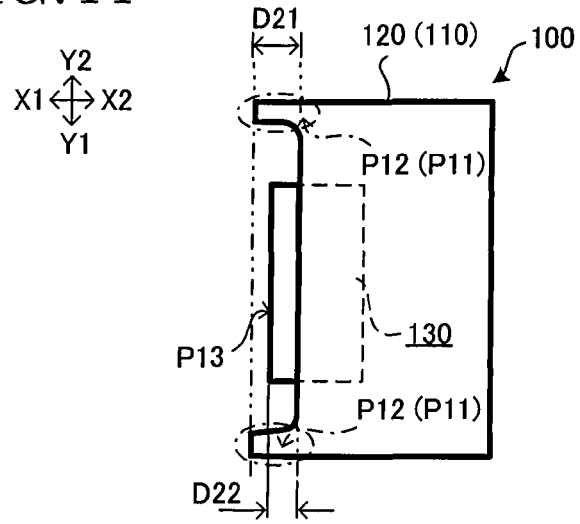
FIG. 44 is a view showing a first alternative example of the form of protruding portions.

The protruding amount (D21) of protruding portions (P11, P12) is approximately 1 mm, for example. The protruding amount (D22) of curved portion (P13) of flexible wiring board 130 is approximately 2-3 mm, for example. Namely, in such an example, (D22) is set greater than (D21) (D21<D22). However, the protruding amounts are not limited to such, and (D22) may be set smaller than (D21) (D22<D21) as shown in FIG. 44, for example. By so setting, it is difficult for casing 5001 to even touch curved portion (P13) of flexible wiring board 130.

Figure 45A:
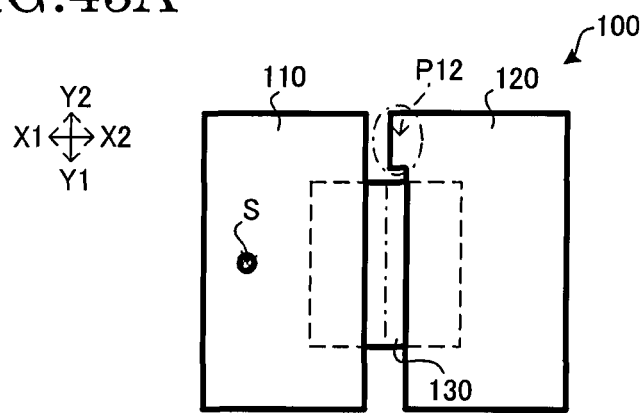
FIG. 45A is a view showing a second alternative example of the form of a protruding portion.
Figure 45B:
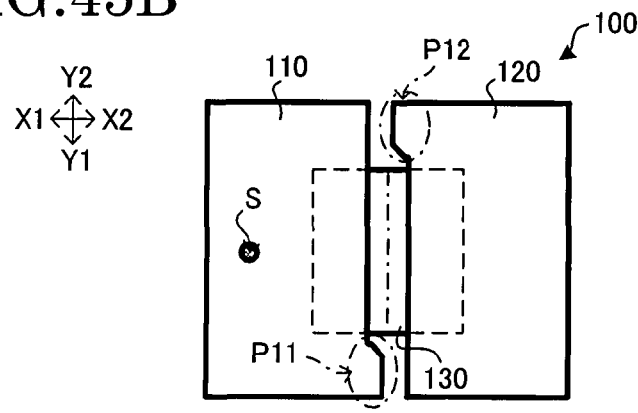
FIG. 45Bva view showing a third alternative example of the form of protruding portions.

The number, shape, positioning and so forth of protruding portions (P11, P12) are not limited specifically. For example, as shown in FIG. 45A, one protruding portion (P12) may be formed only in either rigid section 110 or 120; for example, only in rigid section 120. Alternatively, as shown in FIG. 45B, for example, the planar shape of protruding portions (P11, P12) may be trapezoidal. As in the example shown in FIG. 45B, protruding portion (P11) may be formed on the Y1 side of flexible wiring board 130, and protruding portion (P12) may be formed on the Y2 side of flexible wiring board 130.

Figure 46A:
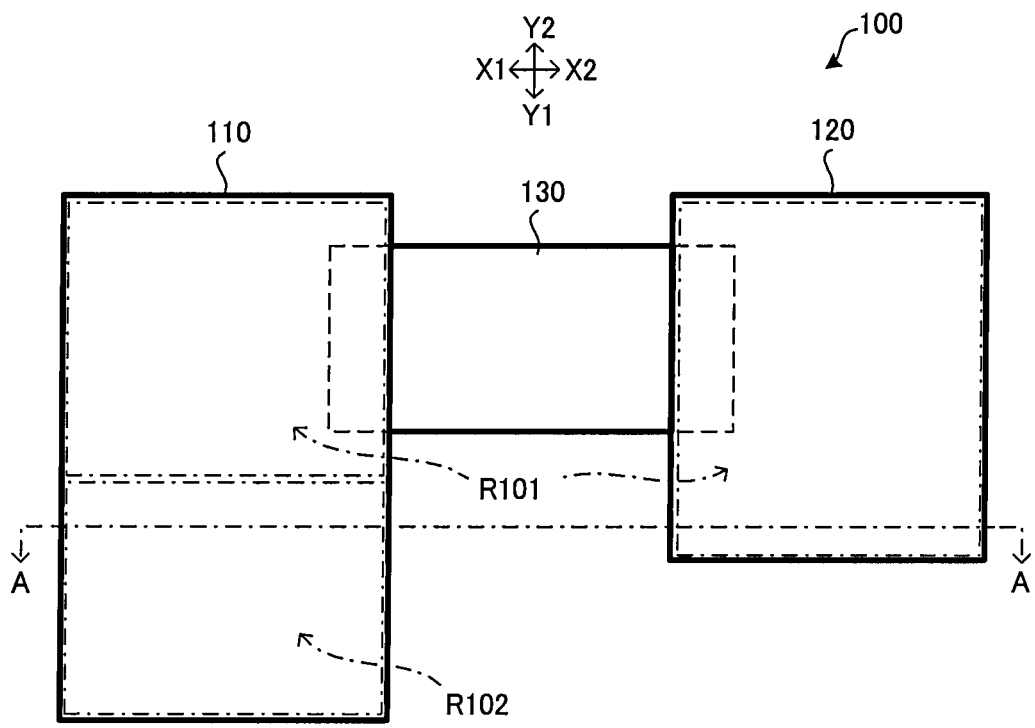
FIG. 46A is a view showing an example where a rigid section has multiple regions with different numbers of layers from each other.
Figure 46B:
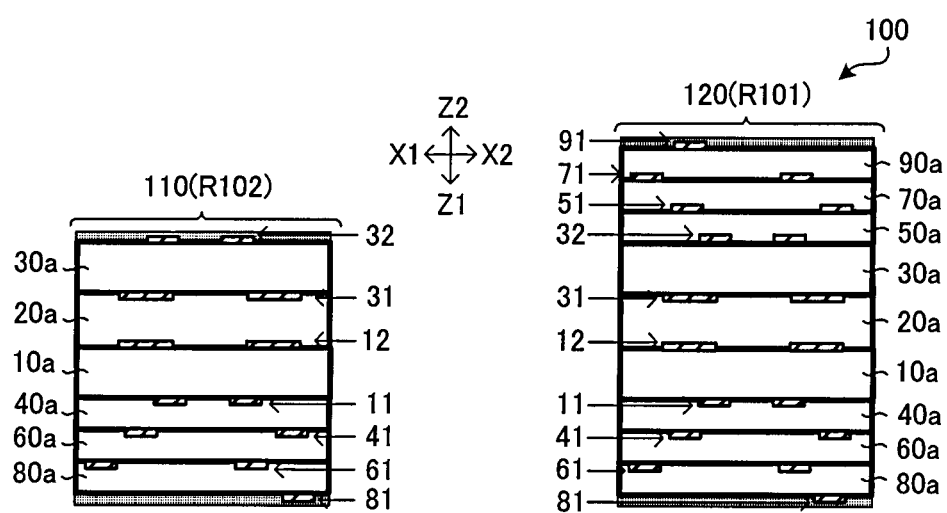
FIG. 46B is a cross-sectional view seen from the A-A line of FIG. 46A.

Rigid section 110 or 120 may contain multiple regions having a different number of layers from each other. For example, as shown in FIG. 46A and FIG. 46B (cross-sectional view seen from the (A-A) line in FIG. 46A), rigid section 110 may have nine-layered region (R101) and six-layered region (R102). Region (R102) having fewer layers than region (R101) may be formed by masking or the like so that more than a predetermined number of layers are not laminated. However, forming methods are not limited to the above, and the number of layers may be adjusted by removing the unnecessary layers after they are laminated.

Figure 47A:
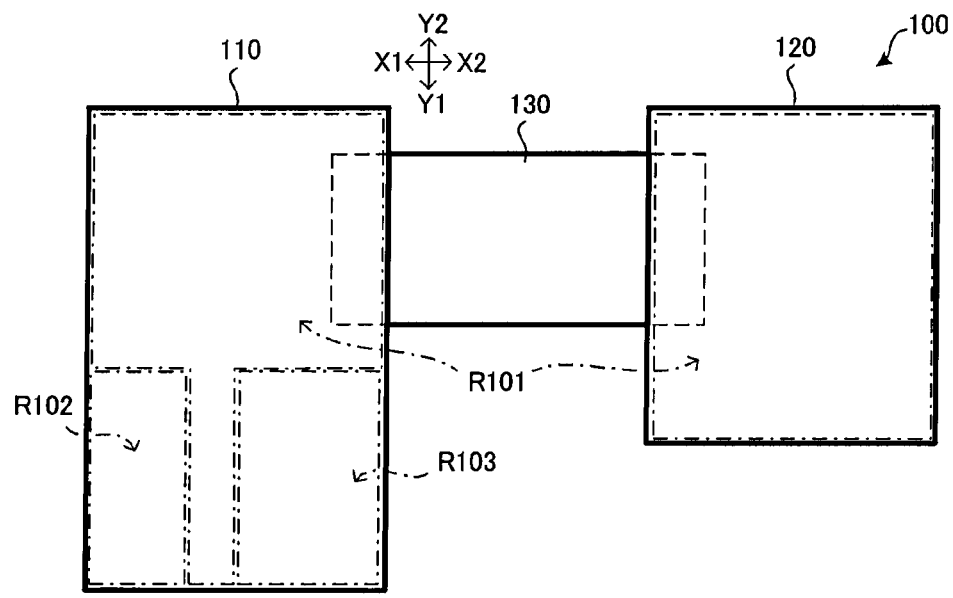
FIG. 47A is a view showing an example where a rigid section has three regions with different numbers of layers from each other.

At least either rigid section 110 or 120 may contain three or more regions having a different number of layers from each other. For example, as shown in FIG. 47A, rigid section 110 may contain three regions (R101-R103) having a different number of layers from each other.

Figure 47B:
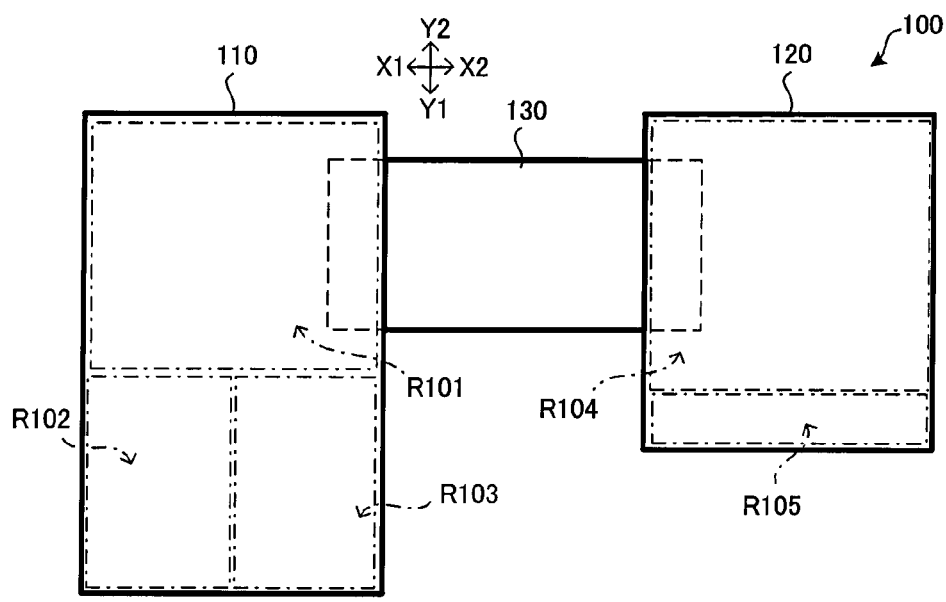
FIG. 47B is a view showing an example where two rigid sections each have multiple regions with different numbers of layers from each other.

Both rigid sections 110 and 120 may contain multiple regions having a different number of layers from each other. For example, as shown in FIG. 47B, rigid section 110 may contain three regions (R101-R103) having a different number of layers from each other, and rigid section 120 may contain two regions (R104, R105) having a different number of layers from each other.

In FIGS. 46A-47B, regions (R101-R105) each have a different number of layers from the other regions. If regions (R101-R105) are listed in order of the region with the most layers to the region with the fewest layers, the order is, for example, region (R101), region (R102), region (R103), region (R104) and region (R105) (region (R101)>region (R102)>region (R103)>region (R104)>region (R105)).

Flex-rigid wiring board 100 may contain electronic components and become an electronic device.

Figure 48:
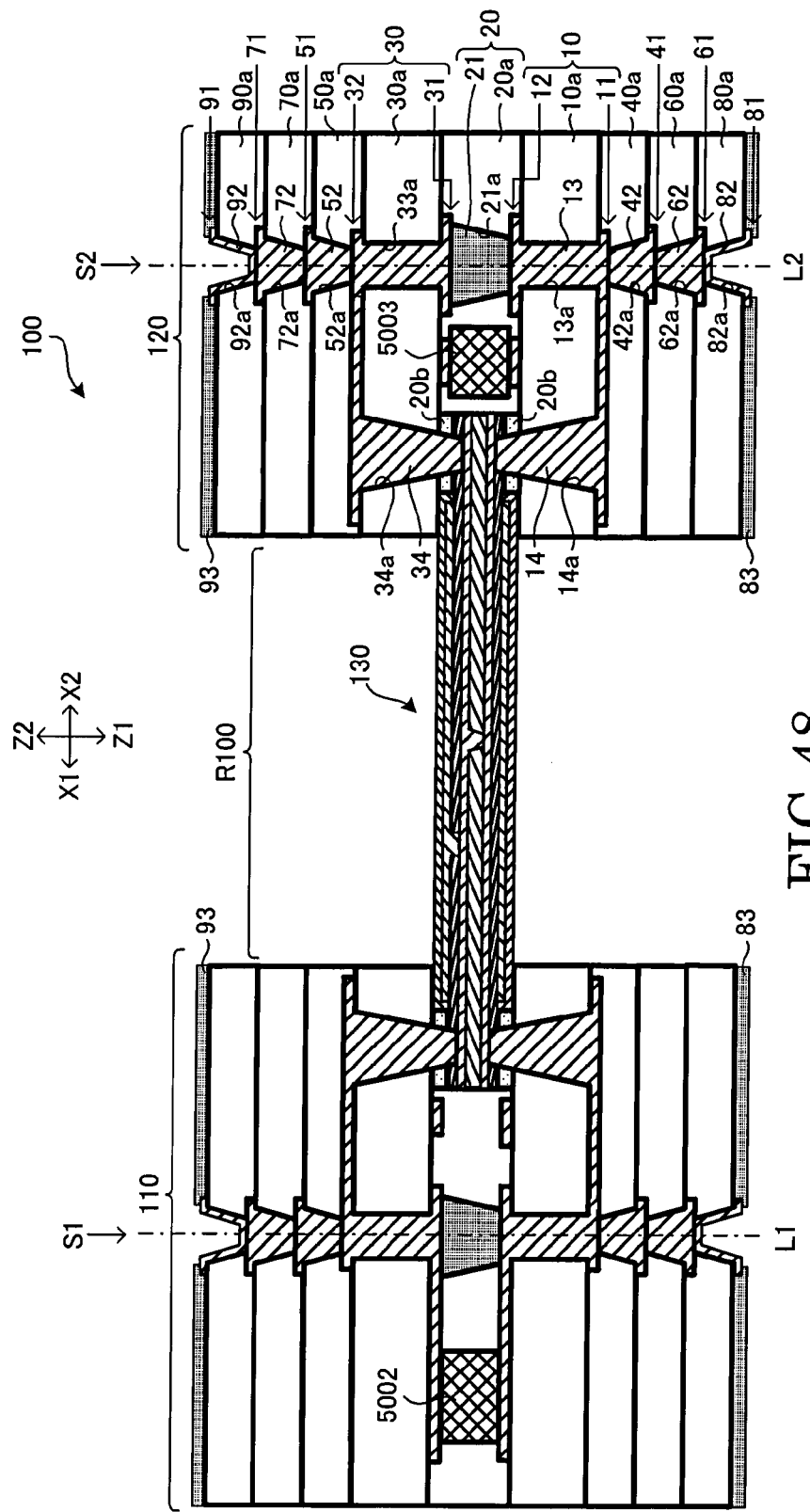
FIG. 48 is a view showing an example of a flex-rigid wiring board with built-in electronic components.

For example, as shown in FIG. 48, electronic component 5002 may be built in rigid section 110 and electronic component 5003 may be built in rigid section 120. In an example shown in FIG. 48, two electronic components (5002, 5003) are built into the board. However, the number of electronic components is not limited specifically. For example, rigid section 110 or 120 may have two or more built-in electronic components. Alternatively, an electronic component may be built into only either rigid section 110 or 120. Using flex-rigid wiring board 100 with built-in electronic components, the electronic device becomes highly functional.

Figure 49:
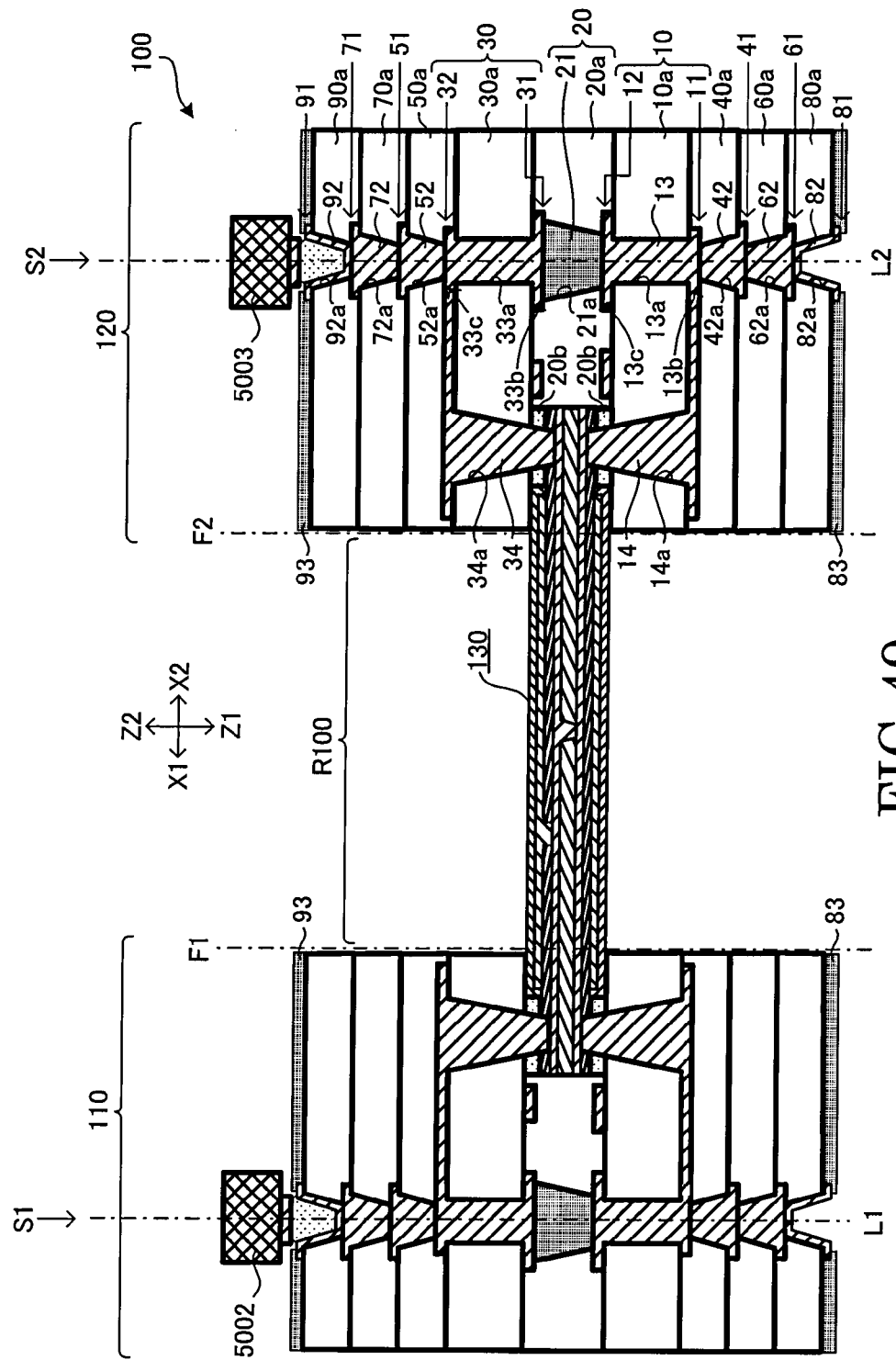
FIG. 49 is a view showing an example of a flex-rigid wiring board with electronic components mounted on a surface.

Alternatively, as shown in FIG. 49, for example, electronic component 5002 may be mounted on a surface of rigid section 110, and electronic component 5003 may be mounted on a surface of rigid section 120. In an example shown in FIG. 49, two electronic components (5002, 5003) are mounted. However, the number of electronic components is not limited specifically. For example, two or more electronic components may be mounted on rigid section 110 or 120. Alternatively, an electronic component may be mounted only on either rigid section 110 or 120.

The number of flexible wiring boards 130 is not limited specifically. For example, to enhance the bendability of flexible section (R100), it is effective if multiple flexible wiring boards are positioned so as to be detached from each other in lamination directions (directions Z) of insulation layers (10*a*, 20*a*, 30*a*), as shown in FIG. 50 or 51.

Figure 50:
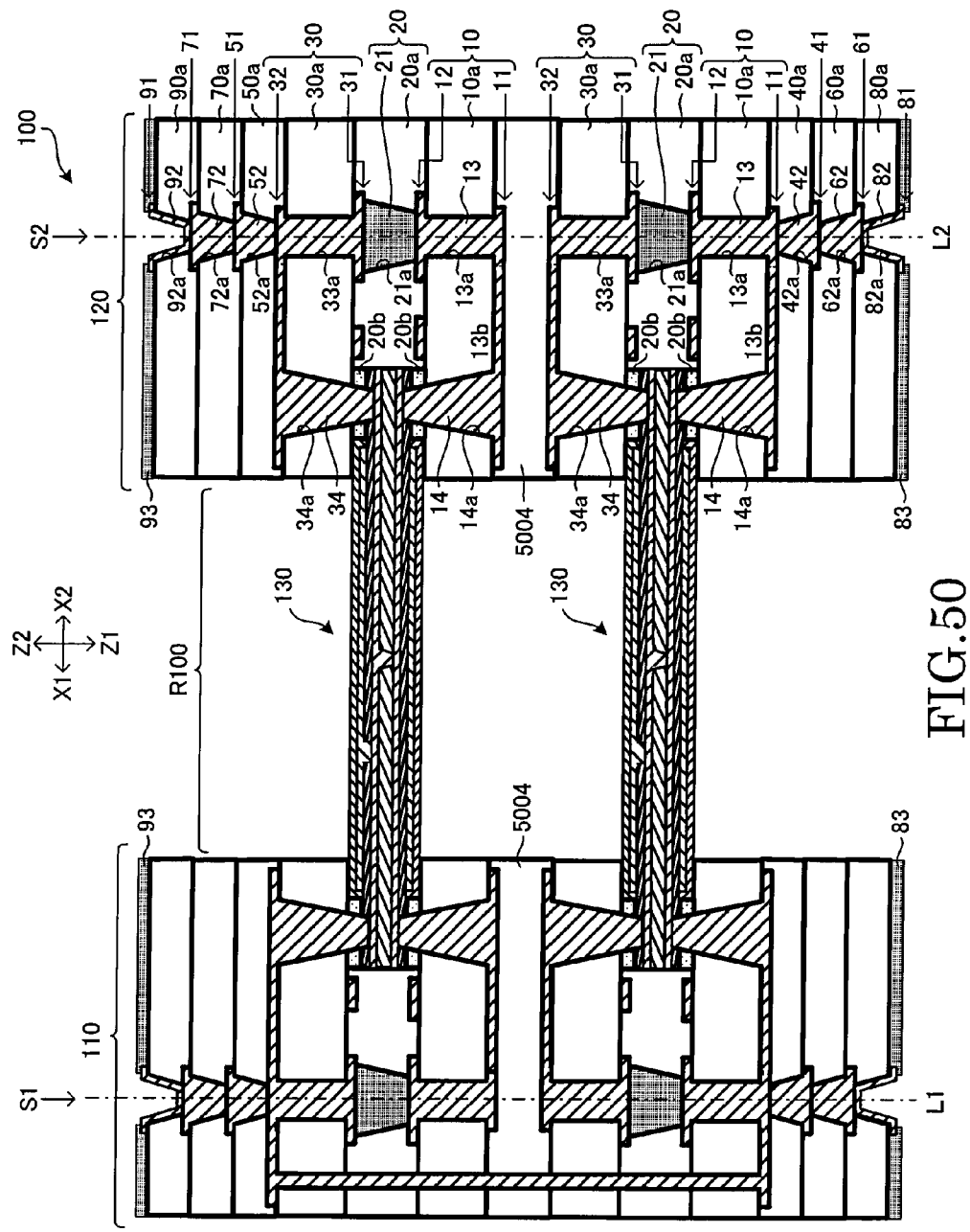
FIG. 50 is a view showing an example of a flex-rigid wiring board having two sets of core sections connected to flexible wiring boards.

In an example shown in FIG. 50, flex-rigid wiring board 100 has two sets of core sections (first substrate 10, second substrate 20 and third substrate 30) which are connected to flexible wiring boards 130. The two sets of core sections are connected by means of connection layers 5004. Then, multiple flexible wiring boards 130 are positioned so as to be detached from each other in lamination directions (directions Z). The material for connection layers 5004 is, for example, the same as the above-described interlayer insulation layers (insulation layers (40*a*) and so forth). Connection layers 5004 are formed by curing prepreg, for example.

Figure 51:
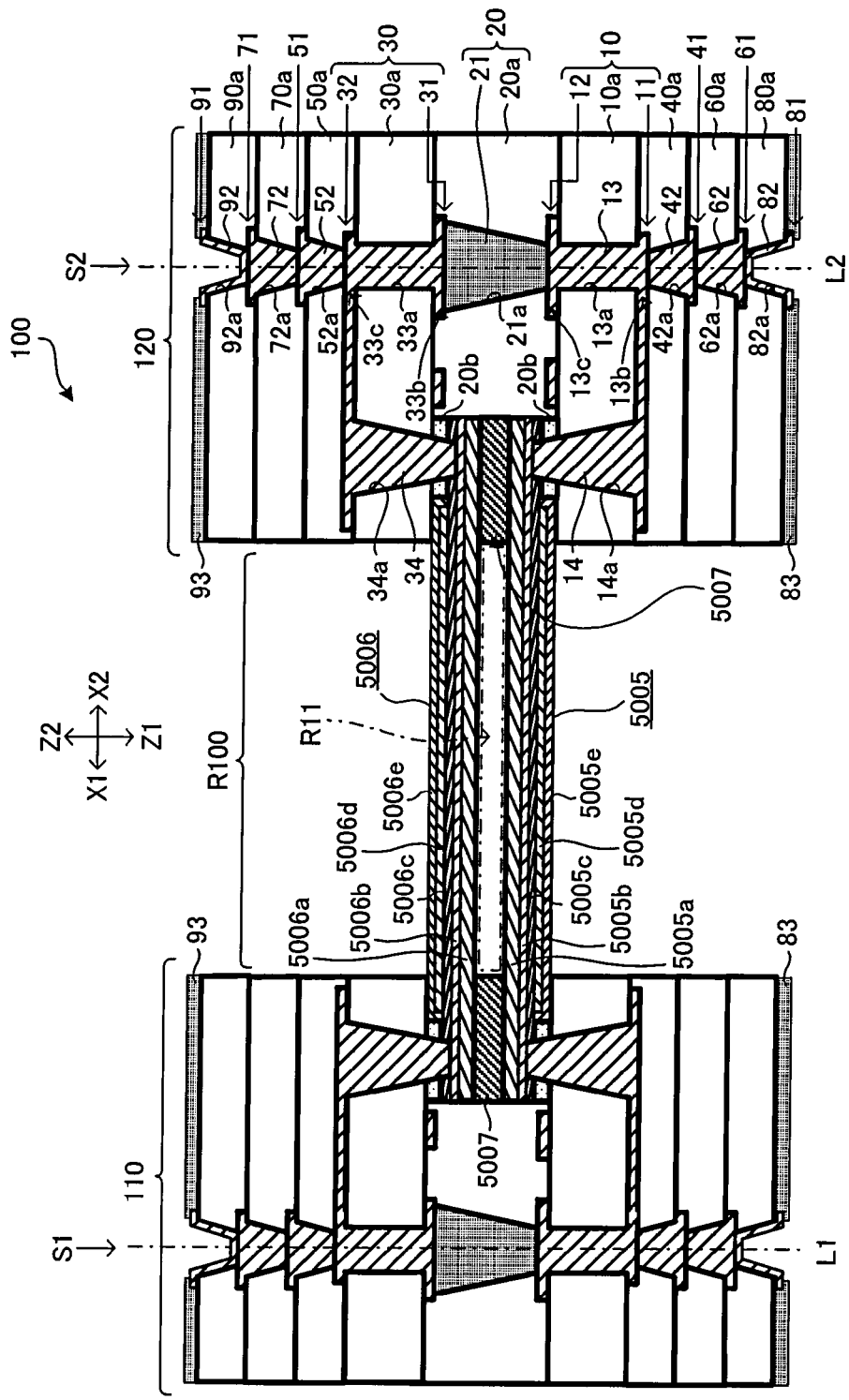
FIG. 51 is a view showing an example of a flex-rigid wiring board having two single-sided flexible wiring boards.

Alternatively, as shown in FIG. 51, for example, flex-rigid wiring board 100 may have two single-sided flexible wiring boards; flexible wiring board 5005 (first flexible wiring board) and flexible wiring board 5006 (second flexible wiring board). Flexible wiring board 5005 has flexible substrate (5005*a*), wiring layer (5005*b*), inner coverlay (5005*c*), shield layer (5005*d*) and outer coverlay (5005*e*). Flexible wiring board 5006 has flexible substrate (5006*a*), wiring layer (5006*b*), inner coverlay (5006*c*), shield layer (5006*d*) and outer coverlay (5006*e*). The material or the like for each member is the same as for flexible wiring board 130 as shown in FIG. 3, for example.

In an example shown in FIG. 51, flexible wiring board 5005 has wiring layer (5005*b*) on the first-surface side, and flexible wiring board 5006 has wiring layer (5006*b*) on the second-surface side. Then, the second-surface side of flexible wiring board 5005 and the first-surface side of flexible wiring board 5006 are physically connected by sandwiching bonding sheet 5007. Space (R11) sealed by bonding sheet 5007 is formed between flexible wiring board 5005 and flexible wiring board 5006. Space (R11) is formed to be a rectangular cuboid, for example. However, the shape, number, positioning and the like of space (R11) are not limited to the above and any other type may be employed (see later-described FIGS. 56A-56C).

In the following, a method for manufacturing flex-rigid wiring board 100 shown in FIG. 51 is described. First, two examples are shown in regard to a method for connecting flexible wiring board 5005 and flexible wiring board 5006.

Figure 52A:
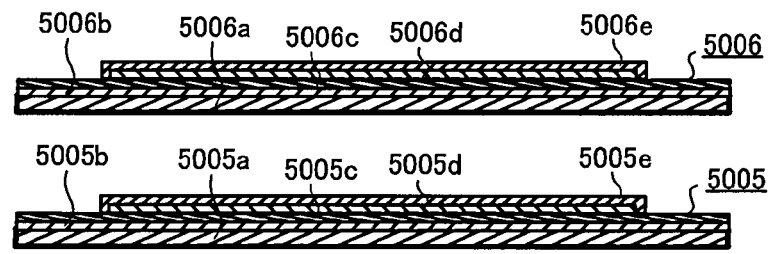
FIG. 52A is a view to illustrate a first step of a first method for connecting two single-sided flexible wiring boards.

In the first example, flexible wiring boards 5005 and 5006 are prepared as shown in FIG. 52A. Such flexible wiring boards 5005 and 5006 are manufactured by steps that correspond to those in FIGS. 11A-11E, for example.

Figure 52B:
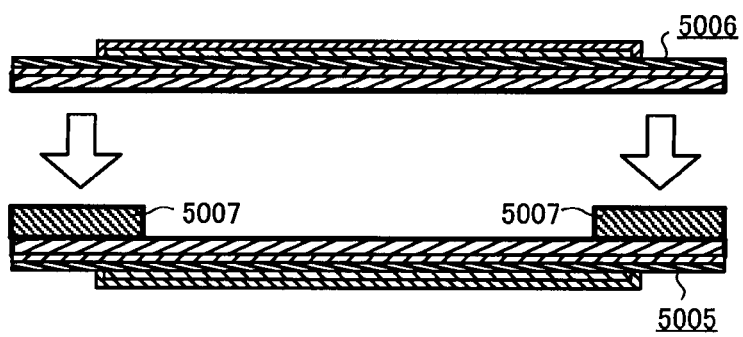
FIG. 52B is a view to illustrate a second step subsequent to the step in FIG. 52A.

Next, as shown in FIG. 52B, flexible wiring board 5005 and flexible wiring board 5006 are connected by means of bonding sheet 5007. In bonding sheet 5007, a hole corresponding to the shape of space (R11) is formed in advance.

Figure 53A:
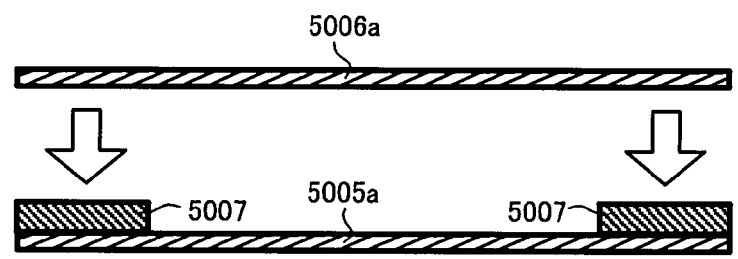
FIG. 53A is a view to illustrate a first step of a second method for connecting two single-sided flexible wiring boards.
Figure 53B:
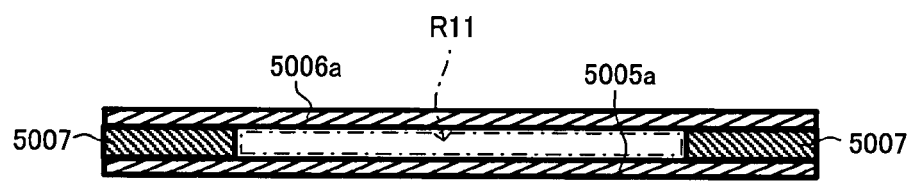
FIG. 53B is a view to illustrate a second step subsequent to the step in FIG. 53A.

On the other hand, in the second example, as shown in FIG. 53A, flexible substrates (5005*a*, 5006*a*) and bonding sheet 5007 are prepared, and flexible substrate (5005*a*) and flexible substrate (5006*a*) are connected by means of bonding sheet 5007 as shown in FIG. 53B. Then, flexible wiring boards 5005 and 5006 are manufactured by steps that correspond to those in FIGS. 11A-11E, for example.

Figure 54A:
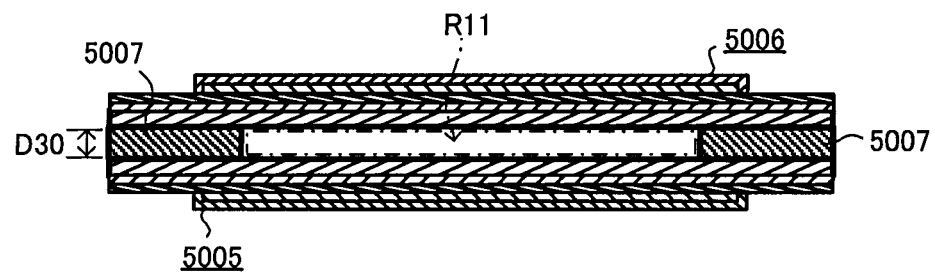
FIG. 54A is a view showing an example of a connected body of two single-sided flexible wiring boards.

A connected body of flexible wiring board 5005 and flexible wiring board 5006 may be manufactured as shown in FIG. 54A by employing either the above first example or the second example. Then, steps that correspond to those in FIGS. 12-27, for example, are conducted. In doing so, at both end portions of flexible wiring boards (5005, 5006), filled conductor 14 is connected to wiring layer (5005*b*) and filled conductor 34 is connected to wiring layer (5006*b*). Also, built-up sections, flexible section (R100) or the like are formed. As a result, flex-rigid wiring board 100 is completed as shown in FIG. 51.

It is thought that the bendability of flexible section (R100) is improved by positioning space (R11) between flexible wiring board 5005 and flexible wiring board 5006. Moreover, flexible section (R100) in an example shown in FIG. 51 is structured with two single-sided wiring boards (flexible wiring boards 5005 and 5006). Thus, flexible section (R100) is thinner than an example in which double-sided wiring boards are connected. As a result, it is thought that the bendability of flexible section (R100) is improved.

To improve bendability, height (D30) of space (R11) is preferred to be set at 2 mm or less. Height (D30) of space (R11) corresponds to the thickness of bonding sheet 5007.

Figure 54B:
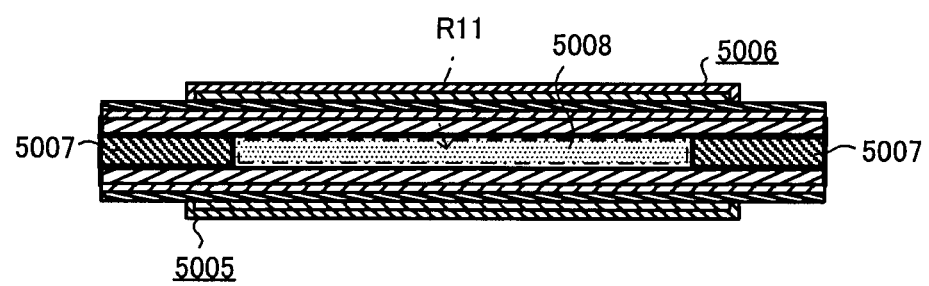
FIG. 54B is a view showing an example where filler is filled in the space arranged between two flexible wiring boards.

Gas such as air may be sealed in space (R11). However, when a heat cycle occurs during the manufacturing steps or the like, there is a concern that the quality of flex-rigid wiring board 100 may deteriorate due to the repeated expansion/contraction of the gas in space (R11). Therefore, it is preferred that the gas in space (R11) be eliminated through decompression, for example. Alternatively, as shown in FIG. 54B, by filling filler 5008 (such as gel) in space (R11), the gas in space (R11) may be eliminated.

Figure 55:
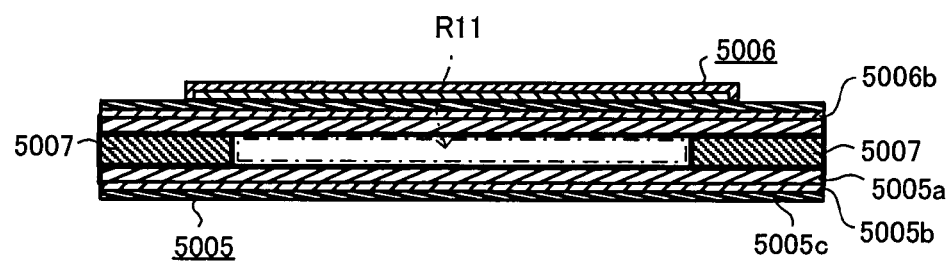
FIG. 55 is a view showing an example in which the conductive pattern on one of the two flexible wiring boards is made to be a full plain conductive pattern.

A conductive pattern of either flexible wiring board 5005 or 5006, for example, wiring layer (5005*b*) of flexible wiring board 5005, may be formed as a full plain conductive pattern (such as a full plain copper pattern) as shown in FIG. 55, and shield layer (5005*d*) and outer coverlay (5005*e*) may be omitted. In doing so, the flexible section becomes even thinner, and it is thought that the bendability of flexible section (R100) is further improved.

When a wiring pattern is formed only on one surface in a method shown in FIGS. (53A, 53B), conductive layers are formed on both surfaces and then the conductive layer on the side of wiring layer (5005*b*) is masked entirely using resist and the conductive layer on the side of wiring layer (5006*b*) is patterned using a lithographic technique, for example. Accordingly, wiring layer (5006*b*) is formed as a wiring pattern and wiring layer (5005*b*) is formed as a full plain conductive pattern.

Figure 56A:
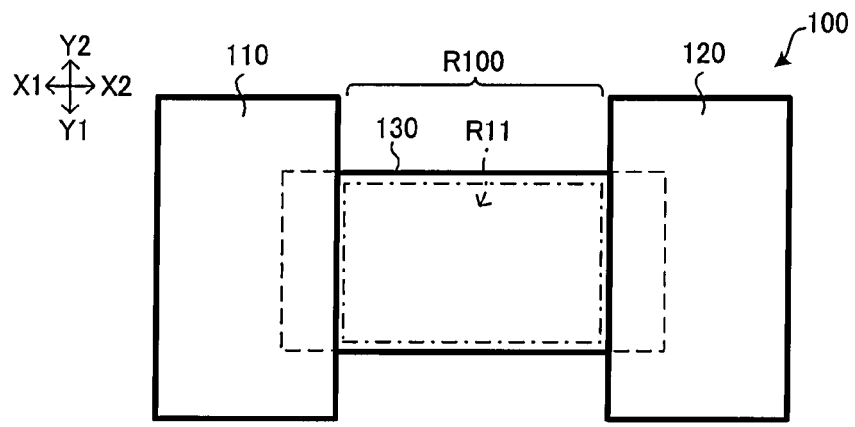
FIG. 56A is a view showing an example where the position of the space arranged between two flexible wiring boards is shown.
Figure 56B:
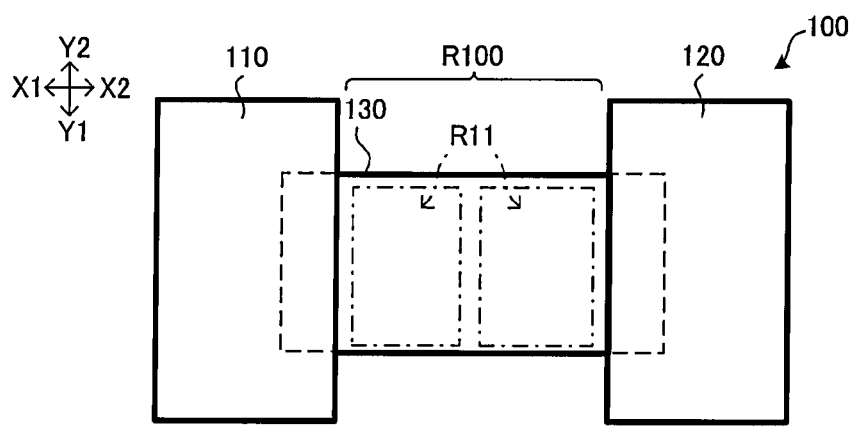
FIG. 56B is a view showing a first alternative example where the number of spaces arranged between two flexible wiring boards is modified.
Figure 56C:
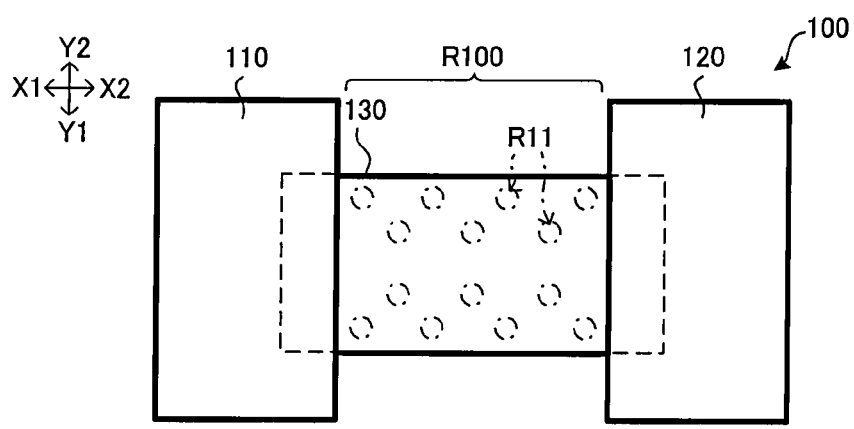
FIG. 56C is a view showing a second alternative example where the number of spaces arranged between two flexible wiring boards is modified.

It is preferred that space (R11) be positioned to extend entirely throughout flexible section (R100) as shown in FIG. 56A, for example. However, space (R11) is not limited to such, and may be positioned by being concentrated in required portions based on stress analysis or the like. The number of spaces (R11) is not limited to one, and multiple spaces may be formed. Namely, as shown in FIG. 56B, for example, two spaces (R11) may be formed, and as shown in FIG. 56C, for example, multiple spaces (R11) may also be formed. The shape of space (R11) is not limited to being a rectangular cuboid, and may be cylindrical as shown in FIG. 56C, for example. Basically, any shape, number, positioning and so forth may be employed for space (R11).

Figure 57:
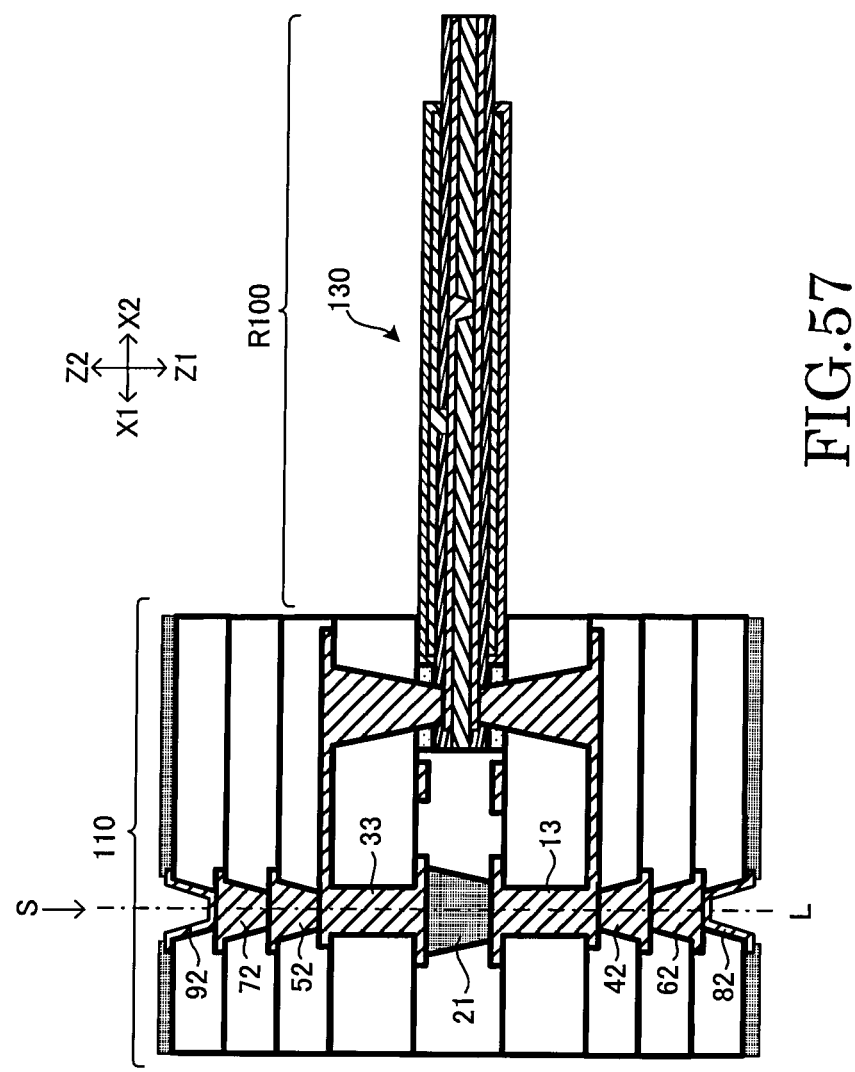
FIG. 57 is a view showing an example of a flying-tail structure.

As shown in FIG. 57, the present invention may be applied to a structure in which only one end of flexible wiring board 130 is connected to rigid section 110 and the other end is not connected to any, a so-called flying-tail structure. In a flying-tail structure, flexible wiring board 130 protrudes like a tail from rigid section 110.

Figure 58:
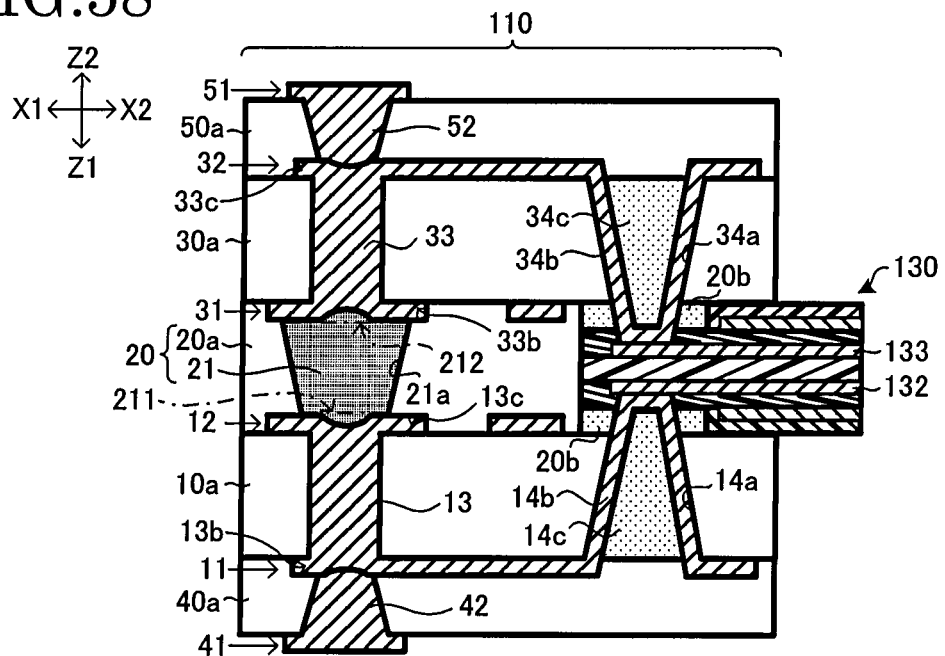
FIG. 58 is a view showing an example where connection conductors connected to conductive patterns in a flexible wiring board are made to be conformal conductors.

As shown in FIG. 58, connection conductors to be connected to conductive patterns (wiring layers 132, 133) of flexible wiring board 130 are not limited to filled conductors (14, 34), and may be conformal conductors (14b, 34b). In such a case, resin (14c) is filled in hole (14a) and resin (34c) is filled in hole (34a), for example.

Figure 59:
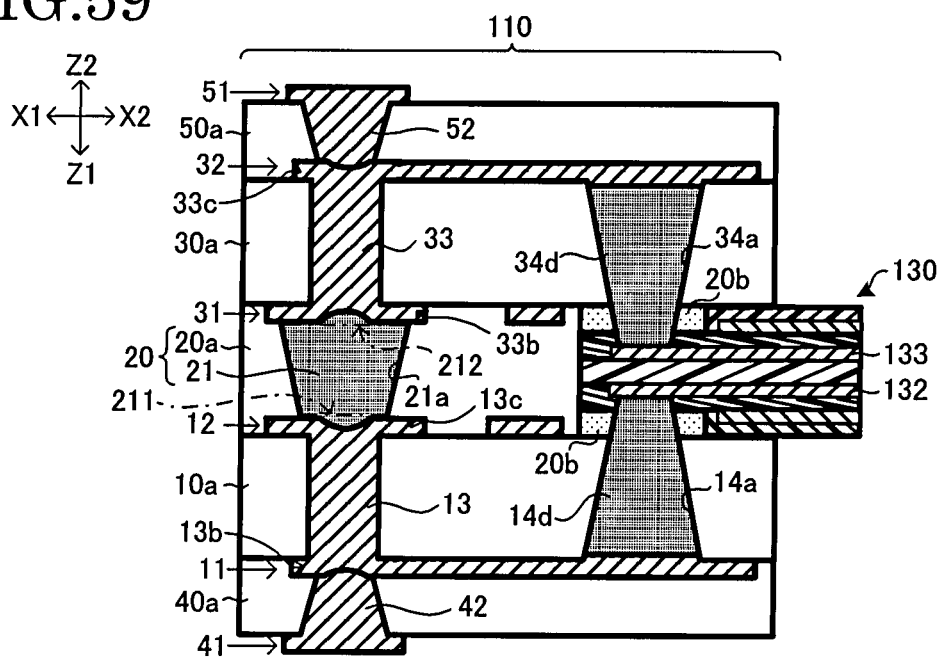
FIG. 59 is a view showing an example where connection conductors connected to conductive patterns in a flexible wiring board are made of conductive paste.

Connection conductors for electrically connecting conductive patterns (wiring layers 132, 133) of flexible wiring board 130 and conductive patterns of rigid section 110 or 120 may be connection conductors (14d, 34d) made of conductive paste, as shown in FIG. 59. Connection conductors (14d, 34d) may also be filled conductors or conformal conductors.

Figure 60A:
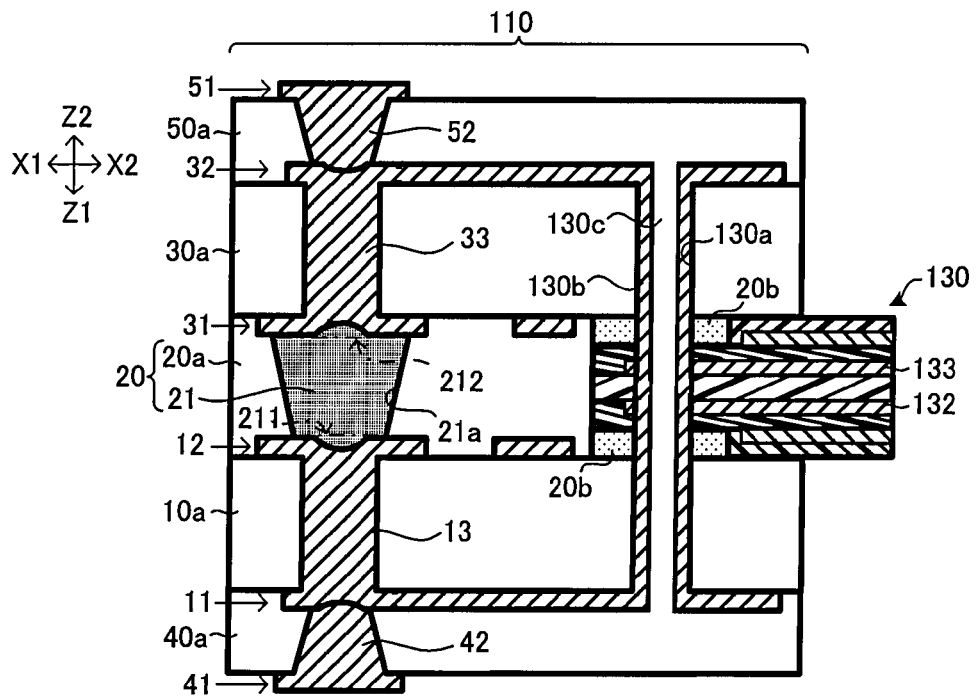
FIG. 60A is a view showing a first example where a connection conductor connected to conductive patterns in a flexible wiring board is the conductor in a through hole.
Figure 60B:
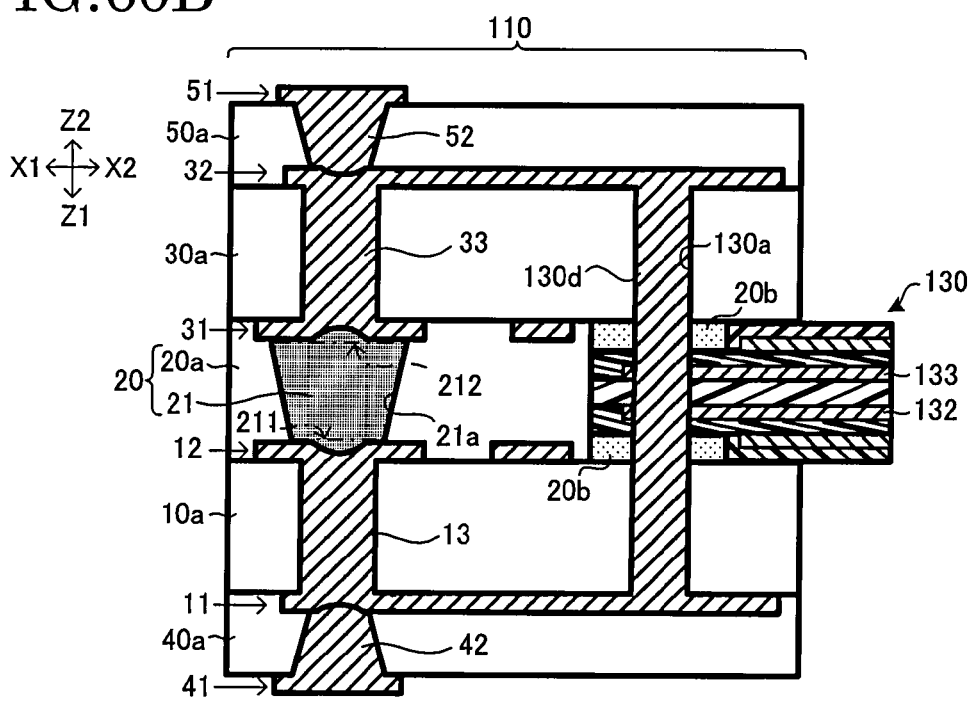
FIG. 60B is a view showing a second example where a connection conductor connected to conductive patterns in a flexible wiring board is the conductor in a through hole.

As shown in FIGS. 60A and 60B, conductive patterns (wiring layers 132, 133) of flexible wiring board 130 and conductive patterns (wiring layers 11, 32) of rigid sections (110, 120) may be electrically connected to each other by conductor (130b) or (130d) in through hole (130a) which penetrates through insulation layer (30a), flexible wiring board 130 and insulation layer (10a). Conductor (130b) shown in FIG. 60A is a conformal conductor. Namely, conductor (130b) is formed on the wall surface of through hole (130a), and resin (130c) is filled inside. On the other hand, conductor (130d) shown in FIG. 60B is a filled conductor. Namely, conductor (130d) is filled in through hole (130a). In those examples, wiring layers (11, 32, 132, 133) are electrically connected by means of conductor (130b) or (130d). If such a connection method is employed, manufacturing flex-rigid wiring board 100 becomes easier. Through hole (130a) may penetrate through rigid section 110 or 120.

Figure 61A:
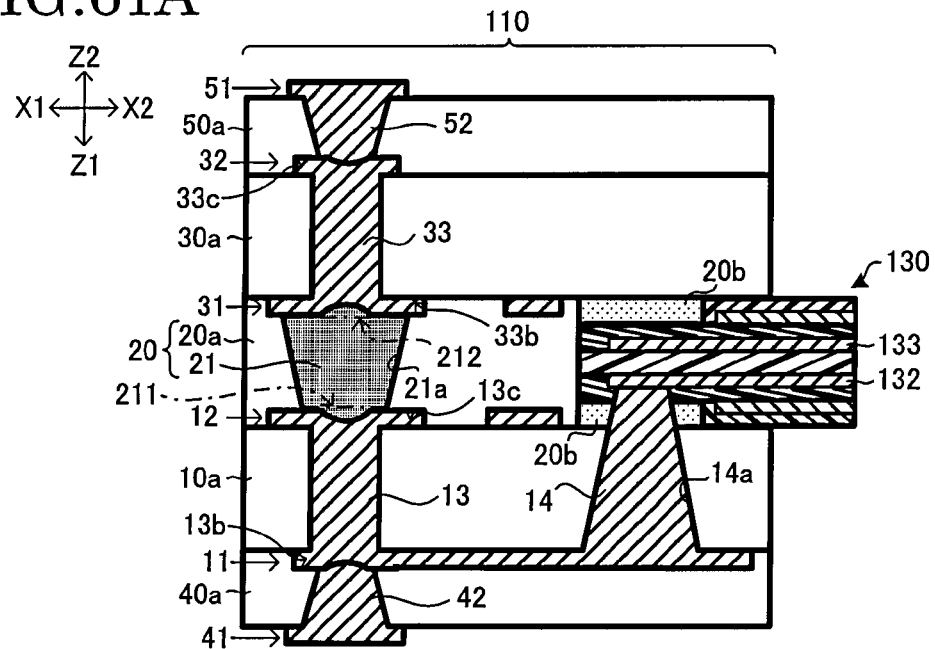
FIG. 61A is a view showing a first example where only either of the wiring layers formed on both surfaces of a flexible wiring board is electrically connected to conductive patterns in a rigid wiring board.
Figure 61B:
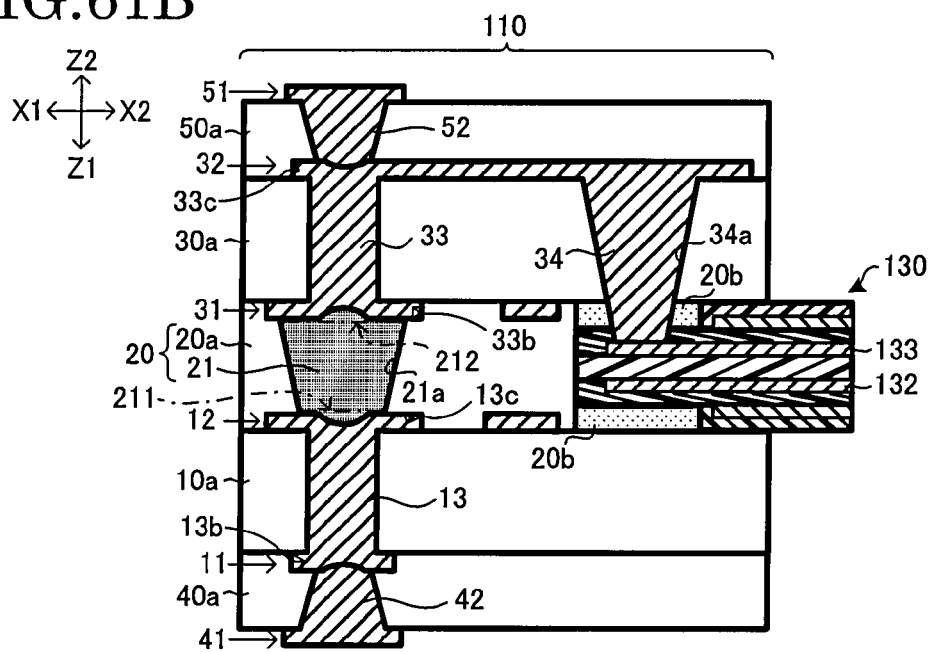
FIG. 61B is a view showing a second example where only either of the wiring layers formed on both surfaces of a flexible wiring board is electrically connected to conductive patterns in a rigid wiring board.

As shown in FIGS. 61A and 61B, only either wiring layer 132 or 133 may be electrically connected to conductive patterns (wiring layers 11, 32) of rigid sections (110, 120). In an example in FIG. 61A, wiring layer 132 and wiring layer 11 are connected by means of filled conductor 14. In an example in FIG. 61B, wiring layer 133 and wiring layer 32 are connected by means of filled conductor 34.

Figure 62:
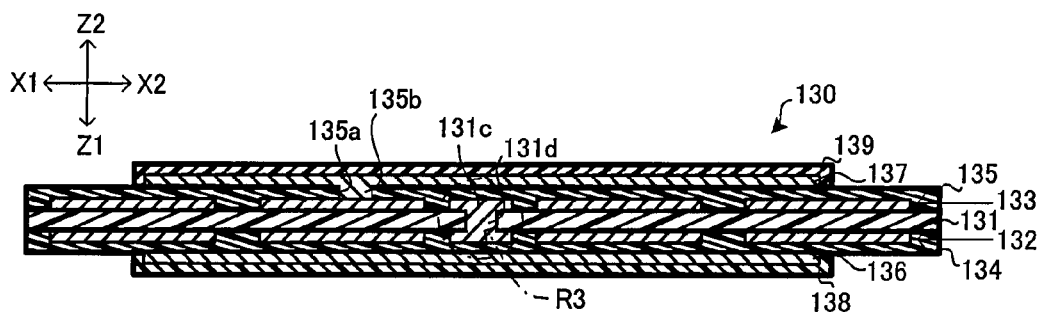
FIG. 62 is a view showing an example of a flexible wiring board where a through hole is formed in a flexible substrate.

As shown in FIG. 62, through hole (131c) may be formed in flexible substrate 131. Through hole (131c) penetrates through flexible substrate 131. A magnified view of region (R3) in FIG. 62 is shown in FIG. 63A.

Figure 63A:
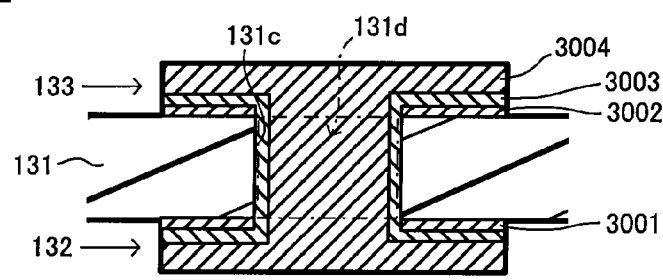
FIG. 63A is a magnified view showing part of the region in FIG. 62.

In an example shown in FIG. 63A, conductor (131d) is filled in through hole (131c). On the first and second surfaces of flexible substrate 131, copper foil 3001 or 3002, electroless plating 3003 and electrolytic plating 3004 are laminated respectively in that order from the lower layer toward the upper layer. Accordingly, wiring layer 132 is formed with copper foil 3001, electroless plating 3003 and electrolytic plating 3004. Also, wiring layer 133 is formed with copper foil 3002, electroless plating 3003 and electrolytic plating 3004, and conductor (131d) is formed with electroless plating 3003 and electrolytic plating 3004. Flexible substrate 131 is made of polyimide, for example. Wiring layers (132, 133), electroless plating 3003 and electrolytic plating 3004 are made of copper, for example.

Wiring layer 132, conductor (131d) in through hole (131c) and wiring layer 133 are formed to be contiguous from the first-surface side of flexible substrate 131 toward the second-surface side. Wiring layer 132 and wiring layer 133 are connected by a junction conductor (131d). Accordingly, a cylinder (conductor 131d) which connects wiring layer 132 and wiring layer 133 is formed in flexible substrate 131. It is thought that wiring layers (132, 133) are secured through the pinning effect of the cylinder and that stability is enhanced in wiring layers (132, 133) formed on the upper and lower surfaces of flexible substrate 131, which has flexibility. In addition, as a result, it is also thought that the positioning stability of the F-R connection sections is improved, leading to enhanced connection reliability.

Figure 63B:
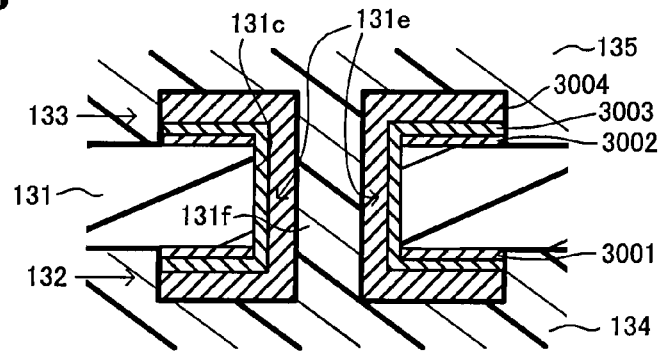
FIG. 63B is a view showing an example where the conductor in a through hole formed in a flexible substrate is a conformal conductor.

As shown in FIG. 63B, conformal conductor (conductor 131e) may be used instead of filled conductor (conductor 131d) to obtain the same structure as above. In an example in FIG. 63B, conductor (131e) is formed on the wall surface of through hole (131c). Conductor (131e) is formed with electroless plating 3003 and electrolytic plating 3004. In such a case, resin (131f), for example, is filled inside conductor (131e). Resin (131f) is filled by the material of inner coverlay 134 or 135, for example, flowing into through hole (131c).

Figure 63C:
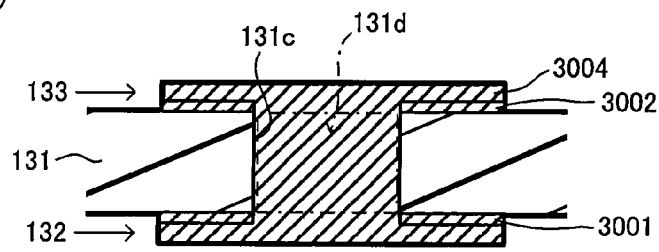
FIG. 63C is a view showing an example where the conductor in a through hole formed in a flexible substrate is made only of electrolytic plating.

If adhesiveness is achieved between electrolytic plating 3004 and flexible substrate 131, electroless plating 3003 may be omitted as shown in FIG. 63C. Alternatively, unless required, copper foils (3001, 3002) may be omitted as well.

Figure 64A:
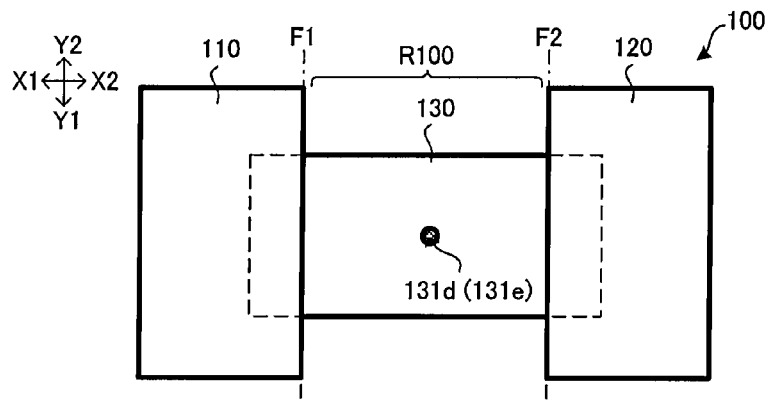
FIG. 64A is a view showing a first example of the position of a through hole formed in a flexible substrate.
Figure 64B:
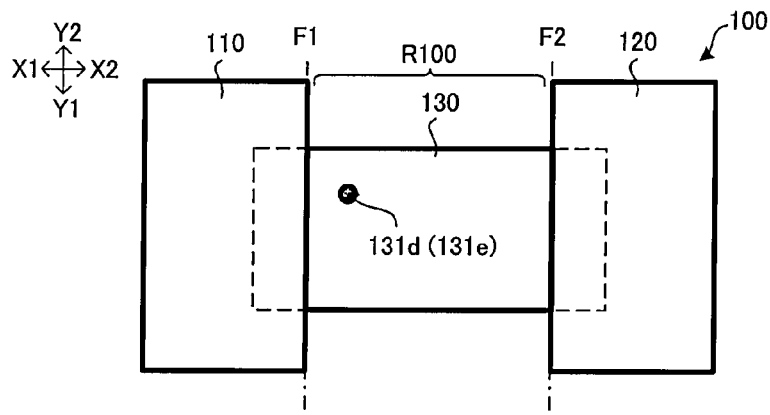
FIG. 64B is a view showing a second example of the position of a through hole formed in a flexible substrate.

As shown in FIG. 64A, for example, it is preferred that conductor (131d) or (131e) be positioned midway between rigid section 110 and rigid section 120. However, as shown in FIG. 64B, it may also be positioned closer to either rigid section 110 or 120. As shown in FIGS. 64A, 64B), it is preferred that conductor (131d) or (131e) be positioned in flexible section (R100). However, conductor (131d) or (131e) is not limited to such positioning, and may be positioned on the side of rigid section 110 at boundary surface (F1) or on the side of rigid section 120 at boundary surface (F2).

Figure 65:
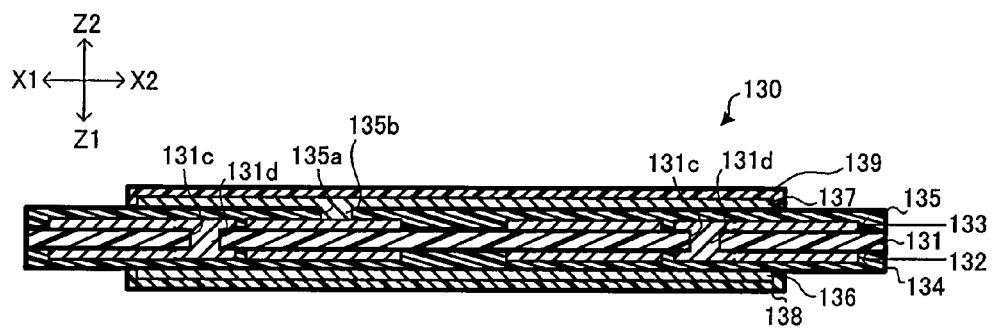
FIG. 65 is a view showing an example where the number of conductors in through holes formed in a flexible substrate is greater than one.

The number of conductors (131d) or (131e) is not limited specifically. For example, as shown in FIG. 65, flexible wiring board 130 may have multiple (such as two) conductors (131d). In the same manner, flexible wiring board 130 may have multiple (such as two) conductors (131e).

In the following, a method is described for manufacturing flexible wiring board 130 as shown in FIGS. 62 and 63A.

Figure 66A:
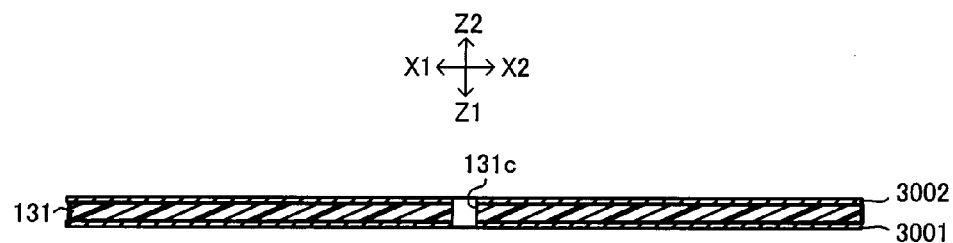
FIG. 66A is a view to illustrate a first step of the method for manufacturing a flexible wiring board shown in FIGS. 62 and 63A.

First, a double-sided copper-clad laminate (starting material) is prepared the same as in the step previously described with reference to FIG. 11A. Then, as shown in FIG. 66A, through hole (131c) is formed in the double-sided copper-clad laminate by a laser, for example.

Figure 66B:
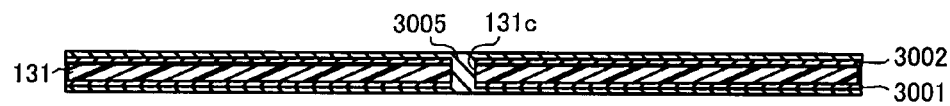
FIG. 66B is a view to illustrate a second step subsequent to the step in FIG. 66A.

Next, as shown in FIG. 66B, plating 3005 is formed by copper panel plating, for example. Specifically, electroless plating and electrolytic plating are performed in that order to form plating 3005 made with electroless plating 3003 and electrolytic plating 3004 (see FIG. 63A). During that time, to enhance the adhesiveness of the plating, surface treatment or the like may be conducted if required.

When flexible wiring board 130 shown in FIG. 63B is manufactured, plating 3005 is formed only on the wall surface of through hole (131c) by performing electroless plating and electrolytic plating. Also, when flexible wiring board 130 shown in FIG. 63C is manufactured, plating 3005 made of electrolytic plating 3004 is formed by performing electrolytic plating.

Figure 66C:
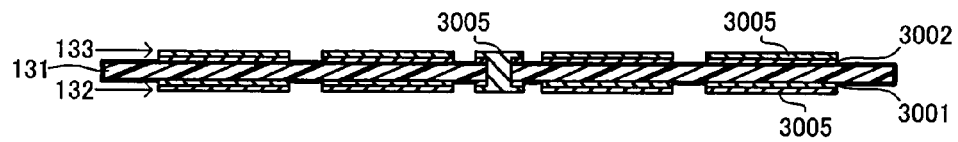
FIG. 66C is a view to illustrate a third step subsequent to the step in FIG. 66B.

Next, as shown in FIG. 66C, conductive layers on both surfaces of flexible substrate 131 are patterned by a lithographic technique, for example. Accordingly, wiring layers (132, 133) are formed.

Then, using the same steps as previously described with reference to FIGS. 11C-11E, for example, inner coverlays (134, 135), shield layers (136, 137) and outer coverlays (138, 139) are formed. Accordingly, flexible wiring board 130 is completed.

Basically, flexible wiring board 130 may be formed freely. For example, as shown in FIGS. 67A-67C, the width of flexible wiring board 130 may be partially enlarged.

Figure 67A:
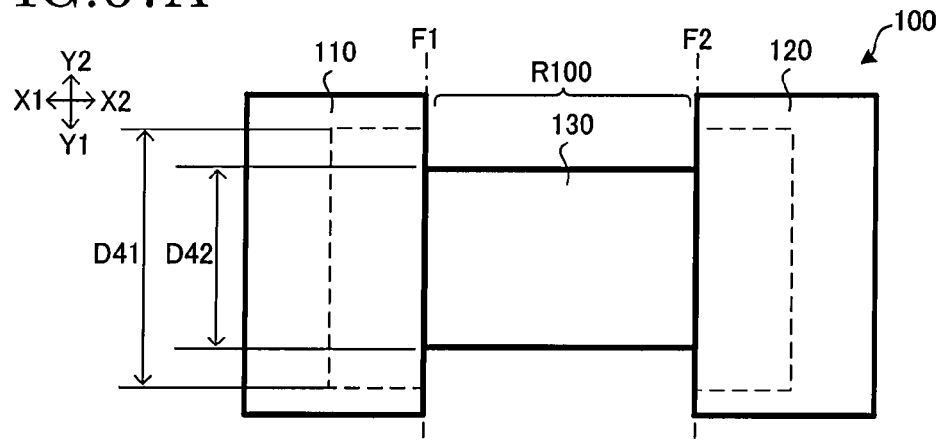
FIG. 67A is a view showing a first example where the width of a flexible wiring board is partially enlarged.

In an example shown in FIG. 67A, when flexible wiring board 130 is divided into two regions at the boundary (boundary surface F1 or F2) between rigid section 110 or 120 and flexible section (R100), width (D41) in the region of rigid section 110 or 120 (the portion where flexible wiring board 130 is inserted into rigid section 110 or 120) is set greater than width (D42) of the region on the side of flexible section (R100) (D41>D42). Accordingly, the connection area increases between flexible wiring board 130 and rigid section 110 or 120. As a result, connection reliability is enhanced at the F-R connection sections. If width (D41) or (D42) is not constant (for example, see FIGS. 67B and 67C), which width is greater may be determined by a comparison of their average values.

Figure 67B:
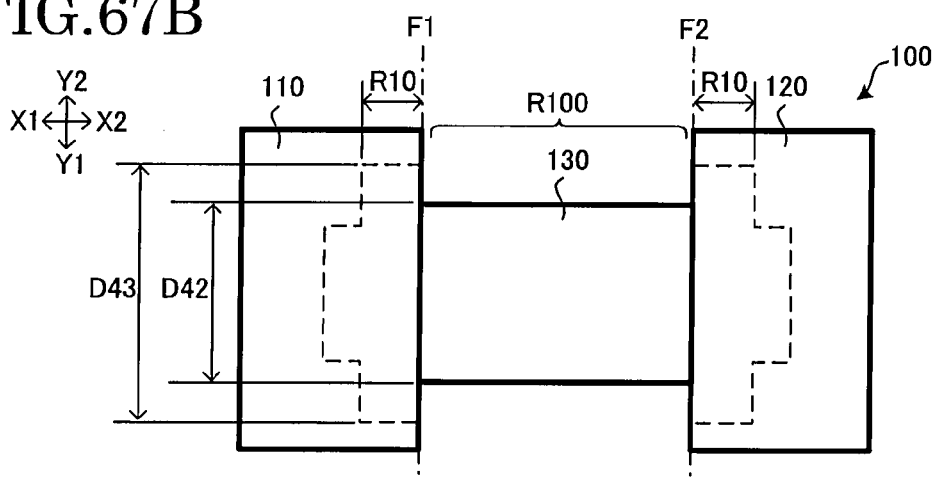
FIG. 67B is a view showing a second example where the width of a flexible wiring board is partially enlarged.

Alternatively, as shown in FIG. 67B, the width of flexible wiring board 130 may be enlarged at region (R10) (see also FIG. 4) where rigid section 110 or 120 and flexible wiring board 130 are laminated and connected. In such an example, width (D43) of region (R10) is set greater than width (D42) of flexible section (R100) (D43>D42). It is thought that such a structure also enhances connection reliability at the F-R connection sections the same as in the example shown in FIG. 67A.

Figure 67C:
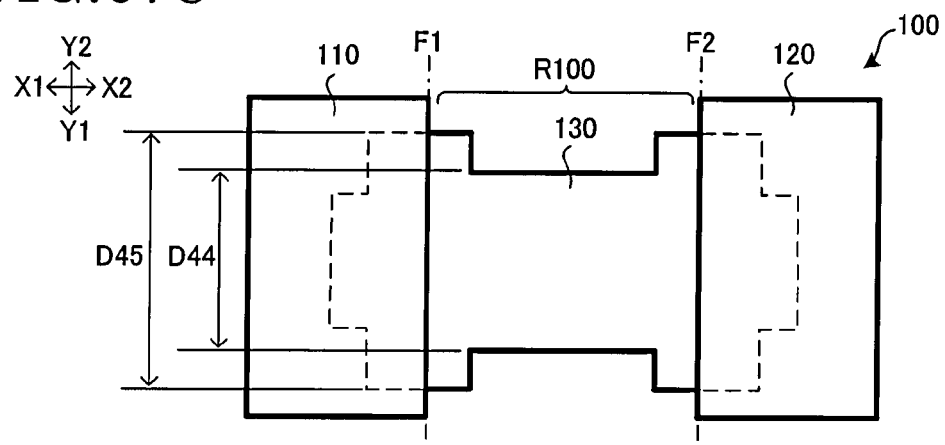
FIG. 67C is a view showing a third example where the width of a flexible wiring board is partially enlarged.

Alternatively, as shown in FIG. 67C, the width of flexible wiring board 130 may also be enlarged around the boundary (boundary surface F1 or F2) between rigid section 110 or 120 and flexible section (R100). In such an example, the width of flexible wiring board 130 is enlarged near the boundary from (D44) to (D45) (D45>D44). It is thought that such a structure also enhances connection reliability at the F-R connection sections the same as in the example shown in FIG. 67A.

Figure 68A:
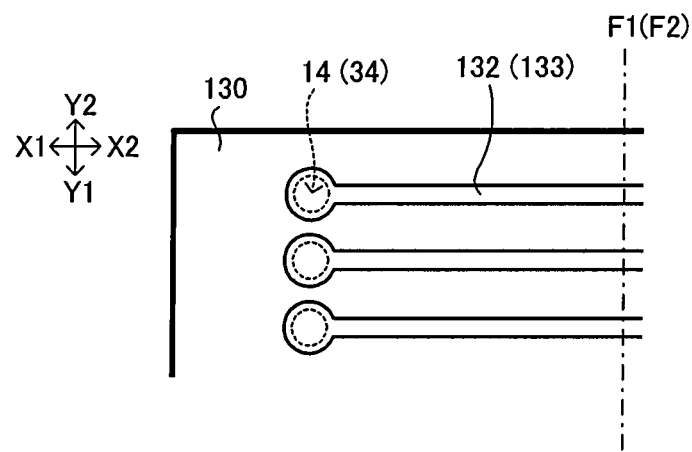
FIG. 68A is a view showing an example where wiring layers at the F-R connection sections are formed straight.
Figure 68B:
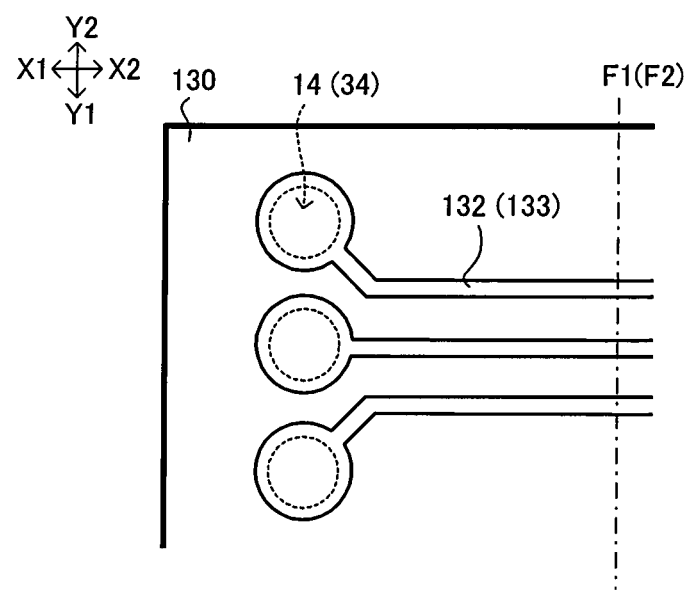
FIG. 68B is a view showing an example where wiring layers are formed to fan out at the F-R connection sections.

Basically, conductive patterns (wiring layers 132, 133) of flexible wiring board 130 may be formed freely. Therefore, wiring layers (132, 133) at the F-R connection sections may be formed straight as shown in FIG. 68A. However, to enhance connection reliability at the F-R connection sections, as shown in FIG. 68B, for example, it is preferred that wiring layers (132, 133) be formed to fan out at the F-R connection sections, namely, that terminal pitches be formed to fan out. By setting so, the distance between adjacent wiring lines is secured and interference between wiring lines is suppressed. Accordingly, widths of filled conductors (14, 34) may be enlarged. If widths of filled conductors (14, 34) are enlarged, the connection area between flexible wiring board 130 and rigid section 110 or 120 increases. As a result, connection reliability is enhanced at the F-R connection sections.

Regarding other factors, structures of rigid sections (110, 120), flexible wiring board 130 or the like, as well as type, performance, size, quality, shape, number of layers, positioning and so forth of the elements of such structures, may be modified freely within a scope that does not deviate from the gist of the present invention.

The number of layers in rigid sections (110, 120) and flexible wiring board 130 is not limited specifically. For example, to achieve high functionality, they may be formed to be further multilayered wiring boards. Alternatively, they may be formed as a wiring board with fewer layers (for example, only with first substrate 10, second substrate 20 and third substrate 30). Yet alternatively, the number of layers on each surface (first surface, second surface) of the core section may be different. Alternatively still, layers (wiring layers and insulation layers) may be formed (laminated) on only one surface of the core section.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluoro resin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each wiring layer and each insulation layer may be formed with multiple layers having different materials.

Flexible wiring board 130 may have a conductive pattern (wiring layer 132 or 133) only on one surface.

The conductors formed in the holes in built-up sections may be filled conductors or conformal conductors. However, to secure wiring space, filled conductors are preferred.

It is not always required that cavities (13*e*, 13*f*, 33*e*, 33*f*) be formed.

The steps in the above embodiments are not limited to the order and contents shown in the flowchart in FIG. 6 or FIG. 29. The order and contents may be modified freely within a scope that does not deviate from the gist of the present invention. Also, unnecessary steps may be omitted according to usage requirements or the like.

For example, by forming connection conductors (filled conductors 14, 34) before conducting thermal pressing (such as a step in FIG. 14) for making filled conductors electrically continuous with each other, insulation layer (40*a*), first substrate 10, second substrate 20, third substrate 30 and insulation layer (50*a*) may be pressed all at once.

Figure 69:
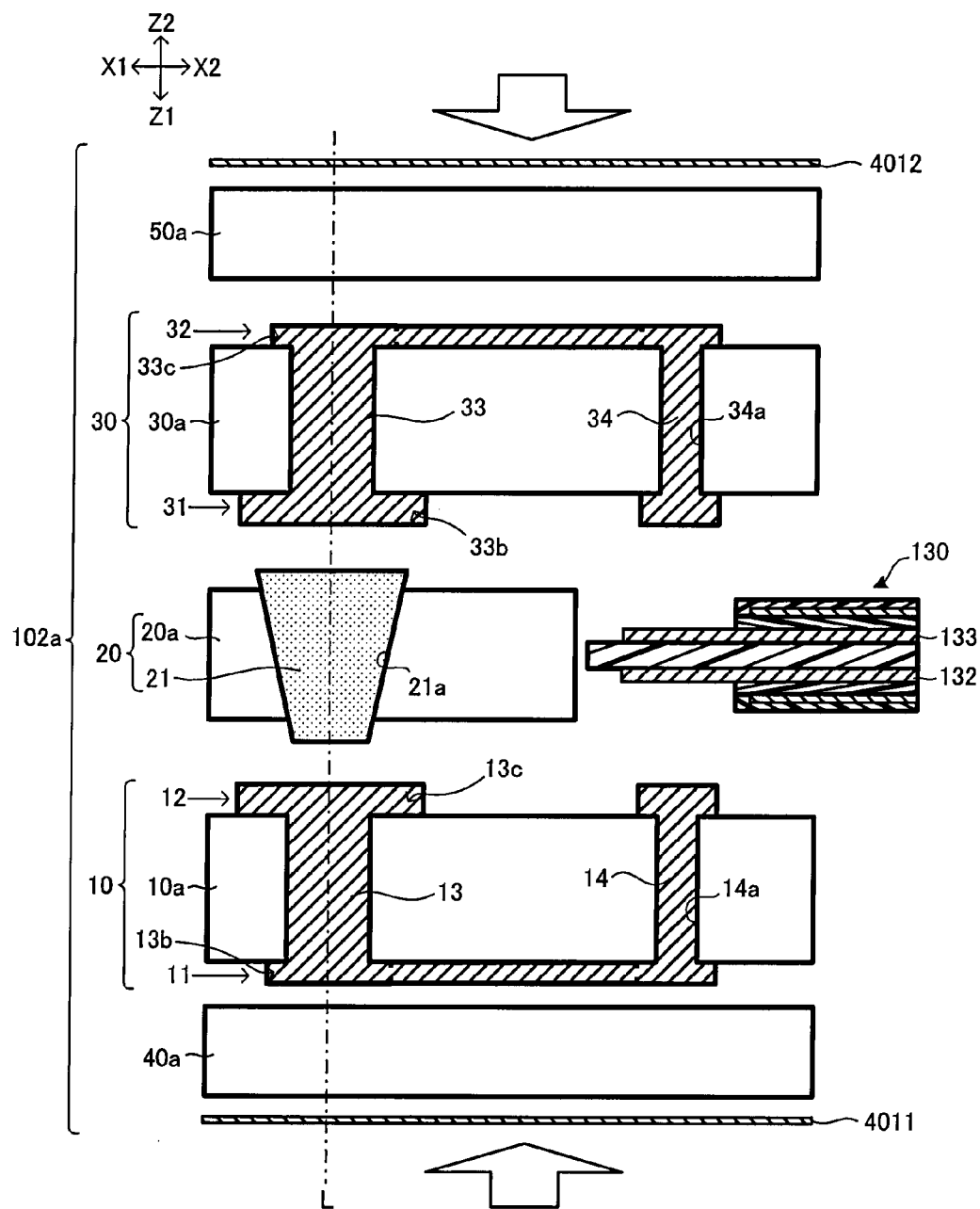
FIG. 69 is a view to illustrate a first step of another example of a method for manufacturing a flex-rigid wiring board.

For example, prior to thermal pressing, members such as those shown in FIG. 69 are prepared. Wiring layers (132, 133) in flexible wiring board 130 are exposed at the end portions of flexible wiring board 130. Also, filled conductor 14 is formed in insulation layer (10*a*), and filled conductor 34 is formed in insulation layer (30*a*). Such filled conductors (14, 34) are formed at the same time as filled conductor 13 or 33 in the steps shown in FIGS. 9B and 9C, for example. Filled conductors (14, 34) are formed as cylinders, for example. However, they are not limited to being formed as such.

Using above first substrate 10, third substrate 30, flexible wiring board 130 and so forth, as shown in FIG. 69, copper foil 4011, insulation layer (40*a*), first substrate 10, second substrate 20, flexible wiring board 130, third substrate 30, insulation layer (50*a*) and copper foil 4012 are laminated in such a way that filled conductors (13, 21, 33) are positioned along the same axis (axis L). Insulation layer (20*a*) is sandwiched by insulation layer (10*a*) and insulation layer (30*a*), and they are further sandwiched by insulation layers (40*a*) and (50*a*). In doing so, laminated body (102*a*) is formed. The material, degree of curing, thermal expansion coefficient and so forth of each member at this stage (prior to pressing) is the same as in the above first embodiment, for example.

Figure 70:
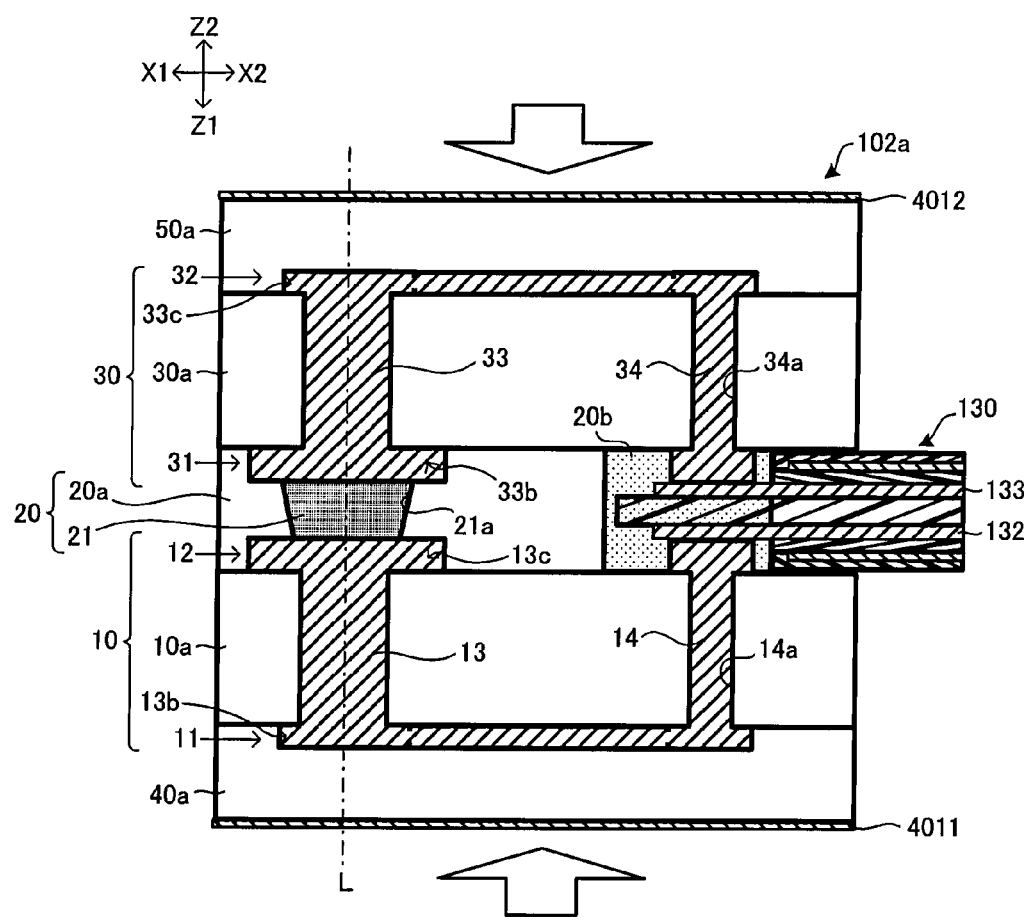
FIG. 70 is a view to illustrate a second step subsequent to the step in FIG. 69.

Next, as shown in FIG. 70, the above laminated body (102*a*) is thermal pressed all at once. Namely, pressing and heating are carried out simultaneously. If required, it is preferred to apply in advance conductive paste to the tip of filled conductor 14 (wiring layer 12) and the tip of filled conductor 34 (wiring layer 31) or to perform solder plating on them. In doing so, it is thought that connection reliability is enhanced between filled conductor 14 or 34 and wiring layer 132 or 133.

Prepreg (insulation layer (20*a*) or the like) is cured and adhered to adjacent members by such pressing and heating. As a result, laminated body (102*a*) is integrated. Adjacent filled conductors are adhered to (touching) each other, and filled conductors (13, 21, 33) become electrically continuous with each other. Furthermore, wiring layer 132 and filled conductor 14 become electrically continuous with each other, and wiring layer 133 and filled conductor 34 become electrically continuous with each other. Conductive material in the conductive paste (filled conductor 21) become finer and its resistance decreases. Moreover, resin (20*b*) is squeezed from the surrounding insulation layers (insulation layer (10*a*), insulation layer (20*a*), insulation layer (30*a*)), and resin (20*b*) is filled in the clearances between insulation layer (20*a*) and flexible wiring board 130. Pressing and heating may be divided into multiple procedures. Also, heating and pressing may be conducted separately, but it is more efficient if they are conducted simultaneously.

In such a manufacturing method, since the core section (first substrate 10, second substrate 20, third substrate 30) and the lowermost insulation layers (insulation layers (40*a*, 50*a*)) at the built-up sections are pressed all at once, flex-rigid wiring board 100 may be manufactured with fewer pressing times.

The above embodiments and their modified examples or the like may be combined.

A flex-rigid wiring board according to one aspect of the present invention has the following: a flexible wiring board; a first insulation layer positioned to a side of the flexible wiring board; a second insulation layer laminated on the first-surface side of an end portion of the flexible wiring board and of the first insulation layer; a third insulation layer laminated on the second-surface side of the end portion of the flexible wiring board and of the first insulation layer; a first conductor formed by filling conductive paste in a first hole which penetrates through the first insulation layer; a second conductor formed by filling a conductor in a second hole which penetrates through the second insulation layer; and a third conductor formed by filling a conductor in a third hole which penetrates through the third insulation layer. In such a flex-rigid wiring board, the first conductor, the second conductor and the third conductor are positioned along the same axis and are electrically continuous with each other.

A method for manufacturing a flex-rigid wiring board according to another aspect of the present invention includes the following: preparing a flexible wiring board; preparing a first insulation layer having a first conductor formed by filling conductive paste in a penetrating hole; preparing a second insulation layer having a second conductor formed by filling plating in a penetrating hole; preparing a third insulation layer having a third conductor formed by filling plating in a penetrating hole; forming a laminated body by arranging the second insulation layer and the third insulation layer to sandwich the first insulation layer and an end portion of the flexible wiring board so that the first conductor, the second conductor and the third conductor are positioned along the same axis; and setting the first conductor, the second conductor and the third conductor to be electrically continuous with each other by pressing and heating the laminated body.

"Preparing" includes situations in which material and parts are purchased and manufactured accordingly, as well as situations in which finished products are purchased and used accordingly.

In addition, "pressing and heating" may be conducted simultaneously or separately.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
   a flexible wiring board;
   a first insulation layer positioned to a side of the flexible wiring board and having a first hole which penetrates through the first insulation layer;
   a second insulation layer laminated over the first insulation layer and an end portion of the flexible wiring board and having a second hole which penetrates through the second insulation layer, the second hole of the second insulation layer being formed along an axis of the first hole of the first insulation layer;
   a third insulation layer laminated over the first insulation layer and the end portion of the flexible wiring board on an opposite side of the second insulation layer and having a third hole which penetrates through the third insulation layer, the third hole of the third insulation layer being formed along the axis of the first hole of the first insulation layer;
   a first conductor structure comprising a filled conductor comprising a conductive paste filling the first hole of the first insulation layer;
   a second conductor structure comprising a filled conductor comprising a plated material filling the second hole of the second insulation layer, the second conductor structure being formed along an axis of the first conductor structure and electrically connected to the first conductor structure; and
   a third conductor structure comprising a filled conductor comprising a plated material filling the third hole of the third insulation layer, the third conductor structure being formed along the axis of the first conductor structure and electrically connected to the first conductor structure.

2. The flex-rigid wiring board according to claim 1, further comprising:
   a fourth insulation layer laminated on the second insulation layer and having a fourth hole which penetrates through the fourth insulation layer, the fourth hole of the fourth insulation layer being formed along the axis of the first hole of the first insulation layer; and
   a fourth conductor structure comprising a filled conductor comprising a conductor filling the fourth hole of the fourth insulation layer, the first conductor, the second conductor, the fourth conductor structure being formed along the axis of the first conductor structure and electrically connected to the second conductor structure.

3. The flex-rigid wiring board according to claim 1, further comprising:
   a fifth insulation layer laminated on the third insulation layer and having a fifth hole which penetrates through the fifth insulation layer, the fifth hole of the fifth insulation layer being formed along the axis of the first hole of the first insulation layer; and
   a fifth conductor comprising a filled conductor comprising a conductor filling the fifth hole of the fifth insulation layer, the fifth conductor structure being formed along the axis of the first conductor structure and electrically connected to the third conductor structure.

4. The flex-rigid wiring board according to claim 1, comprising:

a fourth insulation layer laminated on the second insulation layer and having a fourth hole which penetrates through the fourth insulation layer, the fourth hole of the fourth insulation layer being formed along the axis of the first hole of the first insulation layer;
a fifth insulation layer laminated on the third insulation layer and having a fifth hole which penetrates through the fifth insulation layer, the fifth hole of the fifth insulation layer being formed along the axis of the first hole of the first insulation layer;
a fourth conductor structure comprising a filled conductor comprising a conductor filling the fourth hole of the fourth insulation layer, the first conductor, the second conductor, the fourth conductor structure being formed along the axis of the first conductor structure and electrically connected to the second conductor structure; and
a fifth conductor comprising a filled conductor comprising a conductor filling the fifth hole of the fifth insulation layer, the fifth conductor structure being formed along the axis of the first conductor structure and electrically connected to the third conductor structure.

5. The flex-rigid wiring board according to claim 4, wherein at least one of the filled conductor of the fourth conductor structure and the filled conductor of the fifth conductor structure comprises a plated material.

6. The flex-rigid wiring board according to claim 1, further comprising an interlayer insulation layer laminated on at least one of the second insulation layer and the third insulation layer, and at least one of the first insulation layer, the second insulation layer and the third insulation layer has a thickness which is set greater than a thickness of the interlayer insulation layer.

7. The flex-rigid wiring board according to claim 6, wherein the first insulation layer has a wiring layer formed on the first insulation layer, the second insulation layer has a wiring layer formed on the second insulation layer, the third insulation layer has a wiring layer formed on the third insulation layer, the interlayer insulation layer has a wiring layer formed on the interlayer insulation layer, and at least one of the wiring layer on the first insulation layer, the wiring layer on the second insulation layer and the wiring layer on the third insulation layer has a thickness which is set greater than a thickness of the wiring layer on the interlayer insulation layer.

8. The flex-rigid wiring board according to claim 1, wherein the second conductor structure has a land portion connecting to the first conductor structure and having a width which is set greater than a width of a land portion of the second conductor structure on an opposite side of the second insulation layer, and the third conductor structure has a land portion connecting to the first conductor structure and having a width which is set greater than a width of a land portion of the third conductor structure on an opposite side of the third conductor structure.

9. The flex-rigid wiring board according to claim 1, wherein the first hole has an opening width which faces the second hole and which is set greater than an opening width of the second hole which faces the first hole, and the first hole has an opening width which faces the third hole and which is set greater than an opening width of the third hole which faces the first hole.

10. The flex-rigid wiring board according to claim 1, wherein at least one of the second conductor structure and the third conductor structure has a cavity formed in a center portion of an end surface connected to the first conductor structure, and the cavity is filled with the conductive paste forming the filled conductor of the first conductor structure.

11. The flex-rigid wiring board according to claim 1, further comprising an interlayer insulation layer having a fourth conductor structure and laminated on at least one of the second insulation layer and the third insulation layer, and the fourth conductor structure is positioned along the axis of the first conductor structure and is electrically connected to the first, second and third conductor structures.

12. The flex-rigid wiring board according to claim 1, wherein the flexible wiring board has a first conductive pattern and a second conductive pattern formed on an opposite side of the first conductive pattern, the second insulation layer has a first connection conductor structure connected to the first conductive pattern, and the third insulation layer has a second connection conductor structure connected to the second conductive pattern.

13. The flex-rigid wiring board according to claim 12, wherein the first connection conductor structure is electrically connected to the second conductor structure, and the second connection conductor structure is electrically connected to the third conductor structure.

14. The flex-rigid wiring board according to claim 12, wherein at least one of the first connection conductor structure and the second connection conductor structure comprises a conductive paste.

15. The flex-rigid wiring board according to claim 1, wherein the second insulation layer, the flexible wiring board and the third insulation layer have a through hole penetrating through the second insulation layer, the flexible wiring board and the third insulation layer, and at least one of a conductive pattern formed on the second insulation layer and a conductive pattern formed on the third insulation layer is connected to a conductive pattern in the flexible wiring board by a conductor formed inside the through hole.

16. The flex-rigid wiring board according to claim 1, wherein the first, second and third insulation layers form a rigid section of the flex-rigid wiring board, the flexible wiring board forms a flexible section of the flex-rigid wiring board, the rigid section of the flex-rigid wiring board has a protruding portion which protrudes from a boundary between the flexible section and the rigid section.

17. The flex-rigid wiring board according to claim 1, further comprising a second flexible wiring board, wherein the flexible wiring board is positioned apart from the second flexible wiring board.

18. The flex-rigid wiring board according to claim 17, wherein each of the flexible wiring board and the second flexible wiring board has a conductive pattern on one surface, and the conductive pattern of the flexible wiring board is formed on a surface of the flexible wiring board facing away from the second flexible wiring board, the conductive pattern of the second flexible wiring board is formed on a surface of the second flexible wiring board facing away from the flexible wiring board.

19. The flex-rigid wiring board according to claim 1, wherein the first, second and third insulation layers form a plurality of rigid sections such that a portion of each of the rigid sections includes portions of the first, second and third insulation layers and that the rigid sections have a different number of layers from each other.

20. The flex-rigid wiring board according to claim 1, wherein the first, second and third insulation layers form a rigid section of the flex-rigid wiring board, the flexible wiring board has only one end connected to the rigid section.

21. The flex-rigid wiring board according to claim 1, wherein the flexible wiring board comprises a flexible substrate, a first conductive pattern formed on the flexible substrate and a second conductive pattern formed on the flexible substrate on an opposite side of the first conductive pattern, the flexible substrate has a through hole formed in the flexible substrate, and the first conductive pattern and the second conductive pattern are connected by a conductor formed inside the through hole.

22. The flex-rigid wiring board according to claim 1, wherein the first, second and third insulation layers form a rigid section of the flex-rigid wiring board, the flexible wiring board forms a flexible section of the flex-rigid wiring board, and the flexible wiring board has a portion enlarged in a width across a boundary between the rigid section and the flexible section.

23. The flex-rigid wiring board according to claim 1, wherein the first, second and third insulation layers form a rigid section of the flex-rigid wiring board, the flexible wiring board has a portion connected to the rigid section of the flex-rigid wiring board and enlarged in a width.

24. The flex-rigid wiring board according to claim 1, wherein the first, second and third insulation layers form a rigid section of the flex-rigid wiring board, the flexible wiring board forms a flexible section of the flex-rigid wiring board, the flexible wiring board has a portion in the rigid section and a portion in the flexible section, and the portion of the flexible wiring board in the rigid section has width which is set greater than a width of the portion of the flexible wiring board in the flexible section.

25. The flex-rigid wiring board according to claim 1, wherein the first, second and third insulation layers form a rigid section of the flex-rigid wiring board, the flexible wiring board has a conductive pattern which fans out at a connection section between the rigid section and the flexible wiring board.

26. The flex-rigid wiring board according to claim 1, wherein the flex-rigid wiring board has a built-in electronic component.

27. The flex-rigid wiring board according to claim 1, wherein the flex-rigid wiring board has an electronic component mounted on a surface of the flex-rigid wiring board.

28. The flex-rigid wiring board according to claim 1, wherein the second conductor structure has a land portion connecting to the first conductor structure such that the land portion connecting to the first conductor structure is embedded in the first insulation layer, and the third conductor structure has a land portion connecting to the first conductor structure such that the land portion connecting to the first conductor structure is embedded in the first insulation layer.

29. The flex-rigid wiring board according to claim 1, wherein the second conductor structure has a land portion connecting to the first conductor structure and having a width which is set greater than a width of a land portion of the second conductor structure on an opposite side of the second insulation layer, the land portion of the second conductor structure connecting to the first conductor structure is embedded in the first insulation layer, the third conductor structure has a land portion connecting to the first conductor structure and having a width which is set greater than a width of a land portion of the third conductor structure on an opposite side of the third conductor structure, and the land portion of the third conductor structure connecting to the first conductor structure is embedded in the first insulation layer.

30. A method for manufacturing a flex-rigid wiring board, comprising:

preparing a flexible wiring board;

preparing a first insulation layer having a first hole and a first conductor structure comprising a filled conductor comprising a conductive paste filling the first hole;

preparing a second insulation layer having a second hole and a second conductor structure comprising a filled conductor comprising a plated material filling the second hole;

preparing a third insulation layer having a third hole and a third conductor structure comprising a filled conductor comprising a plated material filling the third hole;

forming a laminated body comprising the flexible wiring board, the first insulation layer, the second insulation layer and the third insulation layer such that the flexible wiring board and the first insulation layer are positioned side by side and the second insulation layer and the third insulation layer are sandwiching the first insulation layer and an end portion of the flexible wiring board and that the first conductor structure, the second conductor structure and the third conductor structure are positioned along an axis; and pressing and heating the laminated body such that the first conductor structure, the second conductor structure and the third conductor structure are set to be electrically continuous with each other.

31. The method for manufacturing a flex-rigid wiring board according to claim 30, wherein the first insulation layer prior to the heating is a prepreg.

32. The method for manufacturing a flex-rigid wiring board according to claim 30, further comprising:

positioning an interlayer insulation layer on a surface of the laminated body prior to the pressing and heating; and forming a conductive pattern on the interlayer insulation layer, wherein the first, second and third insulation layers and the interlayer insulation layer are pressed all at once in the pressing.

* * * * *